United States Patent
Han

(10) Patent No.: US 9,877,403 B2
(45) Date of Patent: Jan. 23, 2018

(54) DISPLAY DEVICE

(71) Applicant: LG ELECTRONICS INC., Seoul (KR)

(72) Inventor: Seokbong Han, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 15/271,990

(22) Filed: Sep. 21, 2016

(65) Prior Publication Data

US 2017/0105297 A1  Apr. 13, 2017

(30) Foreign Application Priority Data

Oct. 12, 2015 (KR) .................. 10-2015-0142073

(51) Int. Cl.
| | |
|---|---|
| H05K 5/02 | (2006.01) |
| G09F 9/33 | (2006.01) |
| H01L 51/52 | (2006.01) |
| H05K 5/00 | (2006.01) |
| H05K 5/03 | (2006.01) |
| G06F 1/16 | (2006.01) |
| H01F 7/02 | (2006.01) |
| F16B 13/08 | (2006.01) |
| F16M 13/02 | (2006.01) |
| G02F 1/1333 | (2006.01) |

(52) U.S. Cl.
CPC .............. *H05K 5/0204* (2013.01); *G06F 1/16* (2013.01); *G06F 1/1601* (2013.01); *G09F 9/33* (2013.01); *H01F 7/0252* (2013.01); *H01L 51/5246* (2013.01); *H05K 5/0017* (2013.01); *H05K 5/03* (2013.01); *F16B 13/08* (2013.01); *F16M 13/02* (2013.01); *G02F 2001/133314* (2013.01); *G02F 2201/46* (2013.01)

(58) Field of Classification Search
CPC ........................... H05K 5/0204; H05K 5/0208
See application file for complete search history.

(56) References Cited

U.S. PATENT DOCUMENTS

2008/0120922 A1  5/2008  Sullivan et al.

OTHER PUBLICATIONS

European Search Report dated Feb. 28, 2017 issued in Application No. 16002052.5.

*Primary Examiner* — Jeremy C Norris
(74) *Attorney, Agent, or Firm* — KED & Associates, LLP

(57) ABSTRACT

A display device includes a body including a display panel, a module cover positioned on a rear side of the display panel, and first and second coupling parts formed in a first position of the module cover and a second position spaced apart from the first position, and a target attachment surface placed in a first state in which the target attachment surface is coupled to the body and a second state in which the target attachment surface is separated from the body, and including third and fourth coupling parts positioned to face the first and second coupling parts in the first state, wherein the first coupling part and the third coupling part are coupled and the second coupling part and the fourth coupling part are coupled in the first state, and the body and the target attachment surface may be parallel to each other. Since the body is coupled to be parallel to the target attachment surface by a plurality of coupling parts, the body may be guided to an accurate position and a user may be able to be more focused on a display screen.

20 Claims, 46 Drawing Sheets

(a)

(b)

DISPLAY DEVICE

CROSS-REFERENCE TO RELATED APPLICATION

This application claims the benefit of Korean Patent Application No. 10-2015-0142073 filed on Oct. 12, 2015, the entire contents of which is hereby incorporated by reference in its entirety.

BACKGROUND

1. Field

The present invention relates to a display device and, more particularly, to a display device in which a body is coupled in parallel to a target attachment surface by a plurality of coupling portions so that the body is guided to an accurate position and a user may be more focused on a display screen.

2. Description of Related Art

As Information Society has advanced, demand for display devices has been diversely on the rise, and in line with this, recently, various display devices such as liquid crystal displays (LCDs), plasma display panels (PDPs), electroluminescent displays (ELDs), vacuum fluorescent displays (VFDs), and the like, have been researched and used.

Among these display devices, a display device using an organic light emitting diode (OLED) has excellent brightness and viewing angle properties and does not require a backlight unit, implementing an ultra-thin scheme, compared with LCDs.

SUMMARY

In an aspect, a display device may include: a body including a display panel, a module cover positioned on a rear side of the display panel, and first and second coupling parts formed in a first position of the module cover and a second position spaced apart from the first position; and a target attachment surface placed in a first state in which the target attachment surface is coupled to the body and a second state in which the target attachment surface is separated from the body, and including third and fourth coupling parts positioned to face the first and second coupling parts in the first state, wherein the first coupling part and the third coupling part are coupled and the second coupling part and the fourth coupling part are coupled in the first state, and the body and the target attachment surface may be parallel to each other.

In the first state, a width in which the first and third coupling parts are coupled may be equal to a width in which the second and fourth coupling parts are coupled.

At least one of the first to fourth coupling parts may be divided into a plurality of parts in a longer axis direction.

The first coupling part may include a first hook protruding backwardly from the body, the third coupling part may protrude forwardly from the target attachment surface and include a second hook engaged with the first hook in the first state, and the fourth coupling part may protrude forwardly from the target attachment surface and include a magnetic material.

The first hook may be integrally formed with the module cover.

The first and second hooks may include a magnetic material.

The first hook may include a first protrusion protruding backwardly from the body and a second protrusion connected to the first protrusion and protruding in a direction perpendicular to the first protrusion, the second hook may include a third protrusion protruding forwardly from the target attachment surface and a fourth protrusion connected to the third protrusion and protruding in a direction perpendicular to the third protrusion, and protruding directions of the second protrusion and the fourth protrusion may be the opposite directions.

The first and second coupling parts may include a first hook protruding backwardly from the body, and the third and fourth coupling parts may include a second hook protruding forwardly from the target attachment surface and engaged with the first hook in the first state.

The first and second coupling parts may include a first depression depressed to an inner side of the module cover, the third and fourth coupling parts may protrude backwardly from the target attachment surface and include a magnetic material, and the third and fourth coupling parts may be inserted into the first depression in the first state.

In the first and second coupling parts, a magnetic material may be inserted into the first depression depressed to the inner side of the module cover, and in the third and fourth coupling parts, a magnetic material may be inserted into a second depression depressed to an inner side of the target attachment surface.

In the first and second coupling parts, a magnetic material may be inserted into the first depression depressed to the inner side of the module cover, and the third and fourth coupling parts may protrude backwardly from the target attachment surface and include a magnetic material.

The first and second coupling parts may include a first hook protruding from the body toward the target attachment surface, the third and fourth coupling parts may include a second depression depressed to an interior of the target attachment surface, and the first hook may be inserted into the second depression in the first state.

The first hook may include a first protrusion protruding backwardly from the body and a second protrusion connected to the first protrusion and protruding in a direction perpendicular to the first protrusion, and a height of an entrance of the second depression may be greater than a height of the second protrusion.

The display head part may include a button on one side thereof, and when a first operation is applied to the button, the first state may be switched to the second state.

At least one of the first and second coupling parts may include an electromagnet, and when the first operation is applied to the button, a current flowing to at least one of the first and second coupling parts may be cut off.

In another aspect, a display device may include: a body including a display panel, a module cover positioned on a rear side of the display panel, and a front coupling part formed on a rear side of the module cover; and a target attachment surface placed in any one of a first state in which the target attachment surface is coupled to the body and a second state in which the target attachment surface is separated from the body, and including a rear coupling part being in contact with the rear side of the module cover in at least a portion thereof and positioned to face the front coupling part, wherein the body and the target attachment surface are parallel to each other in the first state.

The front coupling part may include first and second coupling parts formed in a first position of the module cover and a second position spaced apart from the first position, and the rear coupling part may include third and fourth coupling parts positioned to face the first and second coupling parts in the first state.

In the first state, a width in which the first and third coupling parts are coupled may be equal to a width in which the second and fourth coupling parts are coupled.

The first coupling part may include a first hook protruding backwardly from the body, the third coupling part may protrude forwardly from the target attachment surface and include a second hook engaged with the first hook in the first state, and the fourth coupling part may protrude forwardly from the target attachment surface and include a magnetic material.

At least one of the front coupling part and the rear coupling part may be divided into a plurality of parts in a longer axis direction.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
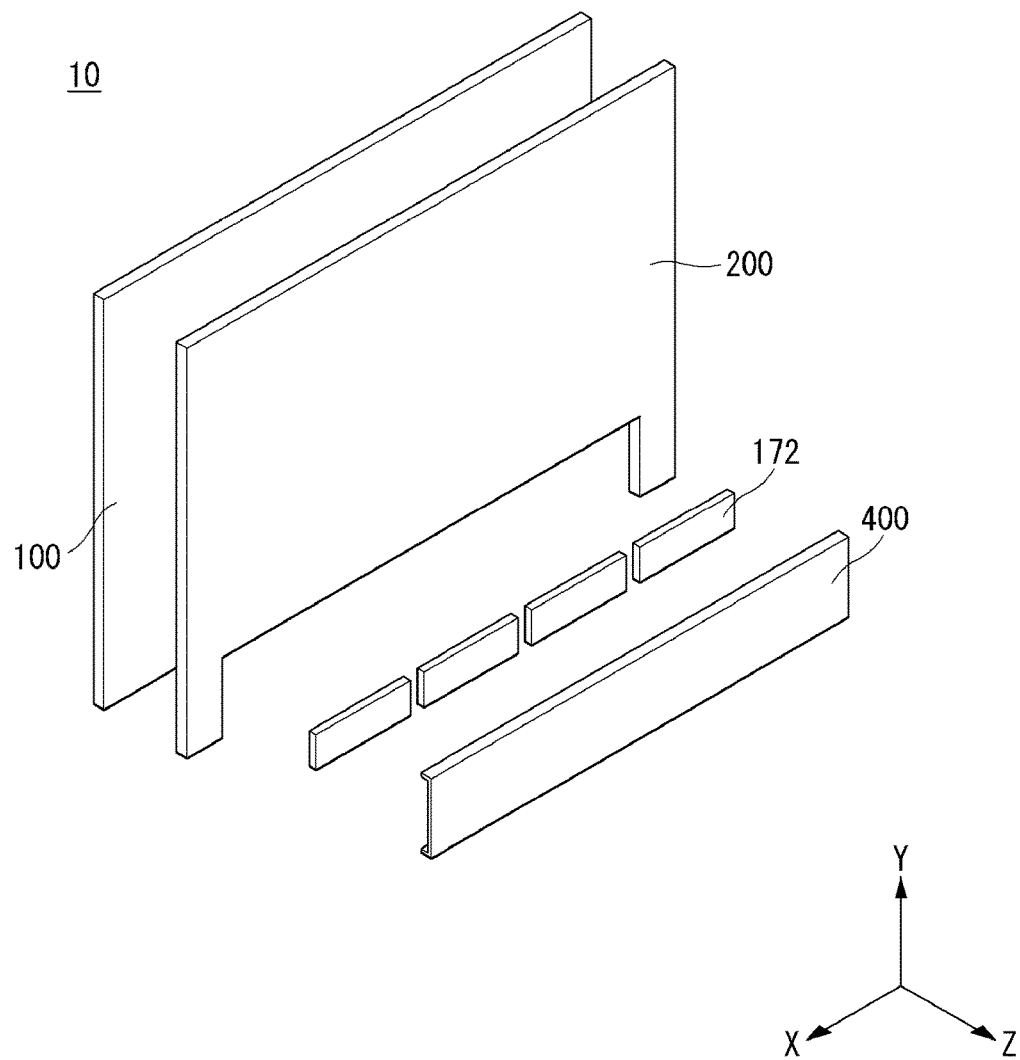
FIGS. 1 to 7 are views illustrating configurations of a display device related to the present disclosure.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to "or" being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Hereinafter, an organic light emitting display panel will be described as an example of a display panel but the present disclosure is not limited thereto and may also be applied to a liquid crystal panel, a plasma display panel, or a field emission display panel.

FIGS. 1 to 6 are views illustrating configurations of a display device related to the present disclosure.

Referring to FIG. 1, a body 10 of a display device according to an embodiment of the present disclosure may include a display panel 100, a module cover 200, and a PCB cover 400.

The display panel 100 may be provided on a front surface of the body 10 and display an image. The display panel 100 may output an image by dividing the image into a plurality of pixels and controlling each pixel to emit light according to color, brightness, and chroma.

The display panel 100 may have a rectangular shape. However, the present disclosure is not limited thereto and the display panel 100 may have a shape in which corners have a predetermined curvature. The display panel 100 may be an organic light emitting diode (OLED) panel. However, the present disclosure is not limited thereto and the display panel 100 may be a liquid crystal display panel.

The module cover 200 may be provided on a rear surface of the display panel 100. The module cover 200 may be directly attached to the display panel 100. The module cover 200 may support the rear surface of the display pale 100. That is, the module cover 200 may reinforce rigidity of the display panel 100. Thus, the module cover 200 may include a material which is lightweight and has high strength. For example, the module cover 200 may include aluminum.

A source PCB 172 may be attached to a lower region of the module cover 200. In order to secure a region in which the source PCB 172 is to be positioned, the module cover 200 may have a hole formed in a region where the source PCB 172 is to be positioned. Here, if the module cover 200 has an excessive amount of through holes or holes, the module cover 200 may be cracked or weaken in rigidity. Thus, preferably, the module cover 200 has a small amount of through holes or hole.

In the source PCB 172, signal lines for transmitting digital video data and timing control signals transferred from a timing controller board may be positioned. The source PCB 172 may be connected to the display panel 100 by a source chip-on-film (COF).

The source COF may be electrically connected to data pads of the display panel 100 and the source PCB 172. A data integrated circuit (IC) may be mounted on the source COF.

A PCB cover 400 may be provided on a rear surface of a region in which the source PCB 172 is positioned. The PCB cover 400 may prevent exposure of the source PCB 172. The PCB cover 400 may be opaque such that the source PCB 172 may not be exposed outwardly.

The PCB cover 400 may include an insulating material so that the source PCB 172 may not be interfered by any other electronic device. Thus, the PCB cover 400 may protect the source PCB 172 from a leakage current.

In the body 10 of the display device according to an embodiment of the present disclosure, the display panel 100 may be supported by only the module cover 200. That is, the body 10 may not have any other cover than the module cover 200. Thus, a user may feel that the body 10 is very thin and may be more focused on a display screen.

Figure 2:
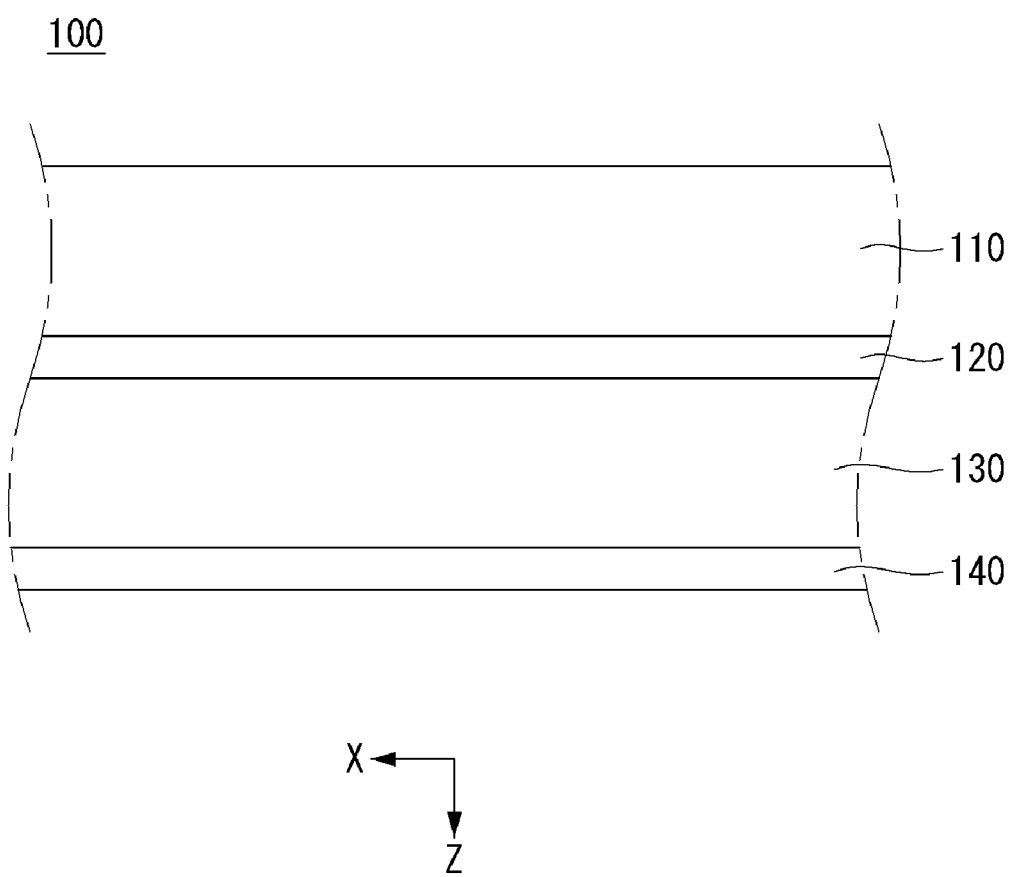

Referring to FIG. 2, the display panel 100 may include a transparent substrate 110, an upper electrode 120, an organic emission layer 130, and a lower electrode 140. The transparent substrate 110, the upper electrode 120, the organic emission layer 130, and the lower electrode 140 may be sequentially formed.

The transparent substrate 110 and the upper electrode 120 may include a transparent material. The lower electrode 140 may include an opaque material. However, the present disclosure is not limited thereto and the lower electrode 140 may include a transparent material (e.g., ITO, or the like). Here, light may be emitted to one side of the lower electrode 140.

When a voltage is applied to the upper and lower electrodes 120 and 140, light emitted from the organic emission layer 130 may be emitted outwardly through the upper electrode 120 and the transparent substrate 110. Here, in order to return light emitted to the lower electrode 140 to the front side, a light blocking plate may be provided behind the lower electrode 140.

The display device 100 according to an embodiment of the present disclosure may be an OLED display. Thus, the display device 100 does not require a separate light source so it may have a reduced volume and weight. Also, since a response speed of the organic light emitting display device is 1000 times faster than an LCD, when the OLED display displays an image, a residual image may not remain.

Figure 3:
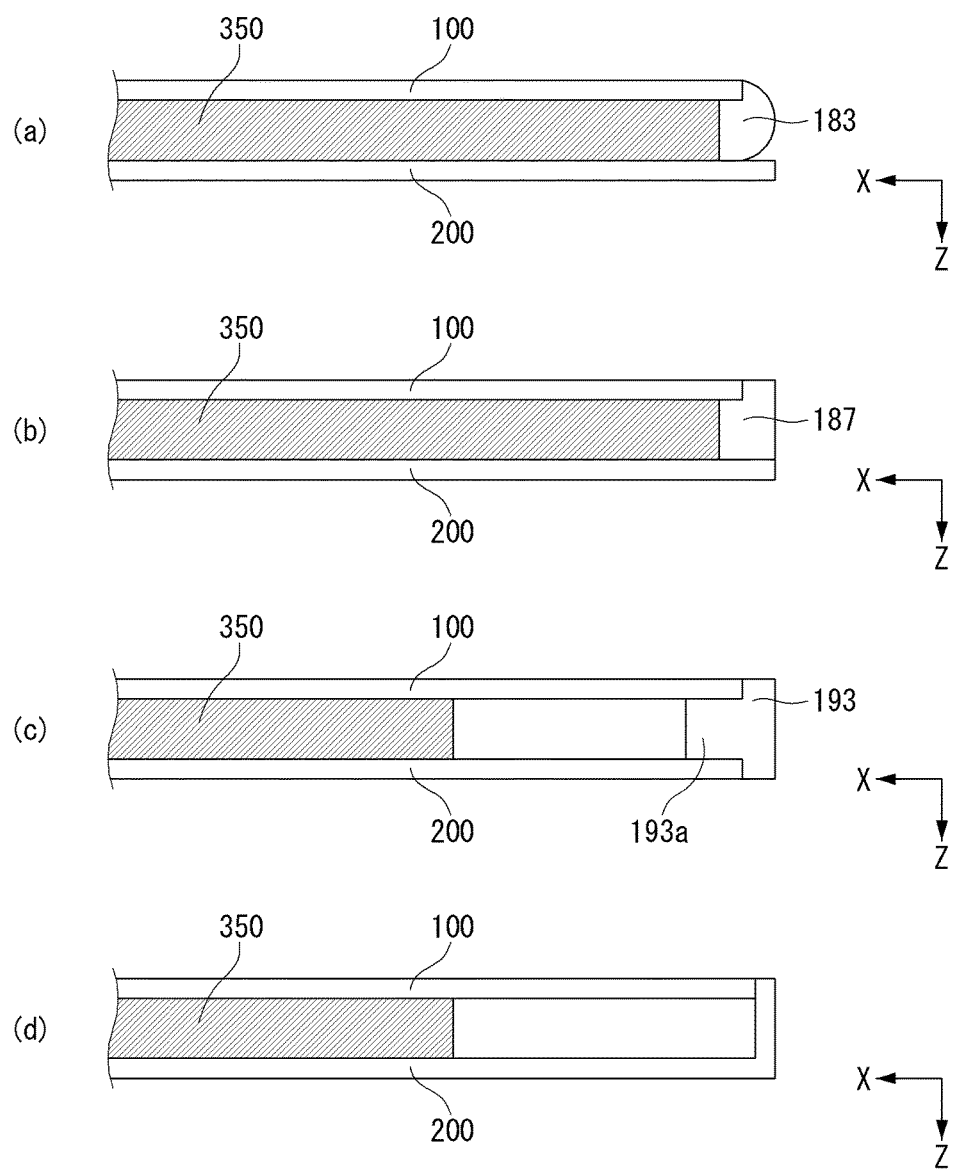

Referring to FIG. 3, in the display device according to an embodiment of the present disclosure, the display panel 100 and the module cover 200 may be attached through an adhesive layer 350. The adhesive layer 350 may include a double-sided tape whose both sides are available to be adhered.

The adhesive layer 350 may have a separate thickness. Thus, a foreign object or dust may be introduced between the display panel 100 and the module cover 200. In order to prevent this, as illustrated in (a) of FIG. 3, a sealing member 183 may be provided to at least one side of the adhesive layer 350, for side sealing. The sealing member 183 may shield at least one of each of the adhesive layer 350 and the display panel 100.

In another example, as illustrated in (b) of FIG. 3, a frame 187 may be inserted into at least one side of the adhesive layer 50. The frame 187 may be in contact with at least one side of the adhesive layer 350 and one end thereof may be bent to extend toward the display panel 100. Thus, the frame 187 may shield at least one side of the display panel 100.

In another example, as illustrated in (c) of FIG. 3, a middle cabinet 193 may be positioned between the display panel 100 and the module cover 200. The middle cabinet 193 may guide a position to which the display panel 100 is coupled. A flange 193a of the middle cabinet 193 may be inserted between the display panel 100 and the module cover 200. A body part of the middle cabinet 193 may shield at least one side of each of the display panel 100 and the module cover 200.

The flange 193a of the middle cabinet 193 may be space apart from the adhesive layer 350. Thus, since the adhesive layer 350 may not need to be positioned wholly in the display panel 100, an amount of the adhesive layer 350 may be reduced in manufacturing the display device.

In another example, as illustrated in (d) of FIG. 3, an edge portion of the module cover 200 may be bent toward the display panel 100. Since the edge portion of the module cover 200 is bent, at least one side of the adhesive layer 350 may be shielded over the exterior.

In this case, another material may not be included between the display panel 100 and the module cover 200. Thus, a manufacturing process of the display device may be simplified and cost may be saved. Also, the edge of the module cover 200 may be spaced apart from the adhesive layer 350. Thus, since the adhesive layer 350 does not need to be positioned wholly in the display panel 100, a required amount of the adhesive layer 350 may be reduced in manufacturing the display device.

In the embodiments described hereinafter, the adhesive layer 350 and structures positioned on the side will be omitted for the purposes of description. The adhesive layer 350 and structures positioned on the side may also be applied to other embodiments.

Figure 4:
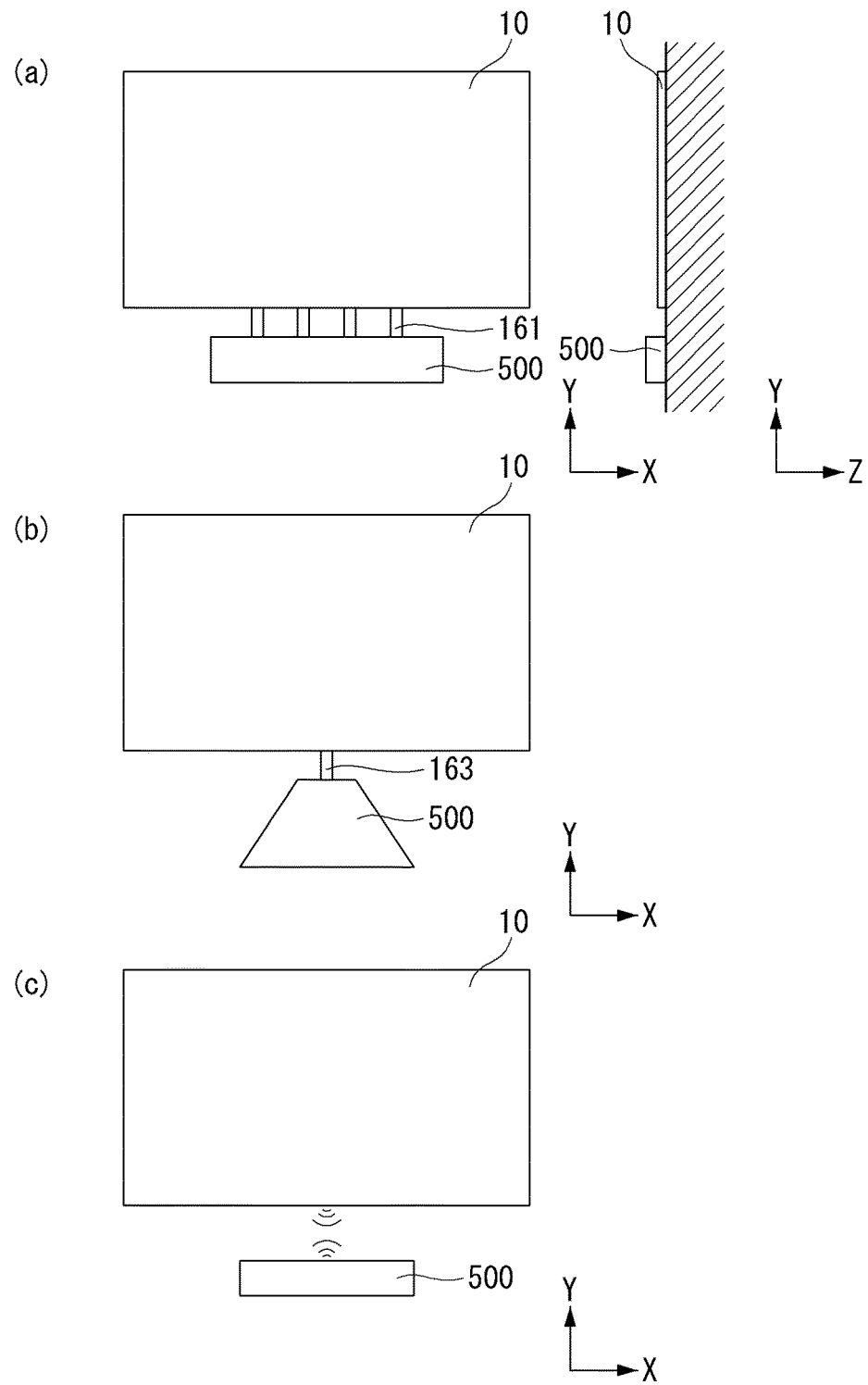

Referring to FIG. 4, the display device according to an embodiment of the present disclosure may include a housing 500 electrically connected to the body 10.

The housing 500 may shield components for driving the display device. For example, the housing 500 may shield at least one PCB. A detailed coupling structure and coupling method of at least one PCB will be described hereinafter.

The housing 500 may be spaced apart from the body 10, rather than being in contact therewith. That is, the housing 500 may not be positioned in an area where a display screen is displayed. Thus, the user may be more focused on a display screen.

For example, as illustrated in (a) of FIG. 4, the housing 500 may be connected to the body 10 through a flat flex cable (FFC) 161. The FFC 161 may include a plurality of signal connection terminal pins and at least one ground terminal pin in order to connect the housing 500 to the body 10. The FFC 161 is low in price, relative to other cables.

In another example, as illustrated in (b) of FIG. 4, the housing 500 may be coupled to the body 10 through a single circular cable 163. That is, electric signals which are connected to the several FFCs 161 in (b) of FIG. 3, may be connected through the single circular cable 163. Since the housing 500 and the body 10 are connected through the single circular cable 163, rather than a plurality of cables, the user may feel that an appearance of the display device is neat.

In another example, as illustrated in (c) of FIG. 4, the housing 500 and the body 10 may exchange electrical signals wirelessly. Here, the user may feel that the appearance of the display device is neater, relative to the case in which the housing 500 and the body 10 are connected through the FFC 161 or the circular cable 163.

In the display device according to an embodiment of the present disclosure, the body 10 and the housing 500 may be spaced apart from each other. Thus, the user may be more focused on the display screen and the display device may be implemented to have a thinner body 10.

Figure 5:
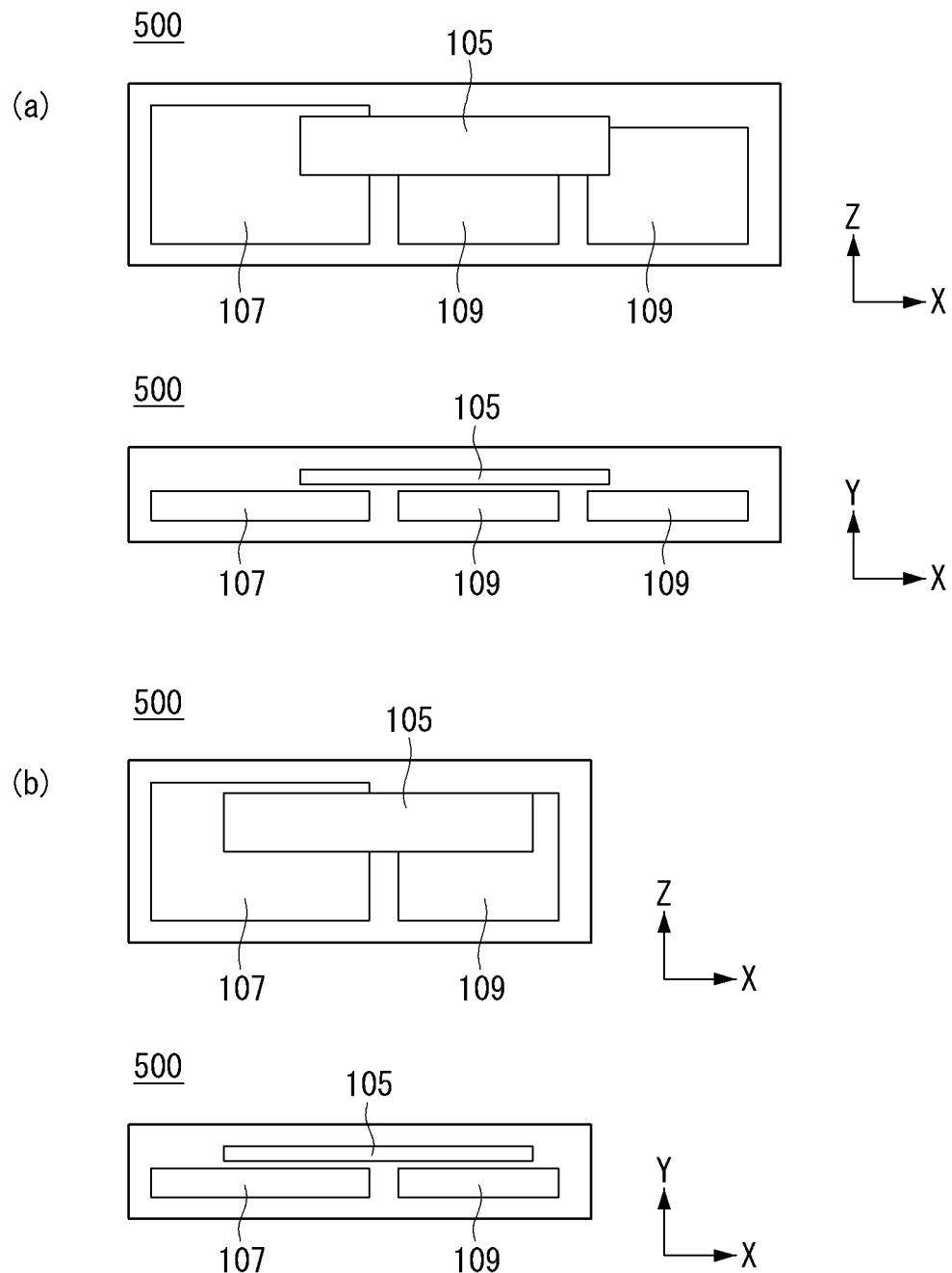

Referring to FIG. 5, at least one PCB may be positioned within the housing 500. The PCBs may be spaced apart from each other.

For example, the at least one PCB may be a main board 109. The main board 109 may provide an interface enabling the display device to operate. Also, the main board 109 may check and mange an operational state of components of the display device to maintain the components in an optimal state.

In another example, at least one PCB may be a power supply 107. The power supply 107 may supply power to the display device. The power supply 107 may change an AC frequency into a DC frequency. That is, the power supply 107 may change a low frequency into a high frequency to increase electrical efficiency.

In another example, the at least one PCB may be a timing controller board 105. The timing controller board 105 may transfer an input signal to the display panel 10. That is, the timing controller board 105 may transfer timing signals CLK, LOAD, and SPi for controlling a source PCB and video signals R, G, and B to the source PCB. Also, the timing controller board 105 may control an image. The timing controller board 105 may be connected to the source PCB through any one method among an FFC, a circular cable, and wireless transmission.

As illustrated in (a) of FIG. 5, the main boards 109 may be positioned at a central portion and a right portion of the housing 500 and spaced apart from each other, and the power supply 107 may be positioned to face the main board 109 in a longer axis direction, for example, of the housing 500 on the right side thereof with respect to a central portion of the housing 500.

The timing controller board 105 may be positioned on upper surfaces of the main boards 109 and the power supply 107. Since the timing controller board 105 is positioned on the upper surfaces of the main boards 109 and the power supply 107, an internal space of the housing 500 may be saved.

Although not shown, a TCON shield may be attached to a position in which the timing controller board 105 is to be mounted in order to block electromagnetic waves emitted from the power supply board 107 and the main boards 109. That is, the timing controller board 105 may be coupled to the TCON shield, rather than the power supply 107 and the main boards 109. Thus, the power supply 107 and the main boards 109 and the timing controller board 105 may not be interfered with each other. Also, the TCON shield may protect the timing controller board 105 from an impact.

The timing controller board 105 may overlap the power supply 107 and the main boards 109 in a height direction of the housing 500. Thus, the timing controller board 105 may be more easily coupled to the power supply 107 and the main boards 109.

Alternatively, as illustrated in (b) of FIG. 5, a single main board 109 may be mounted within the housing 500. That is, the main board 109 may be positioned on one side of the housing 500 and the power supply 107 may be positioned to face the main board 109 in a longer axis direction of the housing 500.

In the display device according to an embodiment of the present disclosure, since the timing controller board 105 is positioned above the power supply 107 and the main board 109, a space may be saved. Thus, the user may feel that an appearance is aesthetically enhanced as the overall size is reduced.

Figure 6:
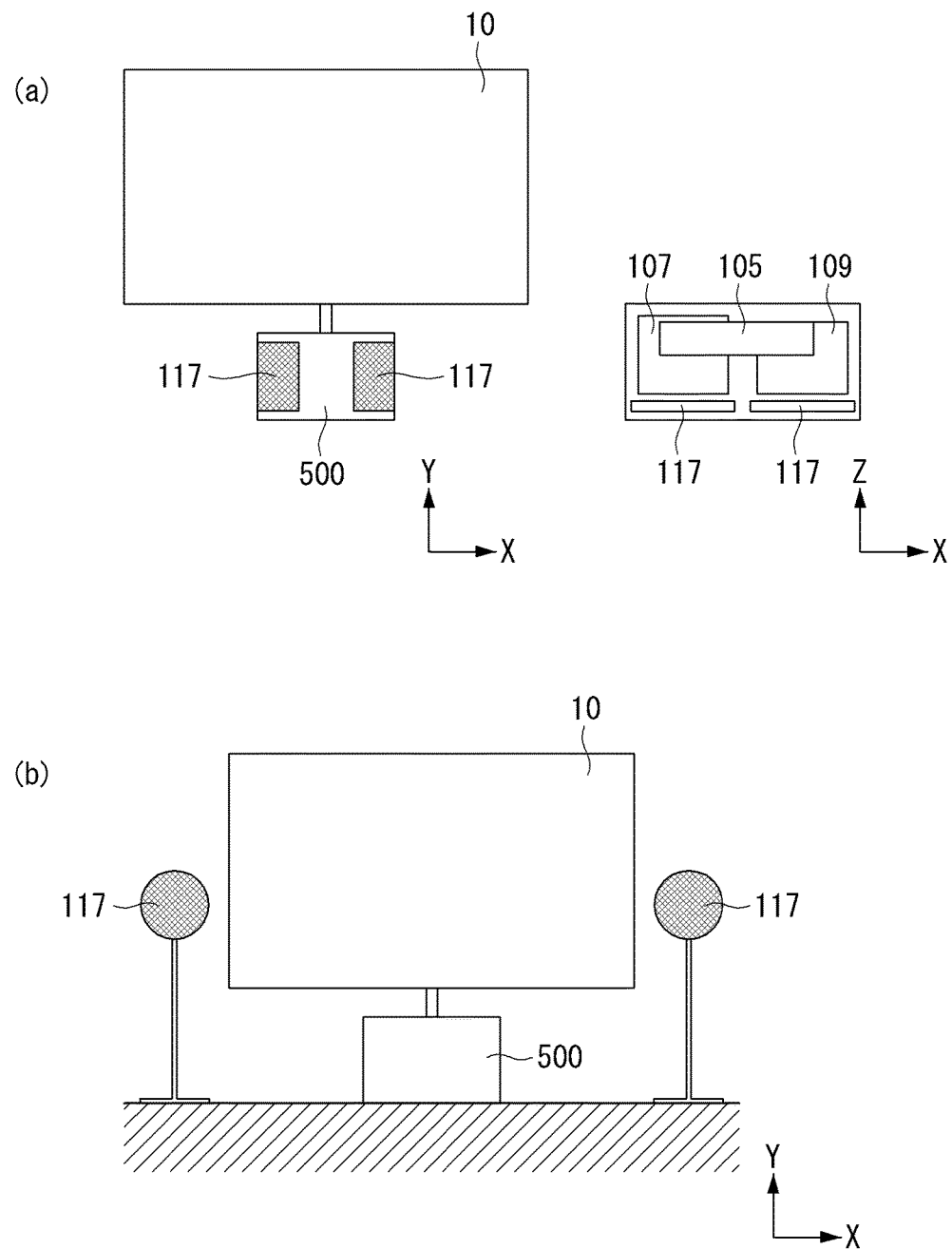

Referring to FIG. 6, in the display device according to an embodiment of the present disclosure, speakers 117 may be positioned on opposite ends of a front side of the housing 500. The speaker 117 may output and transfer a sound to the user. Thus, it may be more effective for the speaker 117 to be positioned on the front side of the housing 500.

As illustrated in (a) of FIG. 6, the speakers 117 may be mounted on the front side of the housing 500 such that the speakers 117 are spaced apart from at least one PCB mounted within the housing 500. Alternatively, as illustrated in (b) of FIG. 6, the speakers 117 may be positioned outside the housing 500 and spaced apart from each other. Since the speakers 117 are positioned outside the housing 500, the user may position the speakers 117 in positions in which a sound may be easily transferred. The speakers 117 may be positioned on opposite sides of the body 10 of the display device.

In the display device according to an embodiment of the present disclosure, the speakers 117 may be positioned on the front side of the housing 500 or on the opposite sides of the housing 500. Thus, the user may be more easily receive a sound of the display device.

Figure 7:
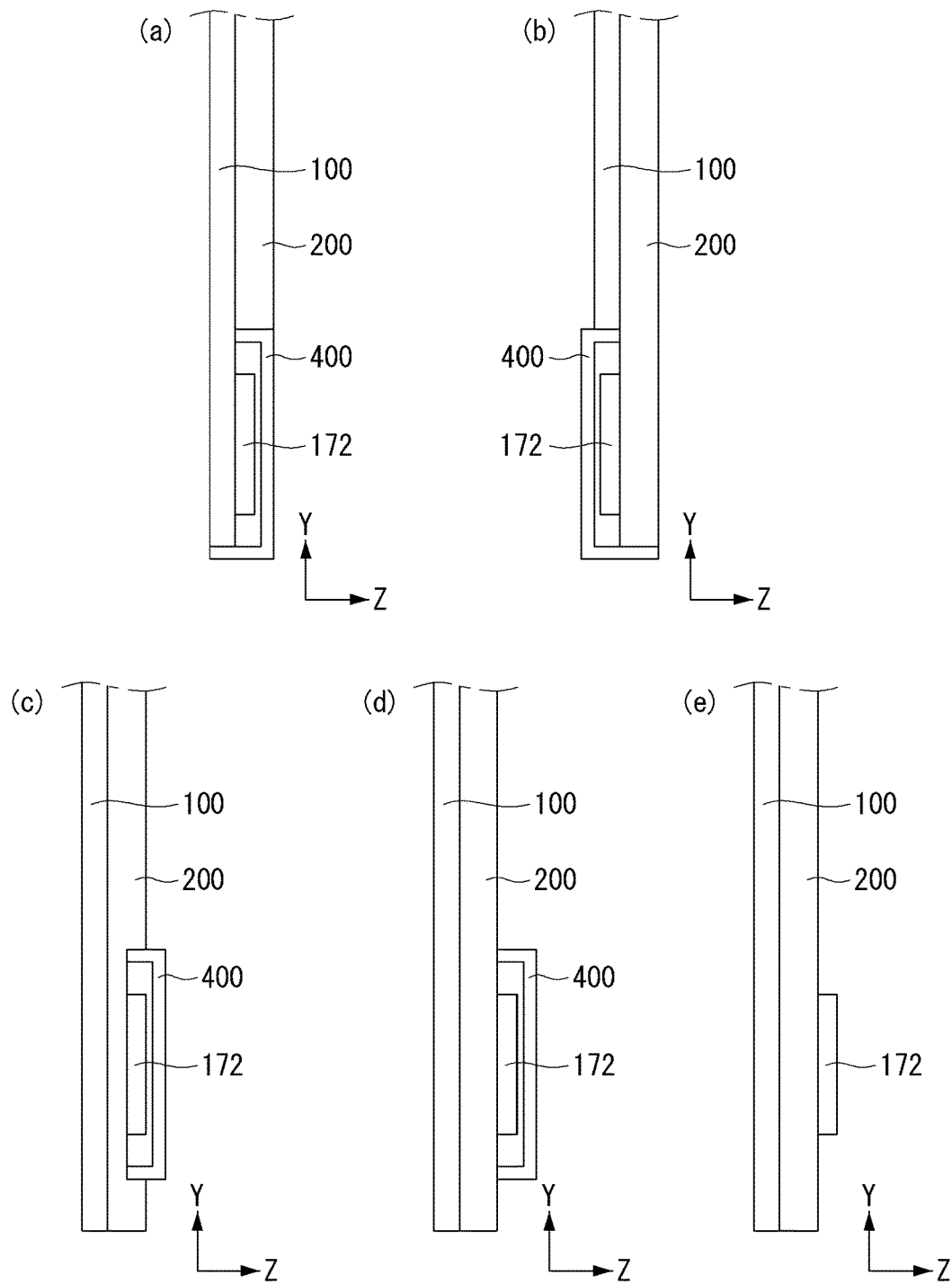

Referring to FIG. 7, in the display device according to an embodiment of the present disclosure, the source PCB 172 and the PCB cover 400 may be coupled to the display device in various manners. According to a position relation in which the source PCB 172 and the PCB cover 400 are coupled, a rear surface of the display device may be flattened or substantially flattened.

For example, as illustrated in (a) of FIG. 7, the source PCB 172 and the PCB cover 400 may be positioned on a rear surface of the display panel 100 where the module cover 200 is not positioned. In this case, a thickness of the body 10 where the source PCB 172 is positioned may be equal or similar to a thickness of the body 10 where the module cover 200 is positioned. Thus, a rear surface of the body 10 may be flattened or substantially flattened. Thus, the body may be tightly attached to a target attachment surface so as to be coupled.

In another example, as illustrated in (b) of FIG. 7, the source PCB 172 and the PCB cover 400 may be positioned on a front surface of the module cover 200 where the display panel 100 is not positioned. In this case, since the source PCB 172 and the PCB cover 400 are positioned on the front surface of the module cover 200, a rear surface of the body 10 may be flattened. Accordingly, the body 10 may be tightly attached to a target attachment surface so as to be coupled.

In another example, as illustrated in (c) of FIG. 7, the source PCB 172 and the PCB cover 400 may be positioned in a groove formed on a rear surface of the module cover 200. In this case, at least a portion of the PCB cover 400 may protrude in a direction of the rear surface of the module cover 200. Accordingly, a rear surface of the body 10 may not be completely flattened. However, since the source PCB 172 and the PCB cover 400 are positioned within the groove, the protruded portion is very small and the body 10 may be attached to a target attachment surface without any problem. Here, however, there may be a problem in tightly attaching the body 10 to the target attachment surface depending on a degree to which the source PCB 172 and the PCB 400 protrude.

In another example, as illustrated in (d) of FIG. 7, the source PCB 172 and the PCB cover 400 may be positioned on a rear surface of the module cover 200. In this case, the source PCB 172 and the PCB cover 400 may protrude from the rear surface of the module cover 200. Accordingly, there may be a problem in coupling the body 10 to the target attachment surface.

In another example, as illustrated in (e) of FIG. 7, the source PCB 172 may be positioned on the rear surface of the module cover 200. In this case, since the PCB cover 400 is not positioned and the source PCB 172 protrudes from the rear surface of the body 10, the body may not be directly coupled to a target attachment surface.

The bodies 10 illustrated in (a) and (b) of FIG. 7 may be directly attached to a target attachment surface without coupling of any other device and structure. However, the bodies 10 illustrated in (c), (d), and (e) may require coupling of any other device or structure. Coupling of any other device and structure will be described hereinafter.

The display device according to an embodiment of the present disclosure may have a flat rear surface or substantially flat rear surface by changing a structure of the module cover 200 and the display panel 100. Thus, a thin, flat display device may be implemented.

FIGS. 8 to 11 are views illustrating relationships between a body of a display device and a target attachment surface according to an embodiment of the present disclosure.

Figure 8:
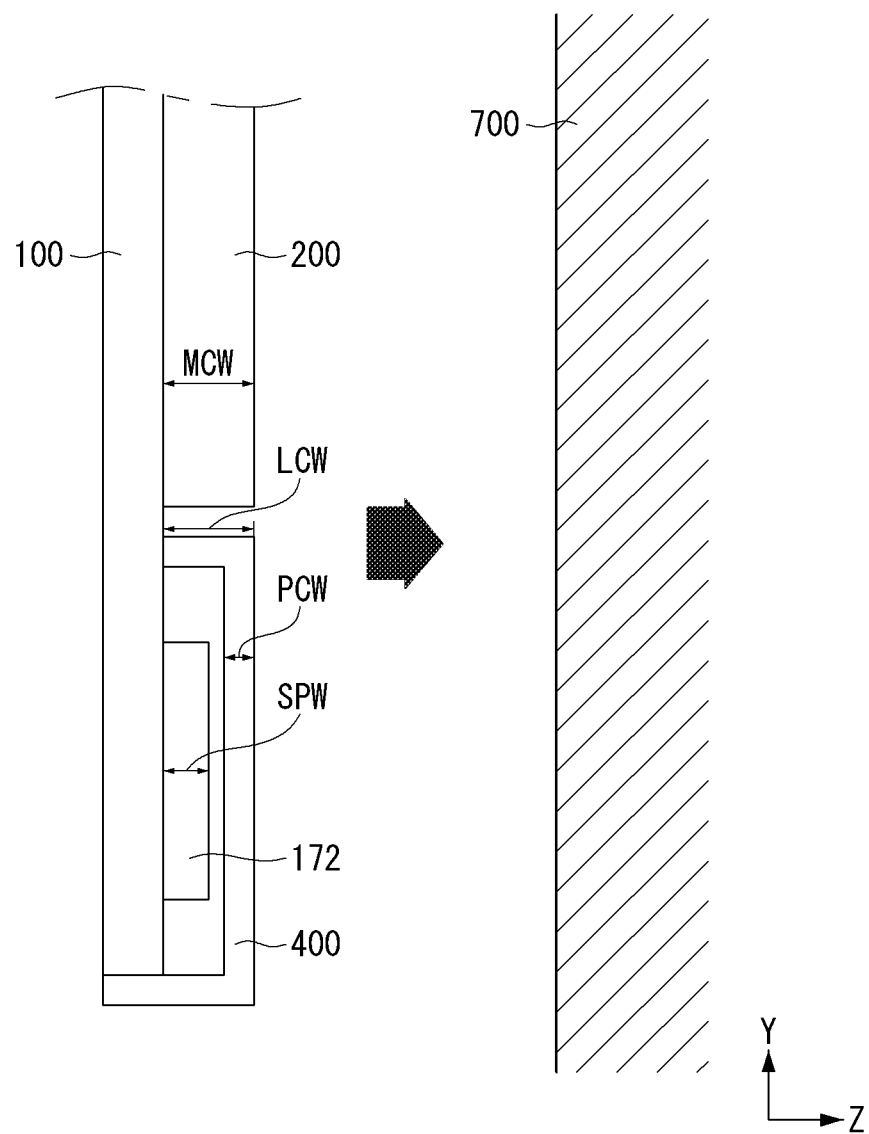
FIGS. 8 to 11 are views illustrating relationships between a body of a display device and a target attachment surface according to an embodiment of the present disclosure.
Figure 9:
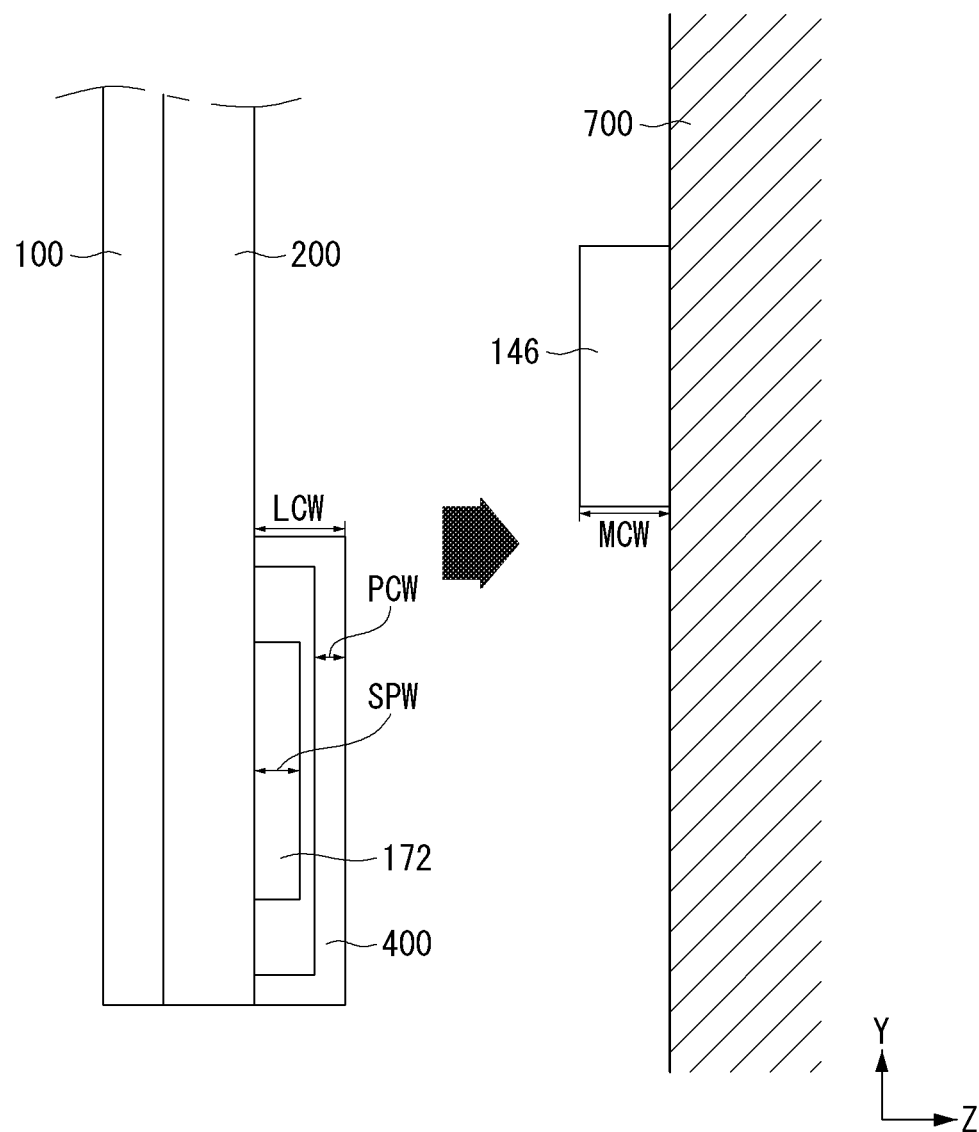

Referring to FIG. 8, in a display device according to an embodiment of the present disclosure, the body 10 may be coupled to or separated from a target attachment surface 700. That is, the display device may be in a first state in which the body 10 is coupled to the target attachment surface 700 and in a second state in which the body 10 is separated from the target attachment surface 700.

In the first state, the entire rear surface of the body 10 may have the same width. That is, in order to tightly attach and couple the rear surface of the body 10 to the target attachment surface 700, a width (LCW) of the PCB cover 400 in the thickness direction may be equal to or smaller than a width (MCW) of the module cover 200 in a thickness direction. Thus, the body 10 and the target attachment surface 700 may be tightly attached and coupled without being interfered by the PCB cover 400.

The width LCW of the PCB cover 400 in the thickness direction may be greater than a width SPW of the source PCB 172 in the thickness direction and a thickness PCW of the PCB cover 400 in the thickness direction. Thus, the source PCB 172 may be spaced apart from the PCB cover 400 within the PCB cover 400, having a space therebetween. Thus, the source PCB 172 may not be interfered by the PCB cover 400.

In the display device according to an embodiment of the present disclosure, since the rear surface of the body 10 does not protrude but is flat, it may be tightly attached and coupled to the target attachment surface 700. Thus, the user may be more focused on the display screen.

Figure 10:
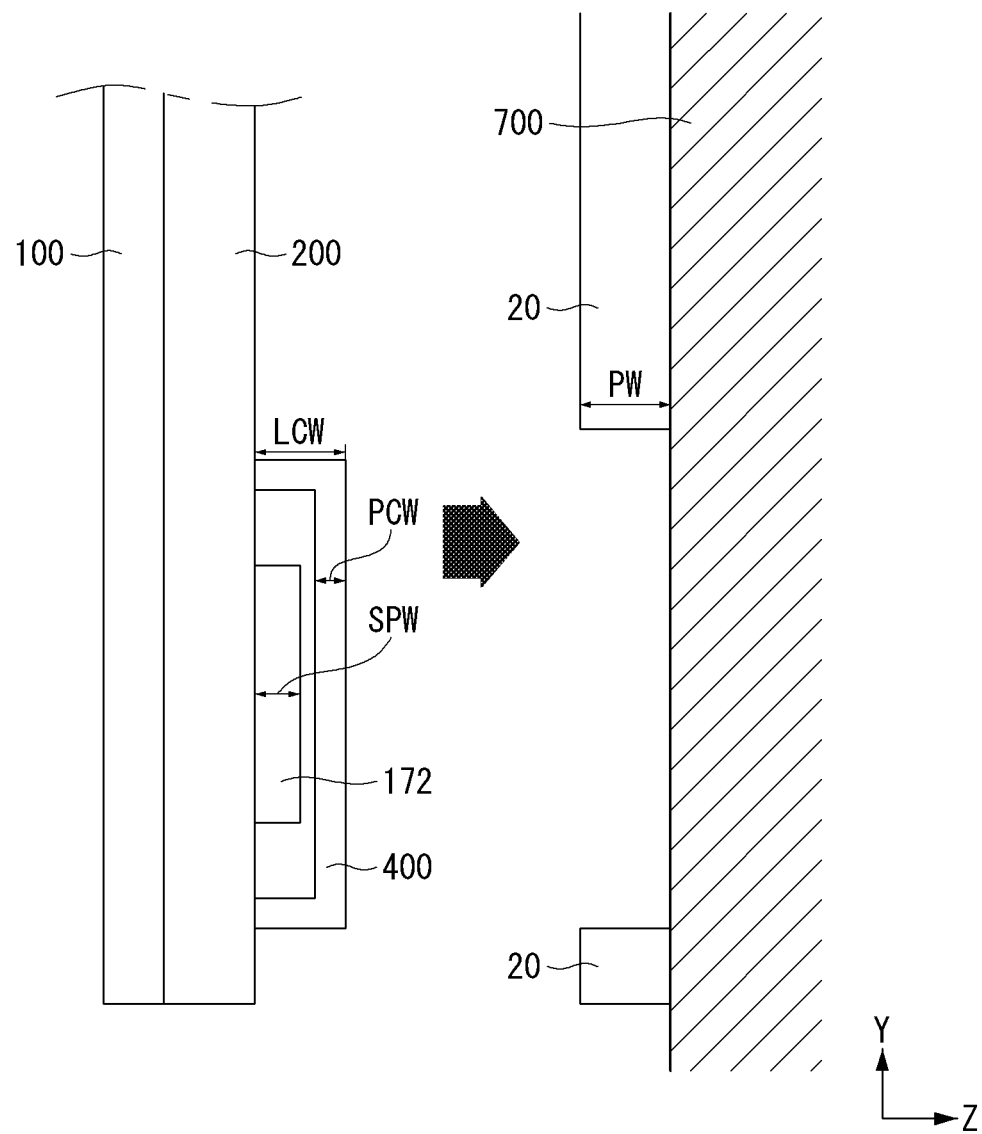

Referring to FIG. 10, in the display device according to an embodiment of the present disclosure, the PCB cover 400 of the body 10 may protrude backwards. In detail, a rear surface of the body 10 may protrude from the module cover 200 by a thickness PCW of the PCB cover 400. Thus, in order to tightly attach and couple the body 10 to the target attachment surface 700, another material or structure may be required.

The target attachment surface 700 may include a fourth coupling part 146. The fourth coupling part 146 may protrude from a front surface of the target attachment surface 700. A thickness MGW of the fourth coupling part 146 toward a front side of the target attachment surface 700 may be equal to or greater than the thickness PCW of the PCB cover 400. Thus, the body 10 may be coupled through the fourth coupling part 146, rather than being directly attached to the target attachment surface 700. The PCB cover 400 may not be in contact with the target attachment surface 700 and the module cover 200 may be in contact with the fourth coupling part 146 included in the target attachment surface 700. That is, the body 10 may be coupled to the target attachment surface 700 in parallel. Details of the coupling part will be described hereinafter.

In the display device according to an embodiment of the present disclosure, the thickness MGW of the fourth coupling part 146 may be equal to or greater than the thickness LCW of the PCB cover 400. Thus, the PCB cover 400 may not be in contact with the target attachment surface 700, and thus, the body 10 and the target attachment surface 700 may be coupled to each other in parallel.

Referring to FIG. 10, in the display device according to an embodiment of the present disclosure, the target attachment surface 700 may include a bracket 20. The bracket 20 may be positioned on a front surface of the target attachment surface 700. The bracket 20 may be positioned in a portion not corresponding to the PCB cover 400 in a first state. That is, the PCB cover 400 may not be in contact with the bracket 20 in the first state. A thickness PW of the bracket 20 may be equal to or greater than the thickness LCW of the PCB cover 400. In this case, since the PCB cover 400 may not be in contact with the target attachment surface 700, the body 10 and the target attachment surface 700 may be coupled to each other in parallel.

In the display device according to an embodiment of the present disclosure, the thickness PW of the bracket 20 may be equal to or greater than the thickness LCW of the PCB cover 400. Thus, the PCB cover 400 is not in contact with the target attachment surface 700, and thus, the body 10 and the target attachment surface 700 may be coupled to each other in parallel.

Figure 11:
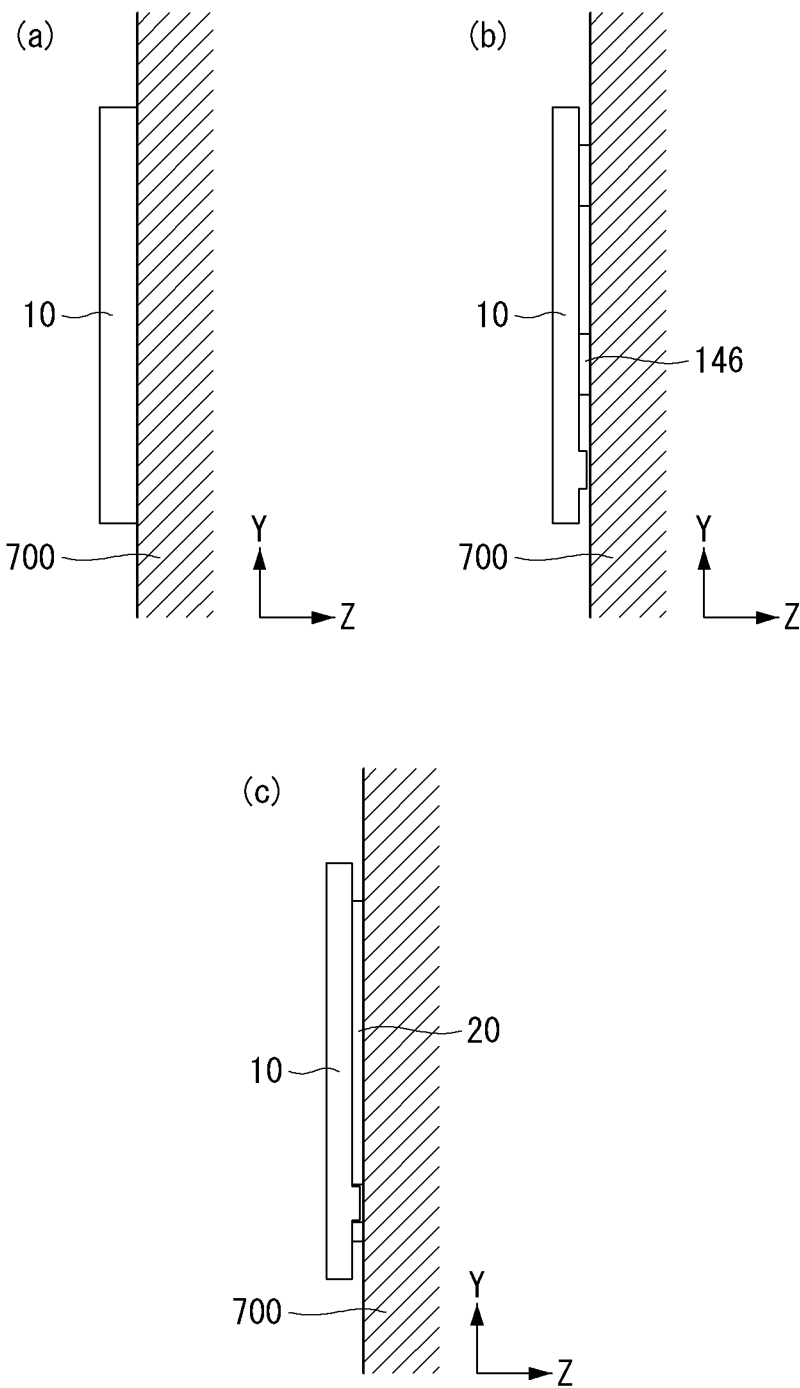

Referring to FIG. 11, in the display device according to an embodiment of the present disclosure, as well as the case in which the rear surface of the body 10 is flat as illustrated in (a) of FIG. 10, even though at least a portion of the rear surface of the body 10 protrudes, the body 10 may be coupled to the target attachment surface 700 in parallel by other structure. Thus, the user may be more focused on a display screen. Also, the body 10 is tightly attached and coupled to the target attachment surface 700, compared with a case in which the body 10 and the target attachment surface 700 are slantingly coupled, and thus, a coupling force may be stronger.

In the embodiments described hereinafter, for the purposes of description, it is illustrated that the rear surface of the body 10 is flat, but even when the rear surface of the body 10 protrudes, obviously, the present disclosure may also be applied using the other structure described above.

FIGS. 12 to 35 are views illustrating various examples of a display device according to an embodiment of the present disclosure.

Figure 12:
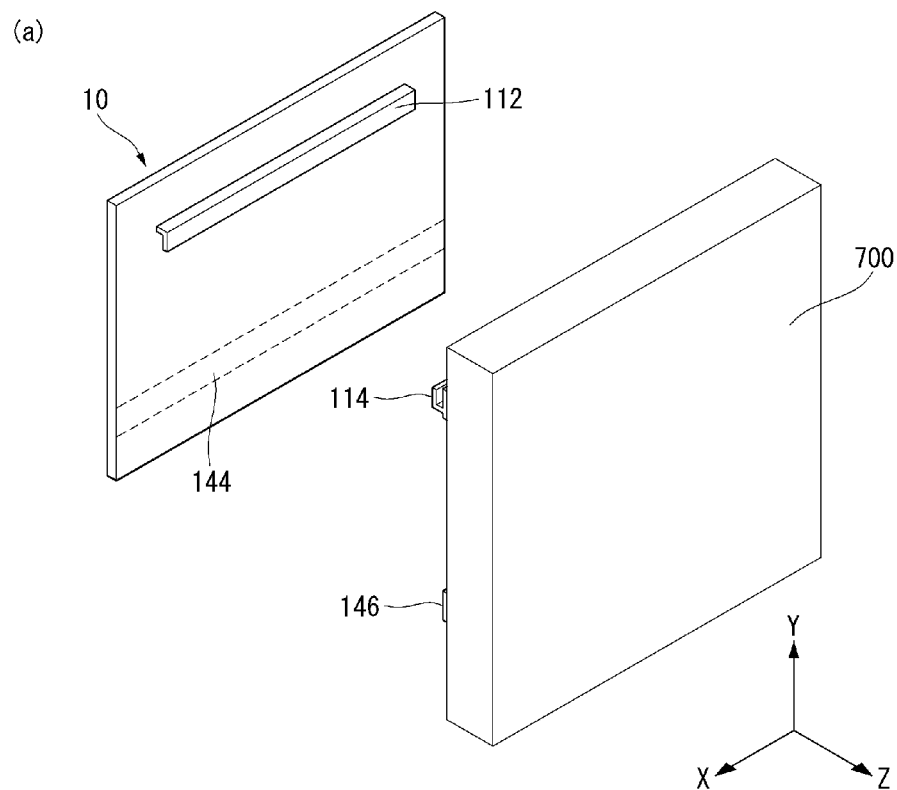
FIGS. 12 to 35 are views illustrating various examples of a display device according to an embodiment of the present disclosure.
Figure 12:
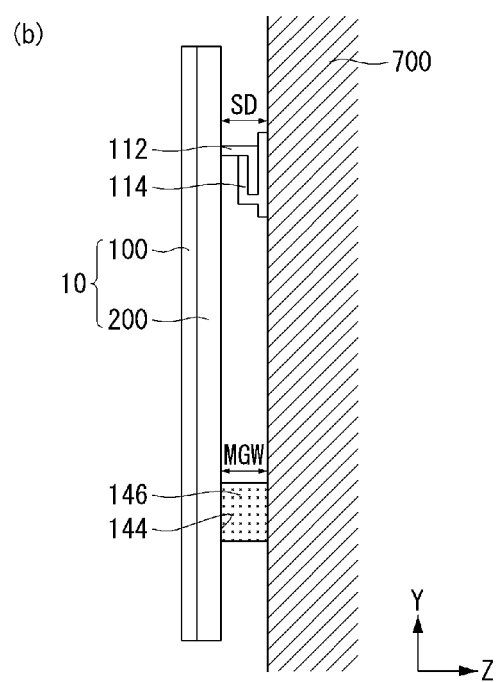

Referring to FIG. 12, in the display device according to an embodiment of the present disclosure, the body 10 may include first and second coupling parts 112 and 144 and the target attachment surface 700 may include third and fourth coupling parts 144 and 146. The first coupling part 112 and the third coupling part 114 may be coupled to each other in the first state, and the second coupling part 144 and the fourth coupling part 144 may be coupled to each other in the first state.

The first and third coupling parts 112 and 114 may be positioned to be spaced apart from the second and fourth coupling parts 114 and 146. For example, the first and third coupling parts 112 and 114 may be positioned in upper portions of the rear surface of the body 10, and the second and fourth coupling parts 144 and 146 may be positioned on lower portions of the rear surface of the body 10.

Features of the first to fourth coupling parts 112, 114, 144, and 146 may be applied to other embodiments described hereinafter.

The first coupling part 112 may include a first hook, and the second coupling part 114 may include a second hook. The first hook may protrude backwardly from the body 10, and the second hook may protrude forwardly from the target attachment surface 700. The first hook and the second hook may be engaged with each other in the first state.

The first hook may include a first protrusion protruding backwardly from the body 10 and a second protrusion connected to the first protrusion and protruding in a direction perpendicular to the first protrusion. The second hook may include a third protrusion protruding forwardly from the target attachment surface 700 and a fourth protrusion connected to the third protrusion and protruding in a direction perpendicular to the third protrusion. The second protrusion and the fourth protrusion may protrude in mutually opposite directions.

The third coupling part 144 may be flat, rather than protruding from the body 10. The third coupling part 144 may include the same material as that of the module cover. The fourth coupling part 146 may protrude forwardly from the target attachment surface 700. The fourth coupling part 146 may include a magnetic material. Since the third coupling part 144 includes a metal, it may be coupled to the fourth coupling part 146 in the first stage.

A width SD in which the first coupling part 112 and the third coupling part 114 are coupled in the first state may be equal to a width in which the second coupling part 144 and the fourth coupling part 146 are coupled in the first state. In this case, the width in which the second coupling part 144 and the fourth coupling part 146 are coupled may be equal to a width MGW of the fourth coupling part 146. Since the widths in which the coupling parts are coupled are equal, the body 10 and the target attachment surface 700 may be coupled to each other in parallel.

In the display device according to an embodiment of the present disclosure, the first and second coupling parts 112 and 114 may be coupled by a hook, and the third and fourth coupling parts 144 and 146 may be coupled by a magnetic force. In this case, the body 10 and the target attachment surface 700 may not be easily separated, compared with a case in which the body 10 and the target attachment surface 700 are coupled only by a magnetic force. Also, since a position of the body 10 is guided by the first and second hooks, the body 10 may be accurately coupled to a desired position of the target attachment surface 700.

Figure 13:
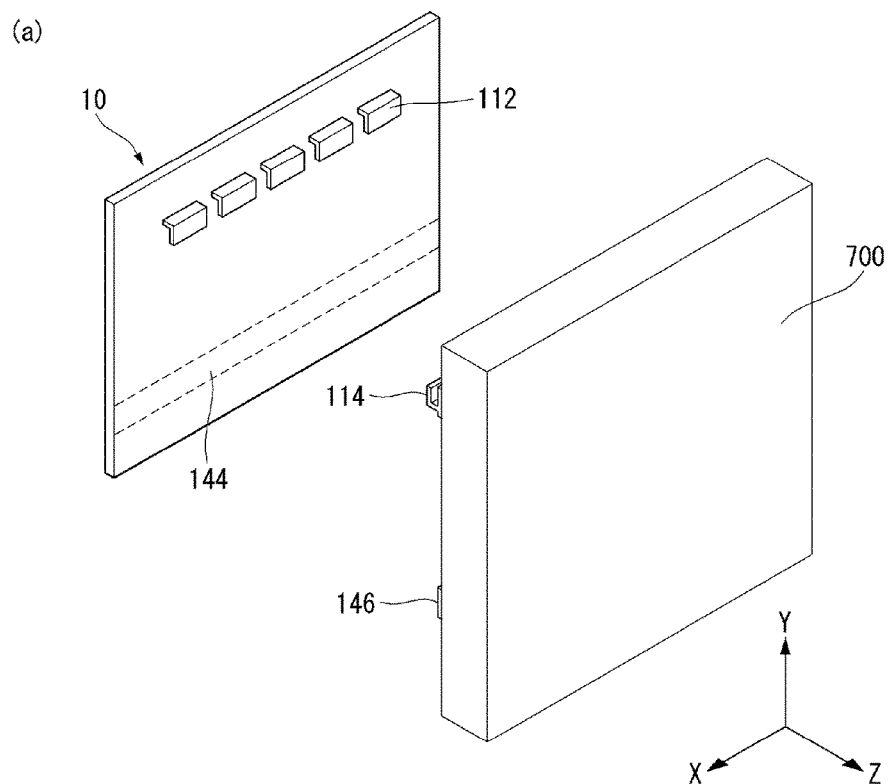
Figure 13:
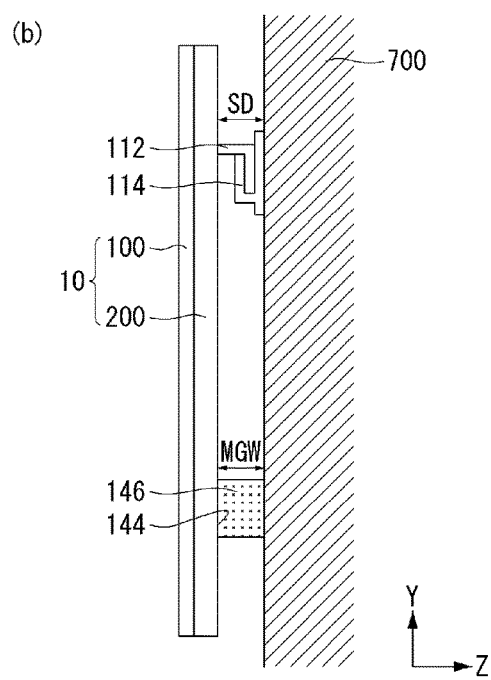

Referring to FIG. 13, in the display device according to an embodiment of the present disclosure, the first and second coupling parts 112 and 114 may be divided in a longer axis direction of the body 10. That is, the first and second coupling parts 112 and 114 may include a plurality of hooks.

In the display device according to an embodiment of the present disclosure, the body 10 may be guided to a more accurate position of the target attachment surface 700, compared with a case in which the first and second coupling parts 112 and 114 are integrally configured.

Figure 14:
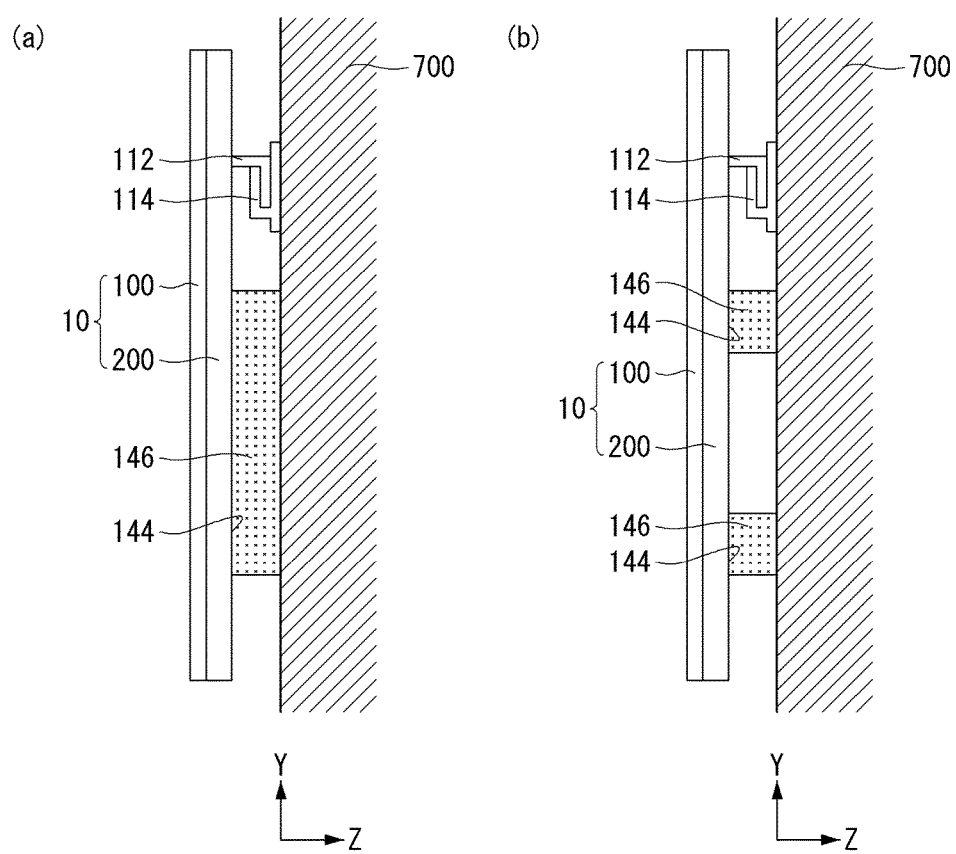

Referring to FIG. 14, in the display device according to an embodiment of the present disclosure, the third and fourth coupling parts 144 and 146 may have various shapes.

For example, as illustrated in (a) of FIG. 14, the third and fourth coupling parts 144 and 146 may be positioned in a most region, excluding the first and second coupling parts 112 and 114. In detail, the fourth coupling part 146 may couple the entirety of the body 10 from immediately below a region where the first and second coupling parts 112 and 114 are positioned. In this case, since an area of the fourth magnetic coupling part 146 is larger, a coupling force may be stronger, compared with a case in which the area is smaller. Thus, the body 10 may not be easily separated from the target attachment surface 700.

In another example, as illustrated in (b) of FIG. 14, the third and fourth coupling parts 144 and 146 may be divided into a plurality of coupling parts in a shorter axis direction of the body 10. In detail, one fourth coupling part 146 may be positioned in a lower portion of a rear surface of the body 10 and the other may be positioned in a central portion of the rear surface of the body 10. In this case, the fourth magnetic coupling parts 146 may couple the body 10 and the target attachment surface 700 in several portions. Thus, the body 10 may not be easily separated from the target attachment surface 700, compared with a case in which the body 10 is coupled to the target attachment surface 700 by a single fourth coupling part 146.

In the display device according to an embodiment of the present disclosure, since the third and fourth coupling parts 144 and 146 have various shapes, the body 10 and the target attachment surface 700 may be more strongly coupled.

Figure 15:
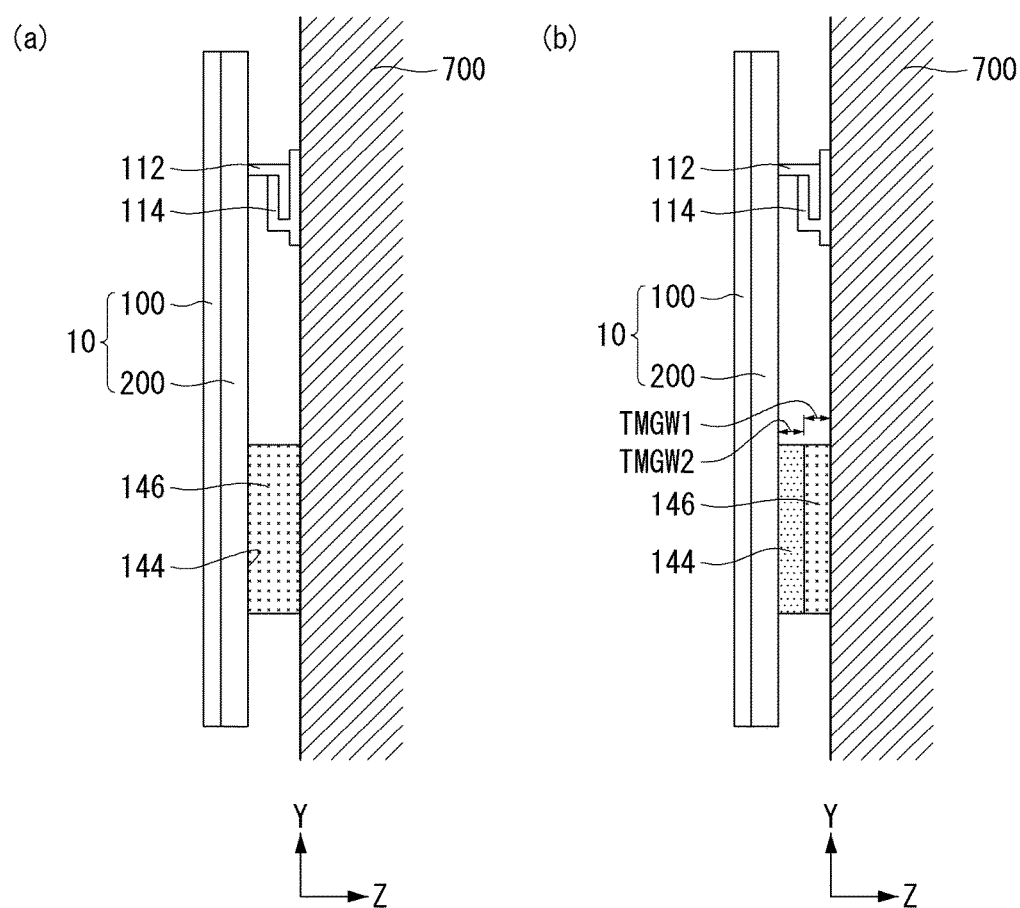

Referring to FIG. 15, in the display device according to an embodiment of the present disclosure, the third and fourth coupling parts 144 and 146 may have various shapes.

As illustrated in (a) of FIG. 15, the third coupling part 144 may not protrude backwardly from the body 10. In this case, a width (MGW) of the protruding fourth coupling part 146 may be a width in which the third coupling part 144 and the fourth coupling part 146 are coupled.

Alternatively, as illustrated in (b) of FIG. 15, the third coupling part 144 may protrude backwardly from the body 10. The third coupling part 144 may include a magnetic material and may have a polarity opposite to that of a material of the fourth coupling part 146. However, the present disclosure is not limited thereto and the third coupling part 144 may be formed of the same metal as that of the module cover. In this case, the sum of a width TMGW2 of the protruding third coupling part 144 and a width TMGW1 of the protruding fourth coupling part 146 may be a width in which the third coupling part 144 and the fourth coupling part 146 are coupled.

In a case in which the third coupling part 144 includes a material assuming a polarity opposite to that of the fourth coupling part 146, a coupling force between the body 10 and the target attachment surface 700 may be enhanced, compared with a case of a metal. Thus, the body 10 and the target attachment surface 700 may not be easily separated.

Figure 16:
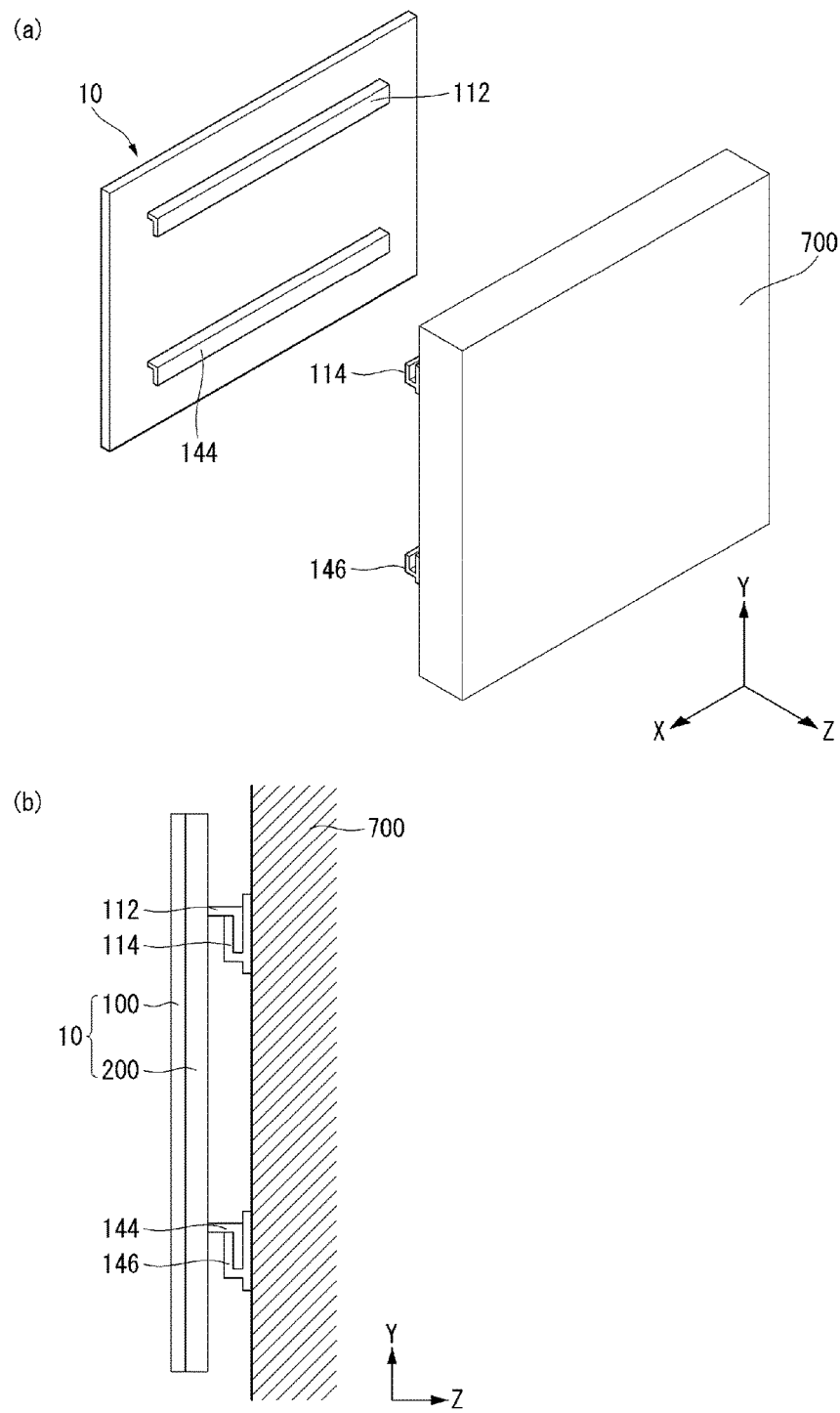

Referring to FIG. 16, in the display device according to an embodiment of the present disclosure, all the first to fourth coupling parts 112, 114, 144, and 146 may include a hook.

For example, the first and third coupling parts 112 and 144 may include a first hook, and the second and fourth coupling parts 114 and 146 may include a second hook. Thus, all the first to fourth coupling parts 112, 114, 144, and 146 may be engaged by hooks.

In this case, coupling positions of upper and lower portions of the rear surface of the body 10 may be guided by the first and second hooks. Thus, the user may couple the body 190 to a desired position and may more easily separate or couple the body 10 and the target attachment surface 700.

Figure 17:
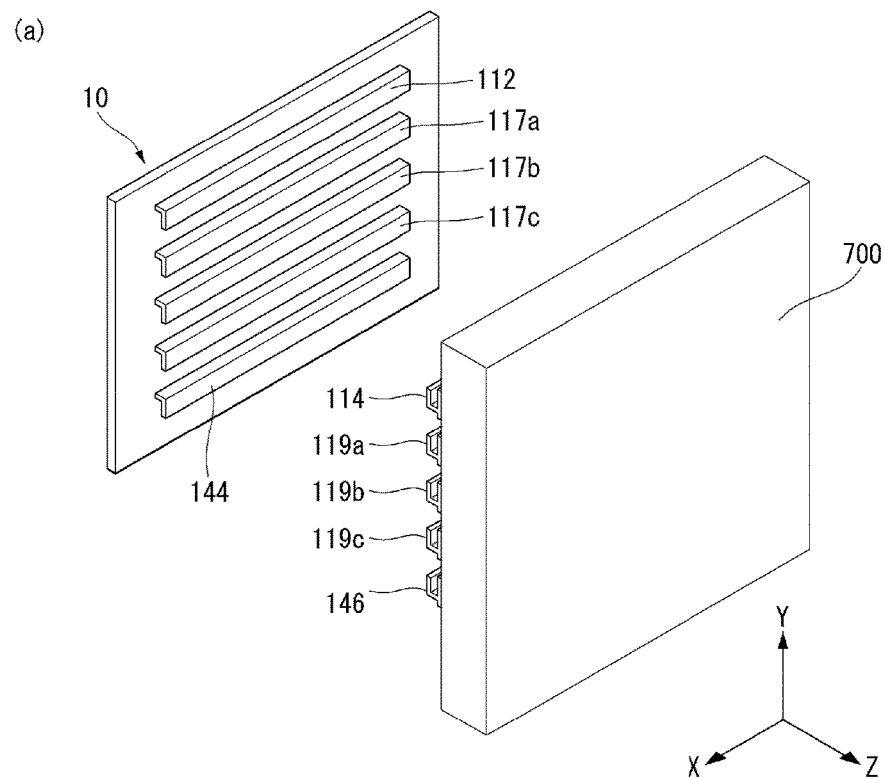
Figure 17:
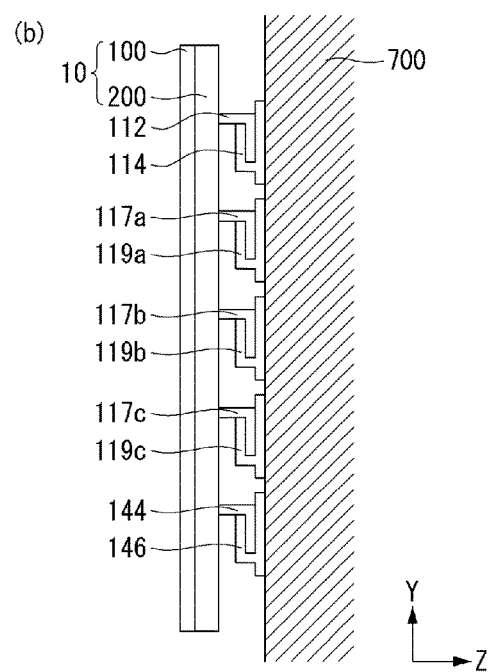

Referring to FIG. 17, the display device according to an embodiment of the present disclosure may include first and second intermediate coupling parts 117*a* to 117*c* and 119*a* to 119*c*, as well as the first to fourth coupling parts 112, 114, 144, and 146.

The first and second intermediate coupling parts 117*a* to 117*c* and 119*a* to 119*c* may be positioned between the first and second coupling parts 112 and 114 and the third and fourth coupling parts 144 and 146. The first intermediate coupling parts 117*a* to 117*c* may be sequentially positioned downwardly from the first coupling part 112 at a predetermined interval. Also, the second intermediate coupling parts 119*a* to 119*c* may be sequentially positioned downwardly from the second coupling part 114 at a predetermined interval. The first and second intermediate coupling parts 112 and 114 may couple the body 10 and the target attachment surface 700 together with the first to fourth coupling parts 112, 114, 144, and 146 in the first state.

In the display device according to an embodiment of the present disclosure, the body 10 and the target attachment surface 700 may be coupled by a plurality of coupling parts. Thus, a coupling position of the body 10 may be more accurately guided and the body 10 may not be easily separated from the target attachment surface 700, compared with a case in which a less amount of coupling parts are provided.

Figure 18:
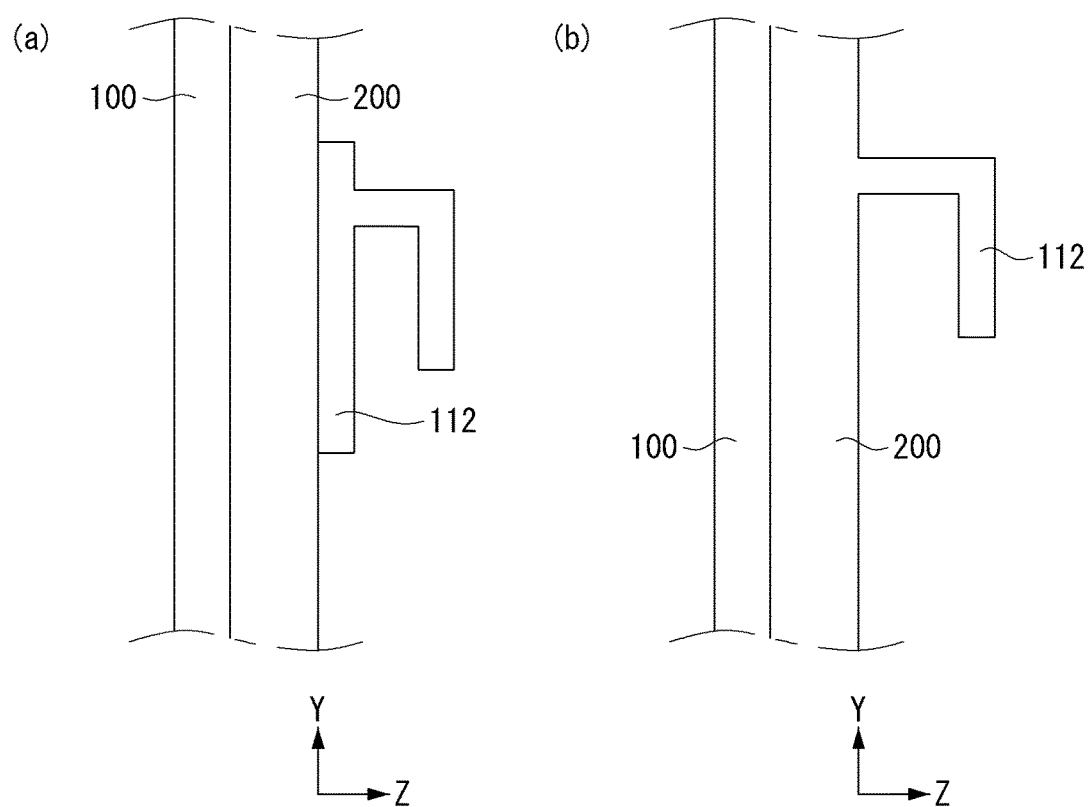

Referring to FIG. 18, in the display device according to an embodiment of the present disclosure, the first coupling part 112 may be attached to the body 10 in various manners.

For example, as illustrated in (a) of FIG. 18, one surface of the first coupling part 112 may be attached to a rear surface of the module cover 200. The first coupling part 112 may be coupled to the module cover 200 using any one of a double-sided tape, an adhesive, and a screw. The first coupling part 112 may have a material the same as or similar to that of the module cover 200. In this case, the rear surface of the module cover 200 may be formed to be flat and coupled to the first coupling part 112. Thus, a manufacturing process may be simplified and cost may be saved.

Alternatively, as illustrated in (b) of FIG. 18, the first coupling part 112 may be integrally formed with the module cover 200. In this case, a first protrusion may directly protrude from the module cover 200. Since the module cover 200 and the first coupling part 112 are integrally formed, the first coupling part 112 may not be separated from the module cover 200 and rigidity of the module cover 200 may be enhanced.

In the drawing, only the first coupling part 112 is illustrated, but the third coupling part 144 may also be coupled to the body 10 in the same or similar manner.

Figure 19:
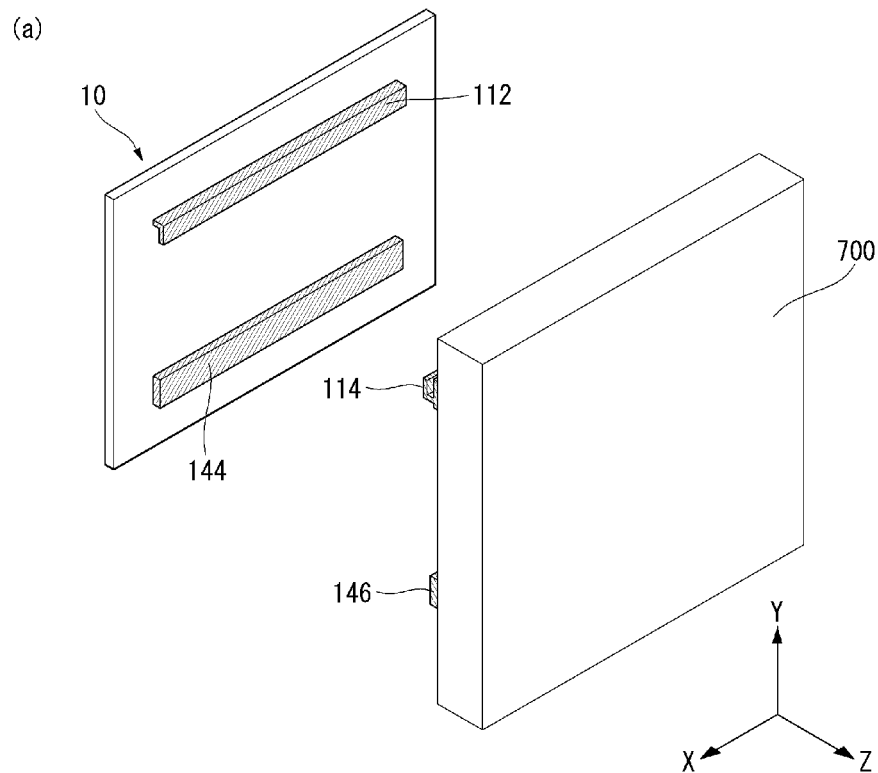
Figure 19:
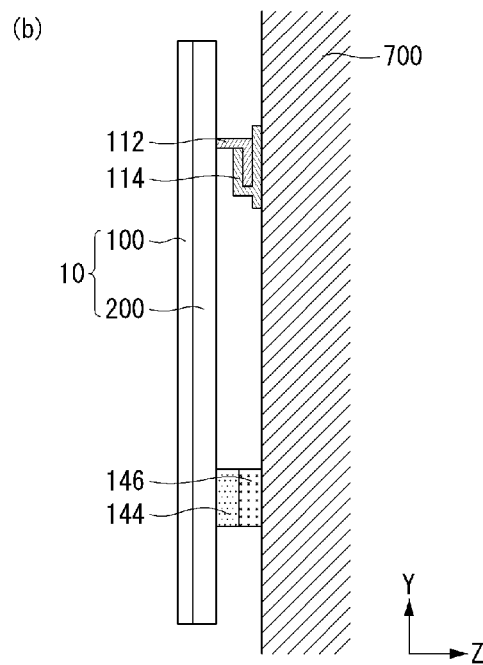

Referring to FIG. 19, in the display device according to an embodiment of the present disclosure, all the first to fourth coupling parts 112, 114, 144, and 146 may include a magnetic material.

The first and second coupling parts 112 and 114 may have a hook shape and include a magnetic material. The third and fourth coupling parts 144 and 146 may protrude from the body 10 and the target attachment surface 700 and may include a magnetic material.

In the display device according to an embodiment of the present disclosure, the first and second coupling parts, as well as the third and fourth coupling parts 144 and 146, may include a magnetic material. Thus, the body 10 and the target attachment surface 700 may be more easily coupled and a position to which the body 10 is to be coupled may be more accurately guided.

Figure 20:
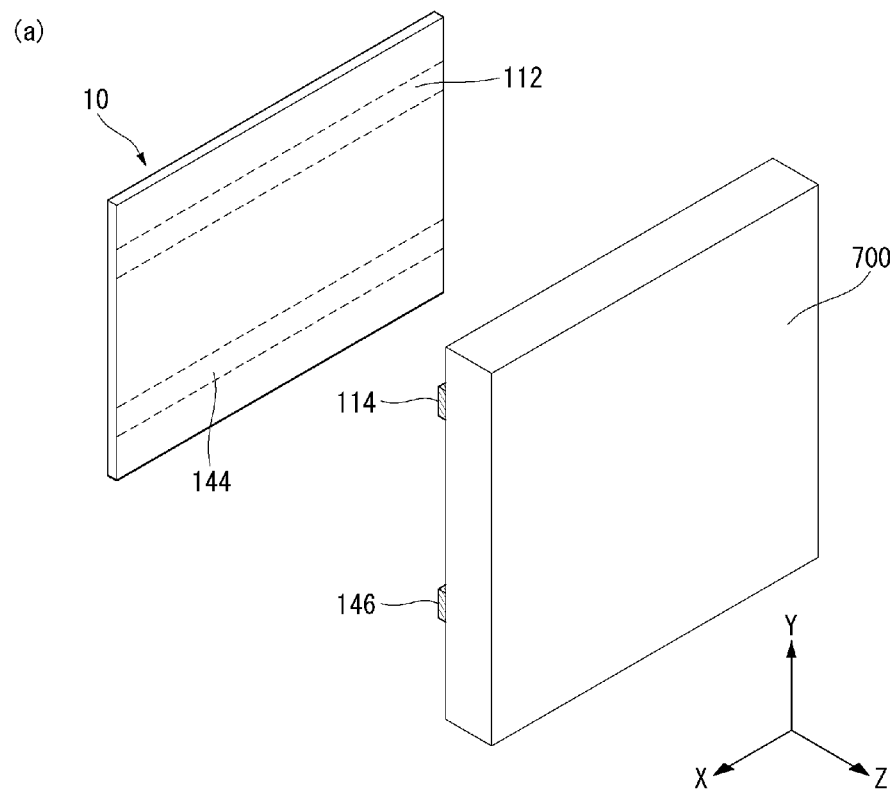
Figure 20:
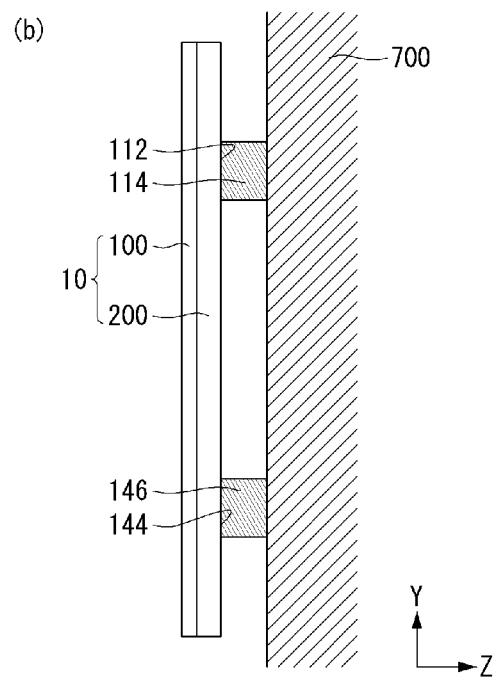

Referring to FIG. 20, in the display device according to an embodiment of the present disclosure, the first to fourth coupling parts 112, 114, 144, and 146 may not include a hook. The first and third coupling parts 112 and 144 may not protrude and may have a flat shape. The first and third coupling parts 112 and 144 may include the same metal as that of the module cover. The second and fourth coupling parts 114 and 146 may protrude forwardly from the target attachment surface 700. The second and fourth coupling parts 114 and 146 may include a magnetic material. Since the first and third coupling parts 112 and 144 include a metal, they may coupled to the second and fourth magnetic coupling parts 114 and 146, respectively, in the first state.

In the display device according to an embodiment of the present disclosure, the body 10 and the target attachment surface 700 may be coupled only by magnetism. Thus, the body 10 and the target attachment surface 700 may be more easily separated and coupled.

Figure 21:
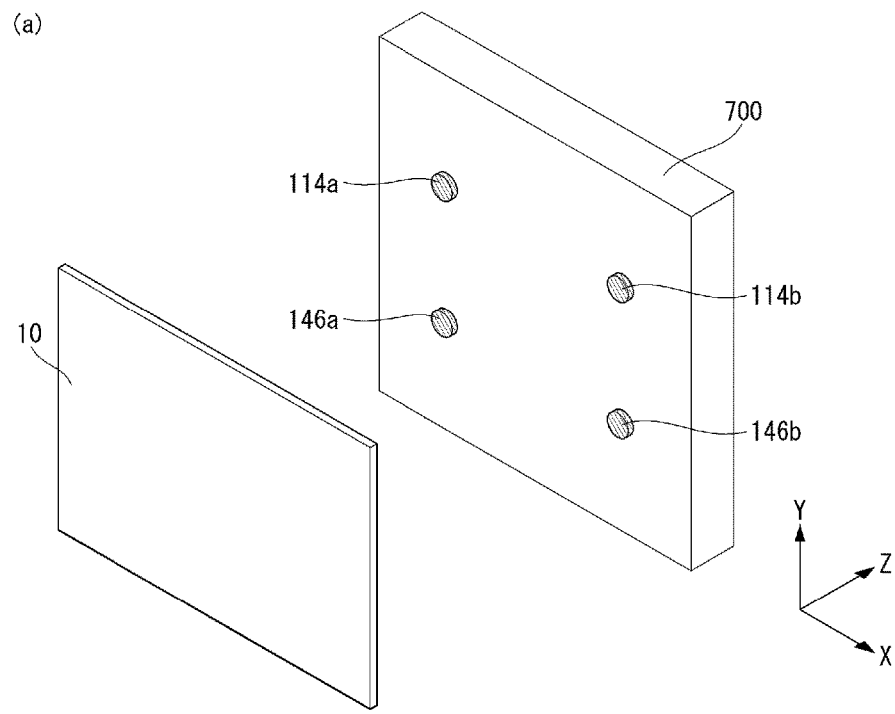
Figure 21:
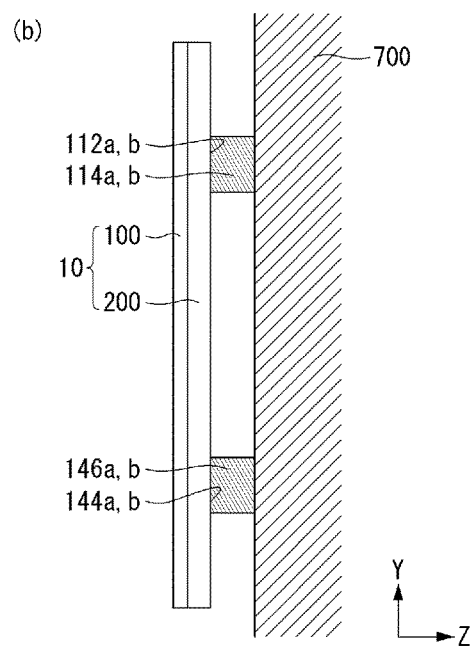

Referring to FIG. 21, in the display device according to an embodiment of the present disclosure, the first to fourth coupling parts 112, 114, 144, and 146 may be divided into a plurality of parts. The first to fourth coupling parts 112, 114, 144, and 146 may include first to fourth one side coupling parts 112*a*, 114*a*, 144*a*, and 146*a* and first to fourth the other side coupling parts 112*b*, 114*b*, 144*b*, and 146*b*.

The second one side and the other side coupling parts 114*a* and 114*b* may protrude from the target attachment surface 700 and have a circular shape. The second one side and the other side coupling parts 114*a* and 114*b* may include a magnetic material. The second one side coupling part 114*a* may be positioned on one side of an upper portion of the target attachment surface 700, and the second the other side coupling part 114*b* may be positioned in a portion facing the second one side coupling part 114*a* on the basis of a longer axis of the body as a central axis. That is, the second one side and the other side coupling parts 114*a* and 114*b* may be positioned on the left and right sides of the upper portion of the body 10 in the first state.

The fourth one side and the other side coupling parts 146*a* and 146*b* may protrude from the target attachment surface 700 and have a circular shape. The fourth one side and the other side coupling parts 146*a* and 146*b* may include a magnetic material. The fourth one side coupling part 146*a* may be positioned on one side of a lower portion of the target attachment surface 700, and the fourth the other side coupling part 146*b* may be positioned in a portion facing the fourth one side coupling part 146*a* on the basis of a longer axis of the body 10 as a central axis. That is, the fourth one side and the other side coupling parts 146*a* and 146*b* may be positioned on the left and right sides of an upper portion of the body 10 in the first state.

The first one side and the other side coupling parts 112*a* and 112*b* and the third one side and the other side coupling parts 144*a* and 144*b* may not protrude from the body 10 and may be flat. The first one side and the other side coupling parts 112*a* and 112*b* and the third one side and the other side coupling parts 144*a* and 144*b* may include the same material as that of the module cover. Since the first one side and the other side coupling parts 112*a* and 112*b* and the third one side and the other side coupling parts 144*a* and 144*b* include a metal, they may be coupled to the second one side and the other side magnetic coupling parts 114*a* and 114*b* and the fourth one side and the other side magnetic coupling parts 146a and 146b in the first state.

In the display device according to an embodiment of the present disclosure, the first to fourth coupling parts 112, 114, 144, and 146 may be divided into a plurality of parts. Thus, the body 10 may be coupled to an accurate position of the target attachment surface 700.

Figure 22:
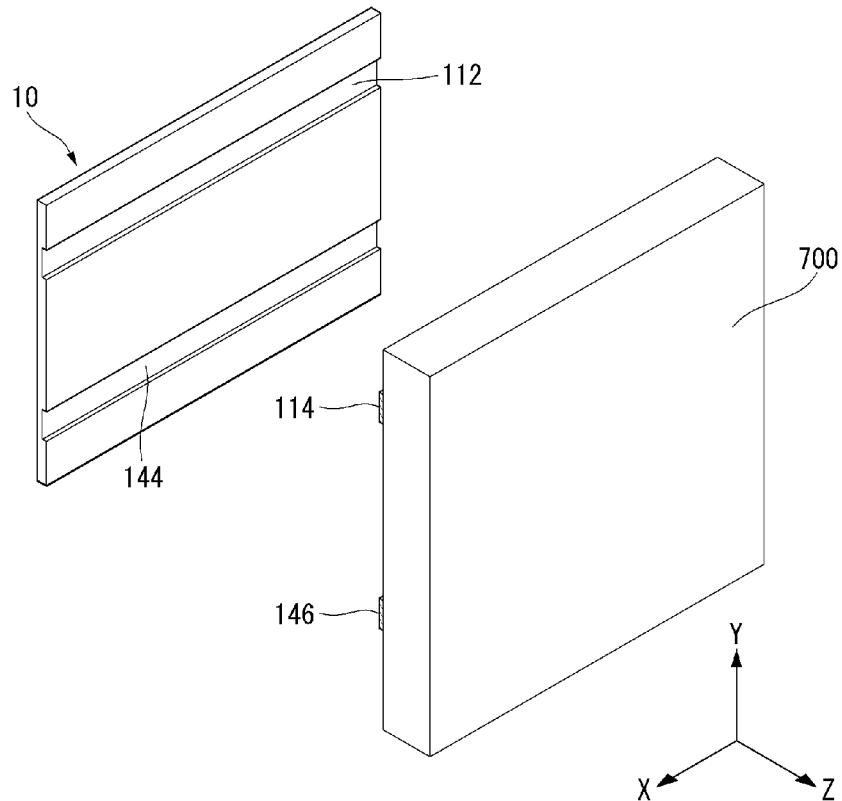
Figure 22:
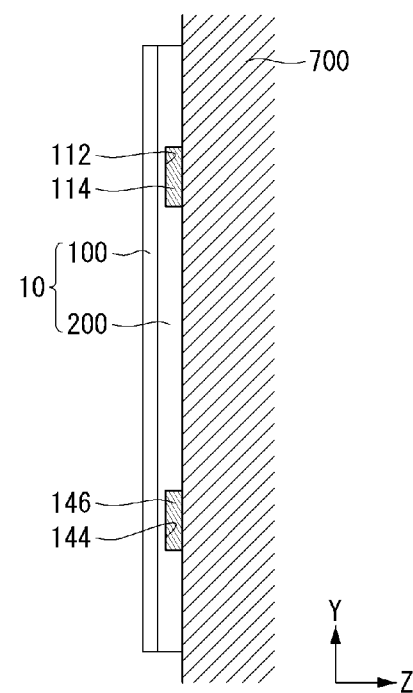

Referring to FIG. 22, in the display device according to an embodiment of the present disclosure, the first and third coupling parts 112 and 144 may be depressed into an interior of the body 10. The first and third coupling parts 112 and 144 may be formed by forming a portion of the module cover 200. The second and fourth coupling parts 114 and 146 may protrude forwardly from the target attachment surface 700. Widths of the second and fourth protruding coupling parts 114 and 146 may be equal to or smaller than widths of the first and third depressed coupling parts 112 and 144. Thus, when the body 10 and the target attachment surface 700 are coupled, the second and fourth coupling parts 114 and 146 may be inserted into the first and third coupling parts 112 and 144, respectively.

In the display device according to an embodiment of the present disclosure, the first and third coupling parts 112 and 144 may be depressed to an interior of the module cover 200. Thus, rigidity of the module cover 200 may be enhanced, and since the second and fourth coupling parts 114 and 146 are inserted and coupled by magnetism, the body 10 and the target attachment surface 700 may not be easily separated.

Figure 23:
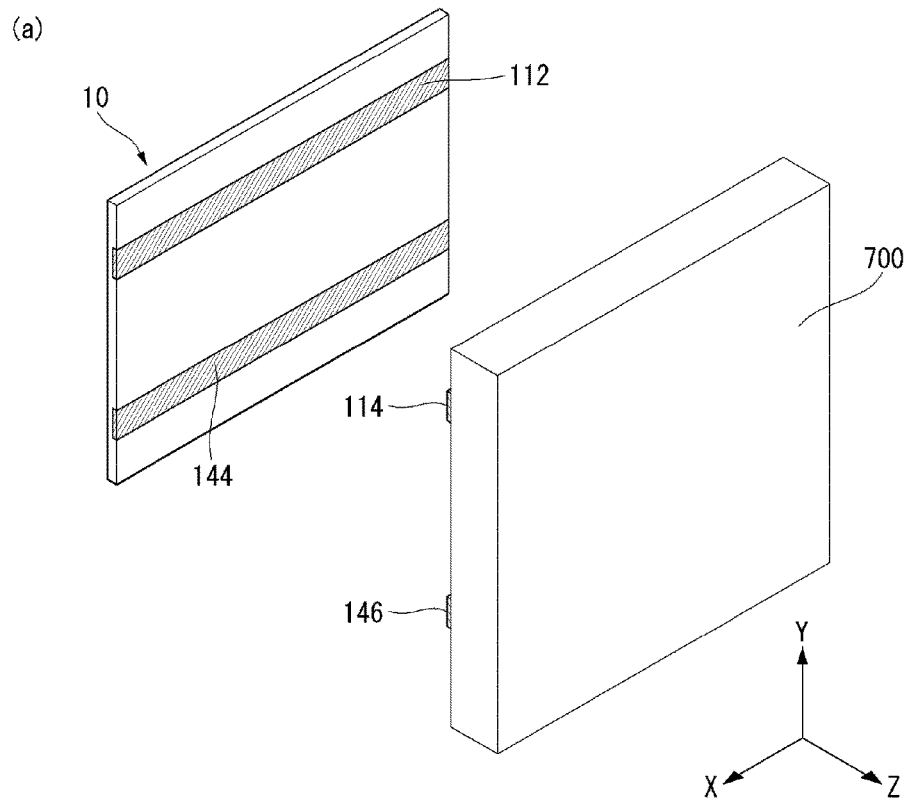
Figure 23:
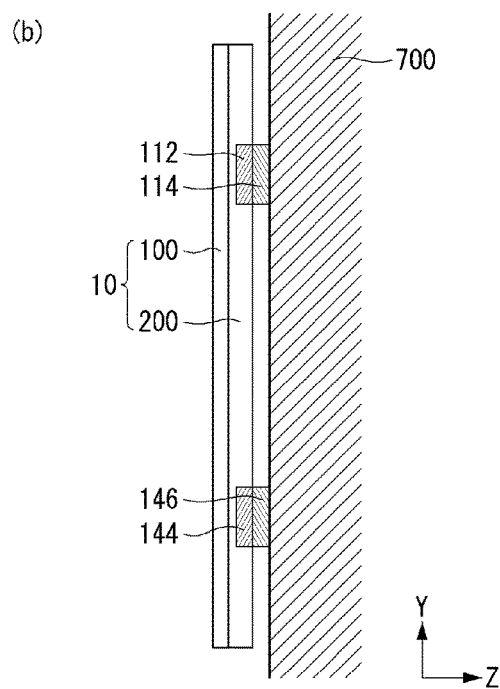

Referring to FIG. 23, in the display device according to an embodiment of the present disclosure, a magnetic material may be inserted into the portions of the body 10 in which the first and third coupling parts 112 and 144 are depressed to the interior of the body 10. Widths of the first and third coupling parts 112 and 144 depressed to the interior of the body 10 may be equal to or greater than a width of the inserted magnetic material. Thus, the first and third coupling parts 112 and 144 may not protrude backwardly from the module cover 200.

The second and fourth coupling parts 114 and 146 may protrude forwardly from the target attachment surface 700. The second and fourth coupling parts 114 and 146 may include a magnetic material. The second and fourth coupling parts 114 and 146 may have a polarity opposite to that of the first and third coupling parts 112 and 144.

In the display device according to an embodiment of the present disclosure, the portions whether the first and third coupling parts 112 and 144 are positioned are depressed to an interior of the module cover 200, enhancing rigidity of the module cover 200, and since the first and third coupling parts 112 and 144 and the second and fourth coupling parts 114 and 146 have the mutually opposite polarities, the body 10 and the target attachment surface 700 may be more strongly coupled to each other.

Figure 24:
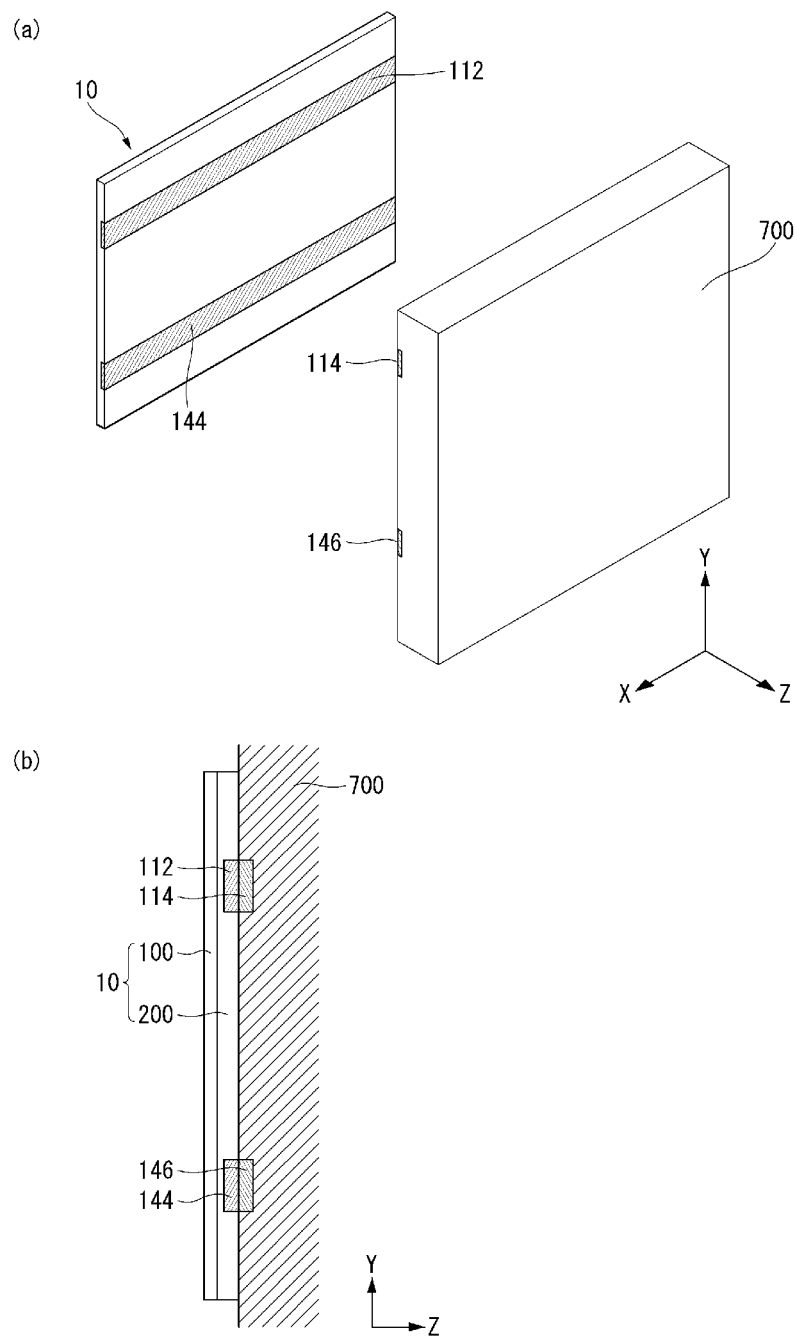

Referring to FIG. 24, in the display device according to an embodiment of the present disclosure, a magnetic material may be inserted into the portions of the body 10 or the target attachment surface 700 where the first to fourth coupling parts 112, 114, 144, and 146 are depressed. Widths of the first and third coupling parts 112 depressed to an interior of the body 10 may be equal to or greater than a width of the inserted magnetic material. Also, widths of the second and coupling parts 114 and 146 depressed to an interior of the target attachment surface 700 may be equal to or greater than the width of the inserted magnetic material. Thus, the first to fourth coupling parts 112, 114, 144, and 146 may not protrude backwardly from the module cover 200 or the target attachment surface 700.

In the display device according to an embodiment of the present disclosure, since the portions where the first to fourth coupling parts 112, 114, 144, and 146 are positioned are depressed to the interior of the module cover 200, rigidity of the module cover 200 is enhanced, and since the first to fourth coupling parts 112, 114, 144, and 146 do not protrude outwardly, the body 10 and the target attachment surface 700 may be tightly attached and coupled to each other.

Figure 25:
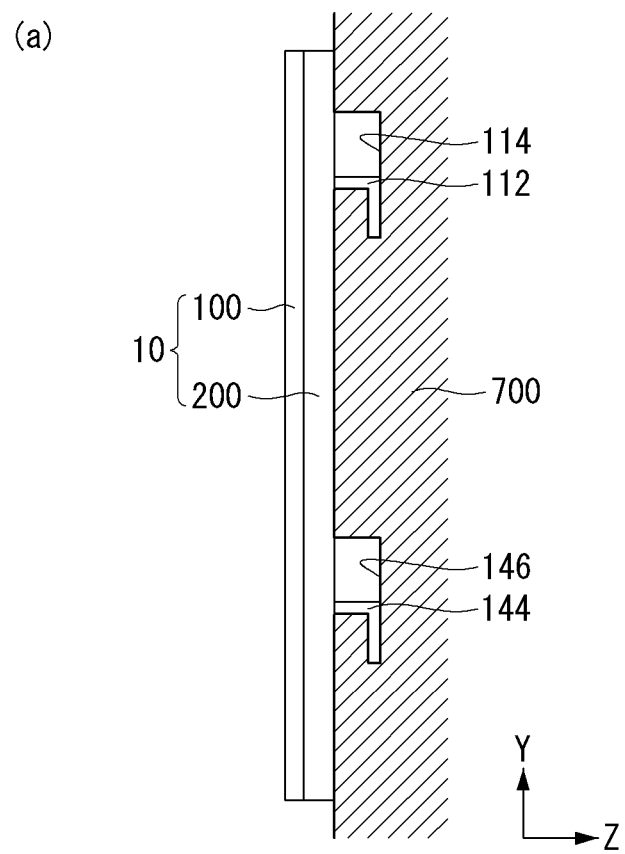
Figure 25:
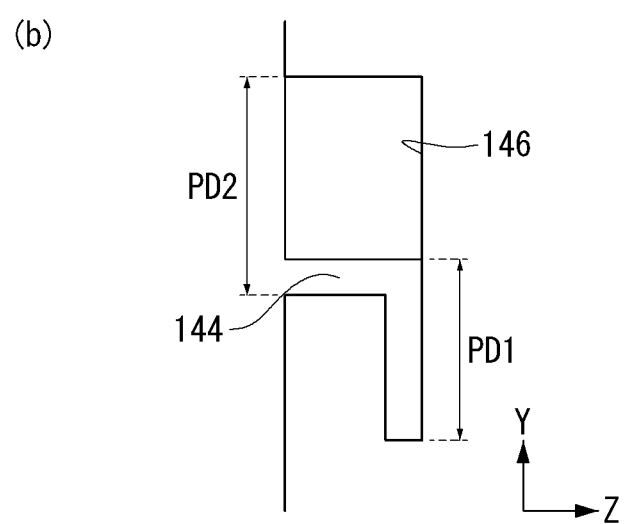

Referring to FIG. 25, in the display device according to an embodiment of the present disclosure, the second and fourth coupling parts 114 and 146 may be depressed to an interior of the target attachment surface 700.

The first and third coupling parts 112 and 144 may include a first hook protruding backwardly from the module cover 200. The second and fourth coupling parts 114 and 146 may be depressed to fit a shape of the first hook such that the first hook may be inserted thereinto.

The first hook may include a first protrusion protruding backwardly from the body 10 and a second protrusion connected to the first protrusion and protruding in a direction perpendicular to the first protrusion. In the second and fourth coupling parts 114 and 146, a portion of a lower surface thereof into which the second protrusion is inserted is depressed to be deeper to fit the shapes of the first and second protrusions. Also, a length PD1 of the second protrusion may be equal to or smaller than a length PD2 of an entrance of a depression such that the first and third coupling parts 112 and 144 may be inserted into the second and fourth coupling parts 114 and 146.

In the display device according to an embodiment of the present disclosure, since the second and fourth coupling parts 114 and 146 are depressed to an interior of the target attachment surface 700, the body 10 and the target attachment surface 700 may be tightly attached and coupled to each other. Also, since the first and third coupling parts 112 and 144 include the first hook, the body 10 and the target attachment surface 700 may be easily separated from each other or coupled to each other.

Figure 26:
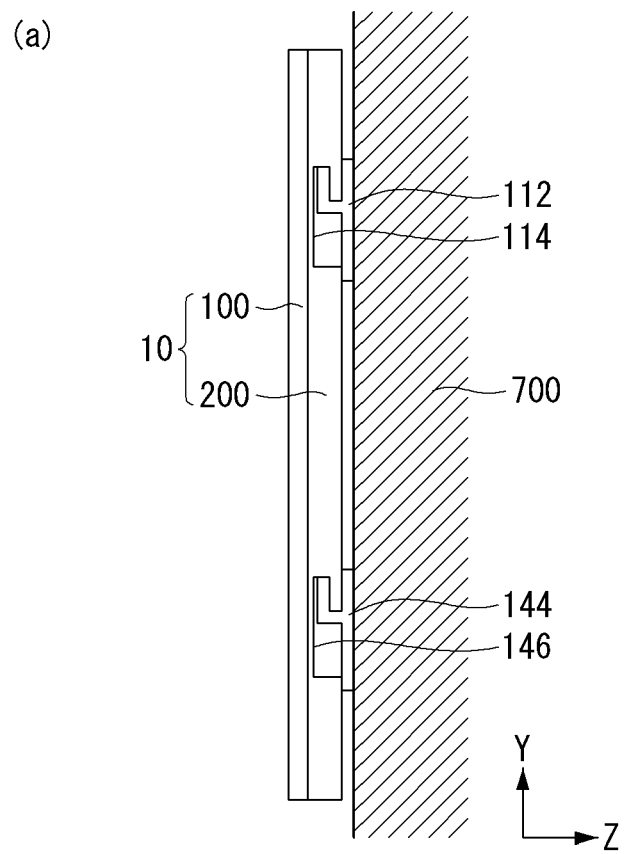
Figure 26:
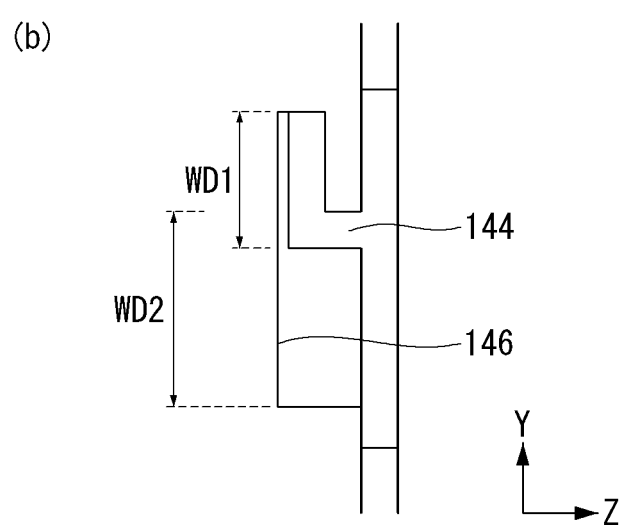

Referring to FIG. 26, in the display device according to an embodiment of the present disclosure, the first and third coupling parts 112 and 144 may be depressed to an interior of the module cover 200.

The second and fourth coupling parts 114 and 146 may include a second hook protruding forwardly from the target attachment surface 700. The first and third coupling parts 112 and 144 may be depressed to fit a shape of the second hook such that the second hook may be inserted thereinto.

The second hook may include a third protrusion protruding forwardly from the target attachment surface 700 and a fourth protrusion connected to the third protrusion and protruding in a direction perpendicular to the third protrusion. In the first and third coupling parts 112 and 144, a portion of an upper surface thereof into which the fourth protrusion is inserted is depressed to be deeper to fit the shapes of the third and fourth protrusions. Also, a length WD1 of the fourth protrusion may be equal to or smaller than a length WD2 of an entrance of a depression such that the second and fourth coupling parts 114 and 146 may be inserted into the first and third coupling parts 112 and 144.

Since the first and third coupling parts 112 and 144 are depressed to an interior of the module cover 200, the body 10 and the target attachment surface 700 may be tightly attached and coupled to each other. Also, since the second and fourth coupling parts 114 and 146 include the second hook, the body 10 and the target attachment surface 700 may be easily separated from each other or coupled to each other.

Figure 27:
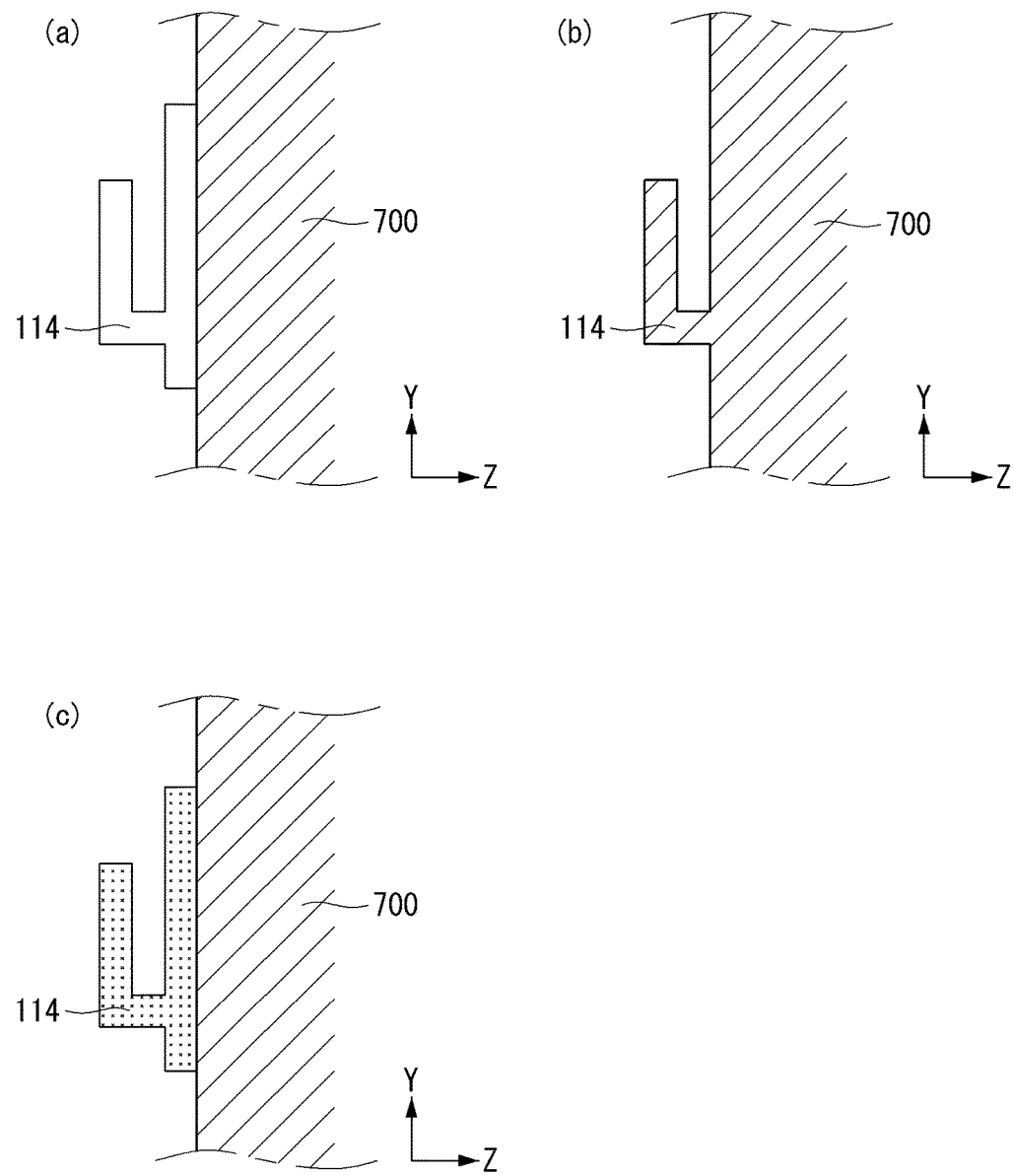

Referring to FIG. 27, in the display device according to an embodiment of the present disclosure, the second coupling part 114 may be attached to the target attachment surface 700 in various manners.

For example, as illustrated in (a) of FIG. 27, one surface of the second coupling part 114 may be attached to a front surface of the target attachment surface 700. The second coupling part 114 may be coupled to the target attachment surface 700 using any one of a double-sided tape, an adhesive, and a screw. The second coupling part 114 may have a material the same as or similar to that of the target attachment surface 700. In this case, the second coupling part 114 may be attached without contacting the target attachment surface 700. Thus, cost may be saved.

Alternatively, as illustrated in (b) of FIG. 27, the second coupling part 114 may be integrally formed with the target attachment surface 700. In this case, a second protrusion may directly protrude from the target attachment surface 700. Since the second coupling part 114 is integrally formed with the target attachment surface 700, the second coupling part 114 may not be separated from the target attachment surface 700.

Alternatively, as illustrated in (c) of FIG. 27, the second coupling part 114 may include a magnetic material. In this case, the body 100 and the target attachment surface 700 may be more easily coupled and a position to which the body 100 is to be coupled may be more accurately guided.

In the drawing, only the second coupling part 114 is illustrated, but the fourth coupling part 146 may also be coupled to the target attachment surface 700 in the same or similar manner.

Figure 28:
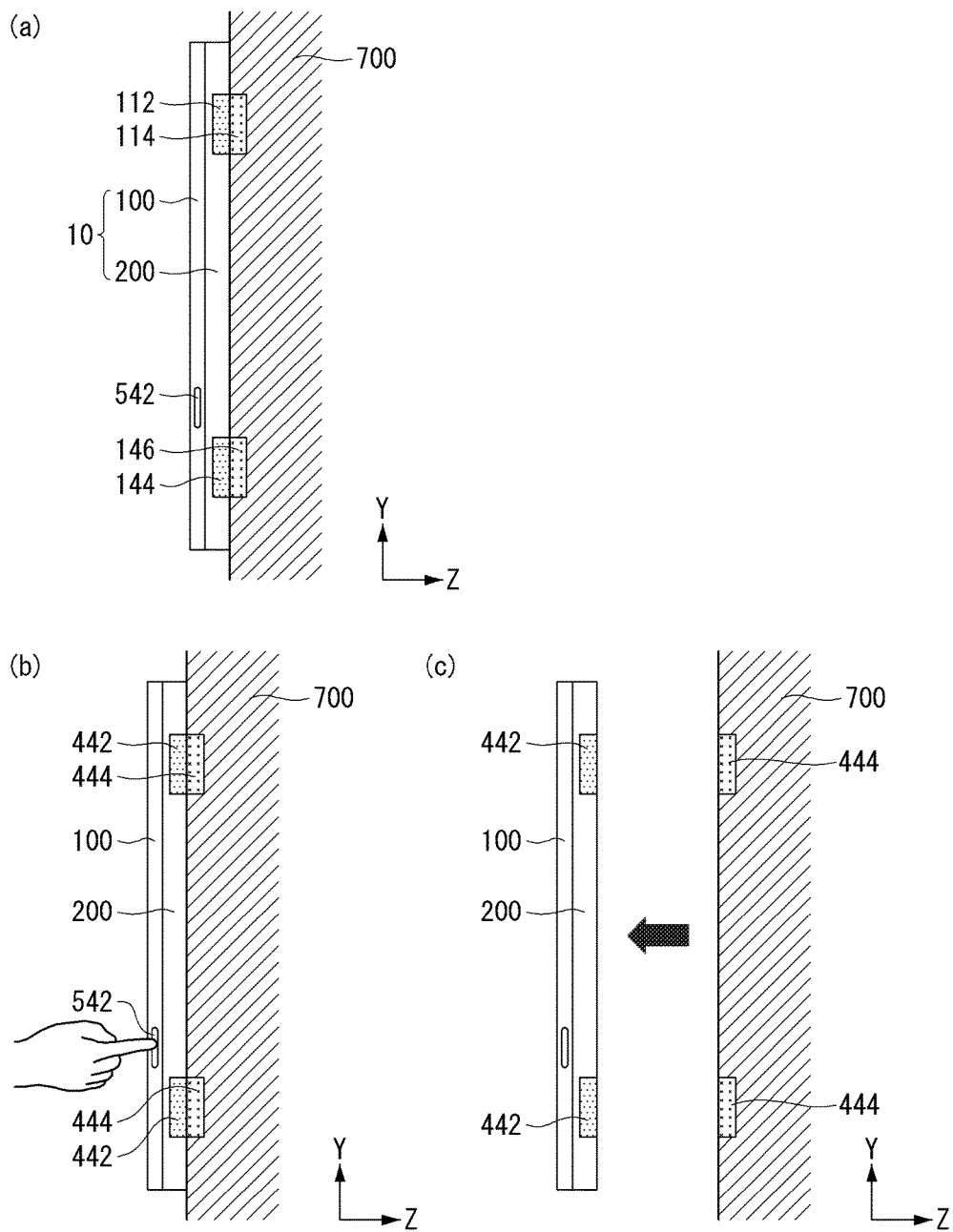

Referring to FIG. 28, in the display device according to an embodiment of the present disclosure, a button 542 may be positioned on one side thereof. The button 542 may be a push button or a touch button. When a first operation is applied by a user, the button 542 may be changed from the first state to the second state. For example, the first operation may be a user's touch or push operation.

The first and third coupling parts 112 and 144 may include an electromagnet. That is, the first and third coupling parts 112 and 144 may include a material which assumes magnetism when a current flows and which is demagnetized when a current is cut off. The button 542 may cause a current flowing in the first and third coupling parts 112 and 144 to be cut off when the first operation is applied by the user. Accordingly, the first and third coupling parts 112 are demagnetized and separated from the second and fourth coupling parts 114 and 146.

In the display device according to an embodiment of the present disclosure, the first and third coupling parts 112 and 144 may include an electromagnet. Thus, the first state may be easily switched to the second state only through an operation of the button 542.

Figure 29:
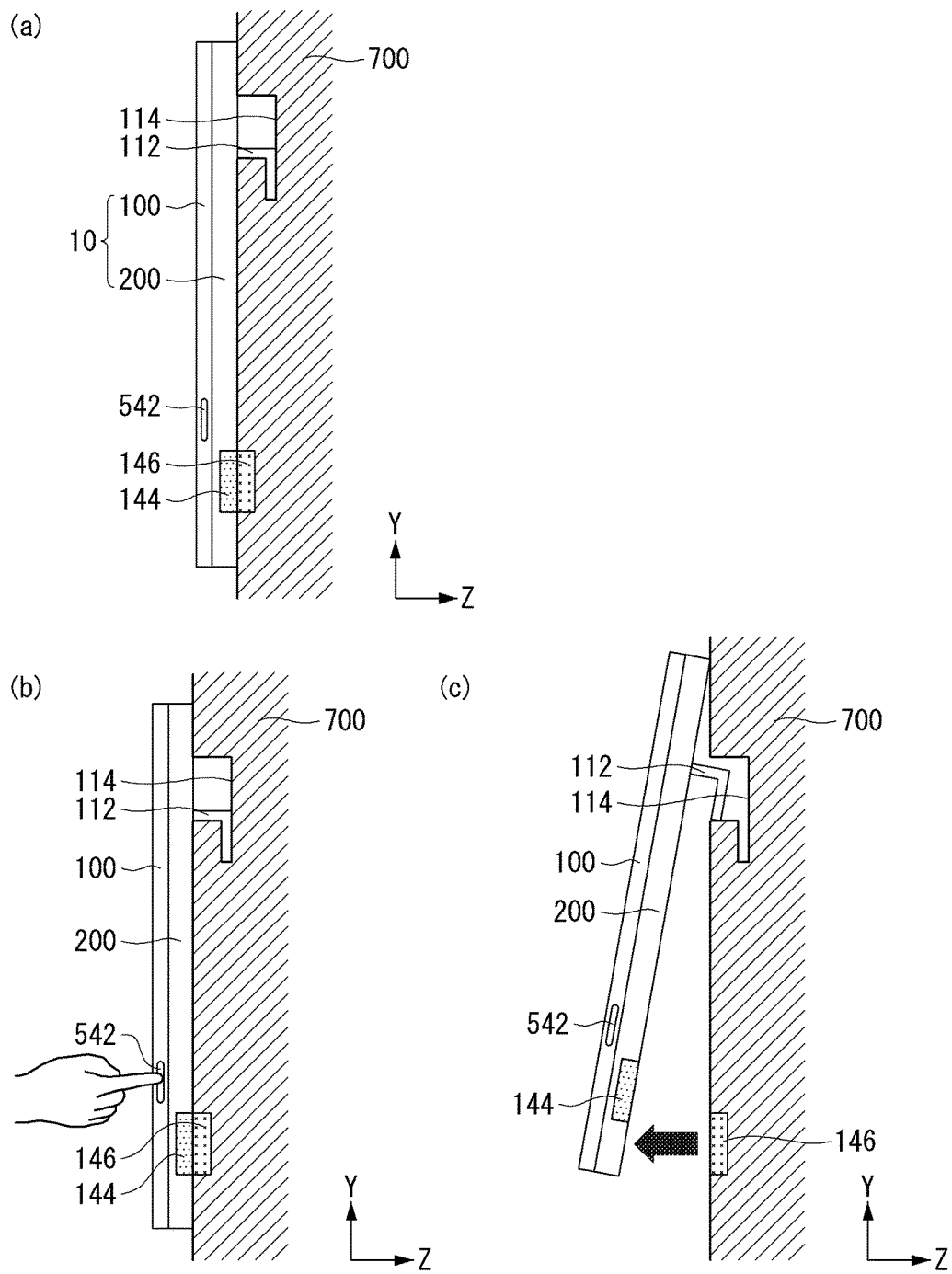

Referring to FIG. 29, in the display device according to an embodiment of the present disclosure, the first coupling part 112 may include a first hook and the third coupling part 144 may include an electromagnet.

The first coupling part 112 may be inserted into the second coupling part 114 depressed to an interior of the target attachment surface 700 so as to be coupled thereto, and the third coupling part 144 may be coupled to the fourth coupling part 146 in which a magnetic material is inserted into a portion depressed to an interior of the target attachment surface 700.

When the user applies the first operation to the button 542, a current flowing in the third coupling part 144 may be cut off. Accordingly, the third coupling part 144 and the fourth coupling part 146 may be separated from each other. In this case, however, the first coupling part 112 and the second coupling part 114 may still be coupled to each other. Thus, in order to change from the first state to the second state, the first coupling part 112 and the second coupling part 114 may be separated.

In the display device according to an embodiment of the present disclosure, only the third coupling part 144 may include an electromagnet. Thus, when the user presses the button 542, the body 10 may not be separated from the target attachment surface 700. Also, since the first coupling part 112 is formed as a hook, the body may be more easily guided to a position to which the body 10 is to be coupled.

Figure 30:
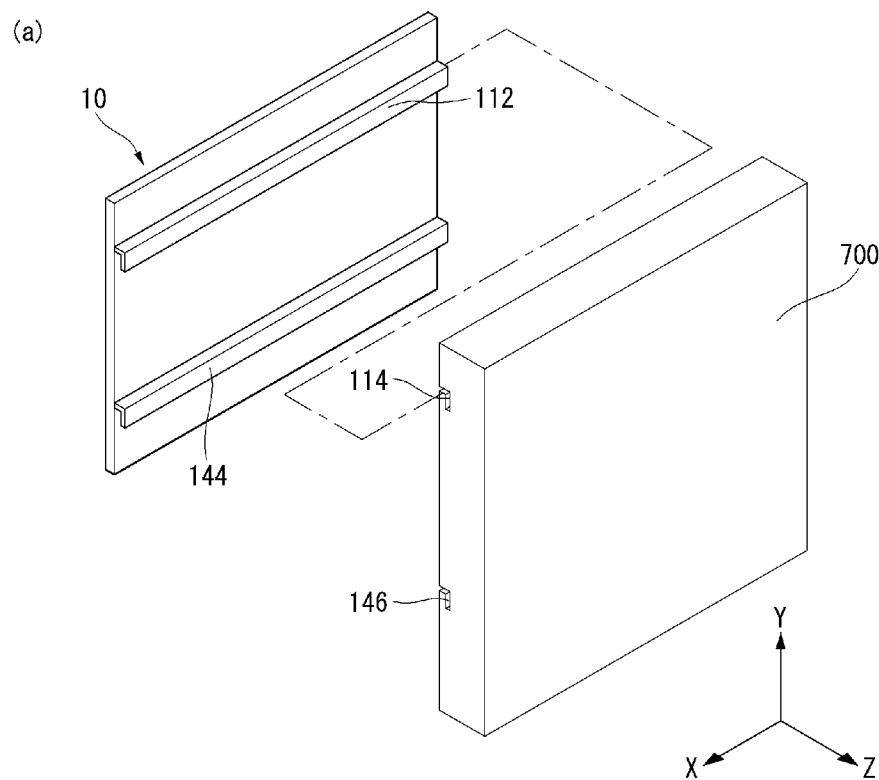
Figure 30:
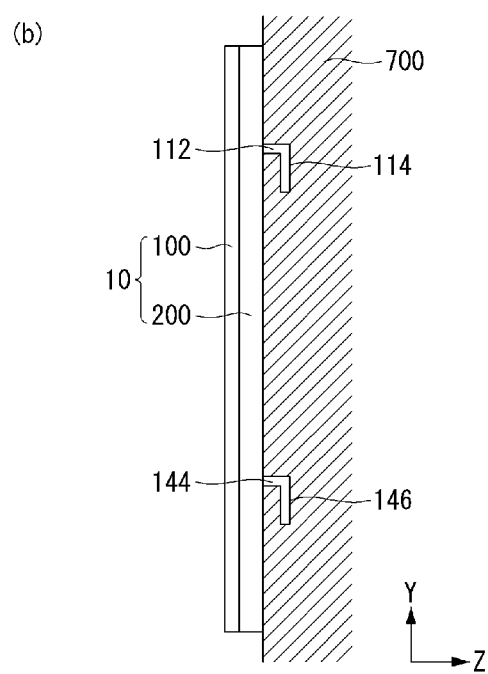

Referring to FIG. 30, in the display device according to an embodiment of the present disclosure, the first and third coupling parts 112 and 144 include a rail, and the second and fourth coupling parts 114 and 146 may include a guide rail.

The rail may protrude backwardly from the body 10, and the guide rail may be depressed to an interior of the target attachment surface 700. A cross-sectional structure of the rail may be the same as that of the guide rail, and thus, after coupling, the body 10 may not be easily separated from the target attachment surface 700. Also, after coupling, the body 10 may not be shaken.

Unlike the aforementioned hook, the rail may extend to a side surface of the body 10. The rail may be integrally formed with the body 10 or may be separately formed from the body 10 and attached to the body 10. The guide rail may also extend to a side surface of the target attachment surface 700. Thus, when the second state is switched to the first state, the rail and the guide rail may be slidably coupled on the side surface. That is, the rail and the guide rail may allow the body 10 to be moved to the side surface of the target attachment surface 700 and inserted laterally.

In the display device according to an embodiment of the present disclosure, the rail may be used to be slidably coupled to the guide rail. Thus, the body 10 and the target attachment surface 700 may be more strongly coupled.

Figure 31:
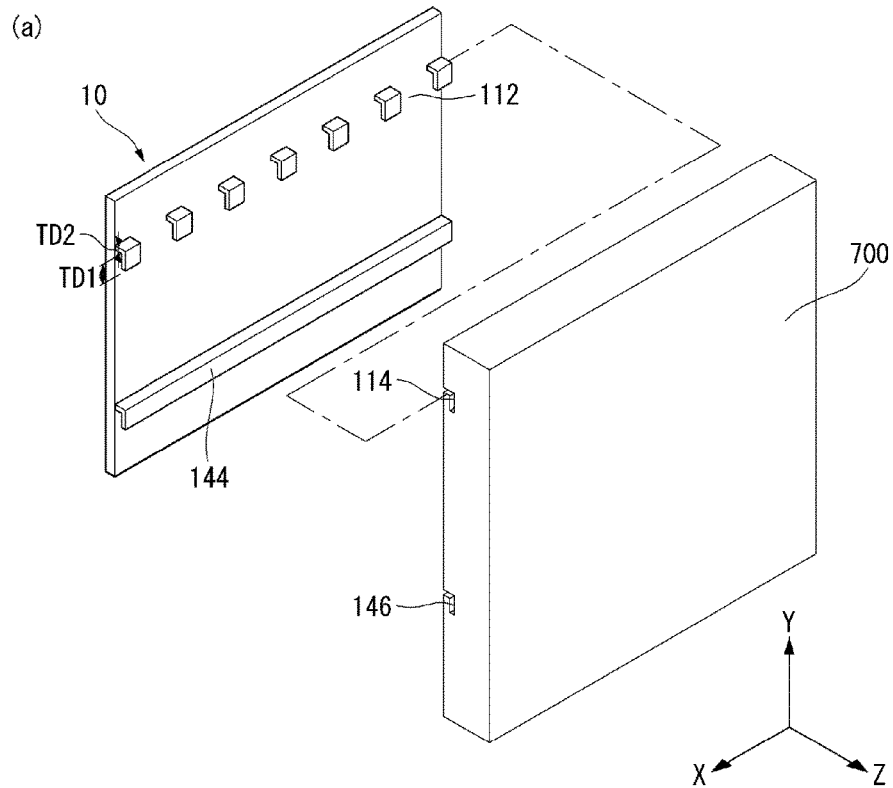
Figure 31:
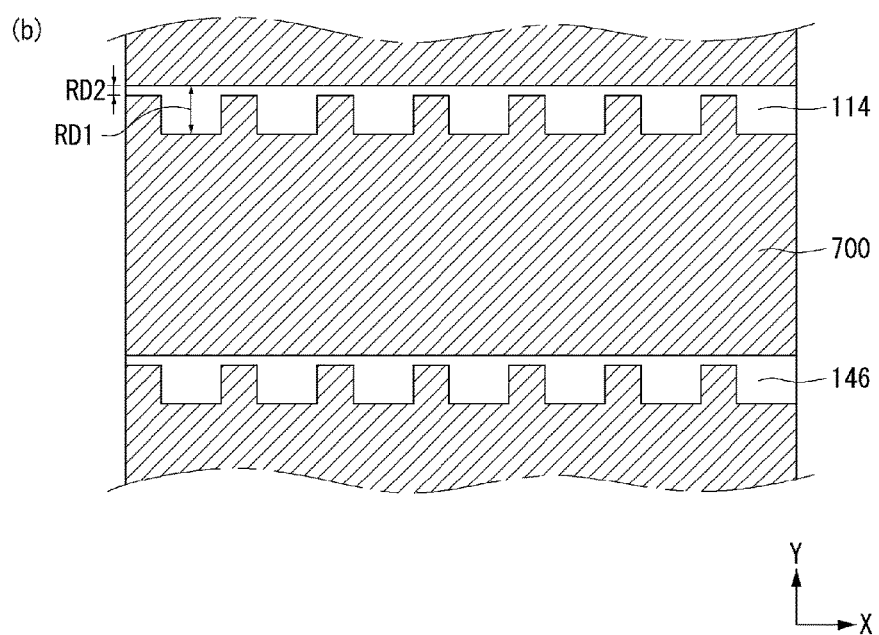

Referring to FIG. 31, in the display device according to an embodiment of the present disclosure, the first and third coupling parts 112 and 144 may be divided into a plurality of parts in a longer axis direction of the body 10. That is, the first and third coupling parts 112 and 144 may include a plurality of rails. In this case, the second and fourth coupling parts 114 and 146 may be depressed to an interior of the target attachment surface 700. Each of the rails may include a first protrusion protruding backwardly from the body 10 and a second protrusion connected to the first protrusion and protruding in a direction perpendicular to the first protrusion.

At least a portion of a width of an entrance of a depression of the target attachment surface 700 may be different from those of other portions. For example, a width RD2 of a portion of the second and fourth coupling parts 114 and 146 into which the rail is inserted may be equal to a width TD2 of the first protrusion of the first and third coupling parts 112 and 144 such that the rail may not be separated from the guide rail. In contrast, a width RD1 of the second and fourth coupling parts 114 and 146 in a portion into which the rail is not inserted may be equal to a width TD1 of the second protrusion of the first and third coupling parts 112 and 144 such that the rail may be easily coupled to the guide rail.

In the display device according to an embodiment of the present disclosure, at least a portion of a width of an entrance of a depression of the second and fourth coupling parts 114 and 146 may be different from those of other portions. Thus, the body 10 may be moved only to a portion into which the rail is not inserted, so as to be slidably coupled, without having to move to the side surface of the target attachment surface 700.

Figure 32:
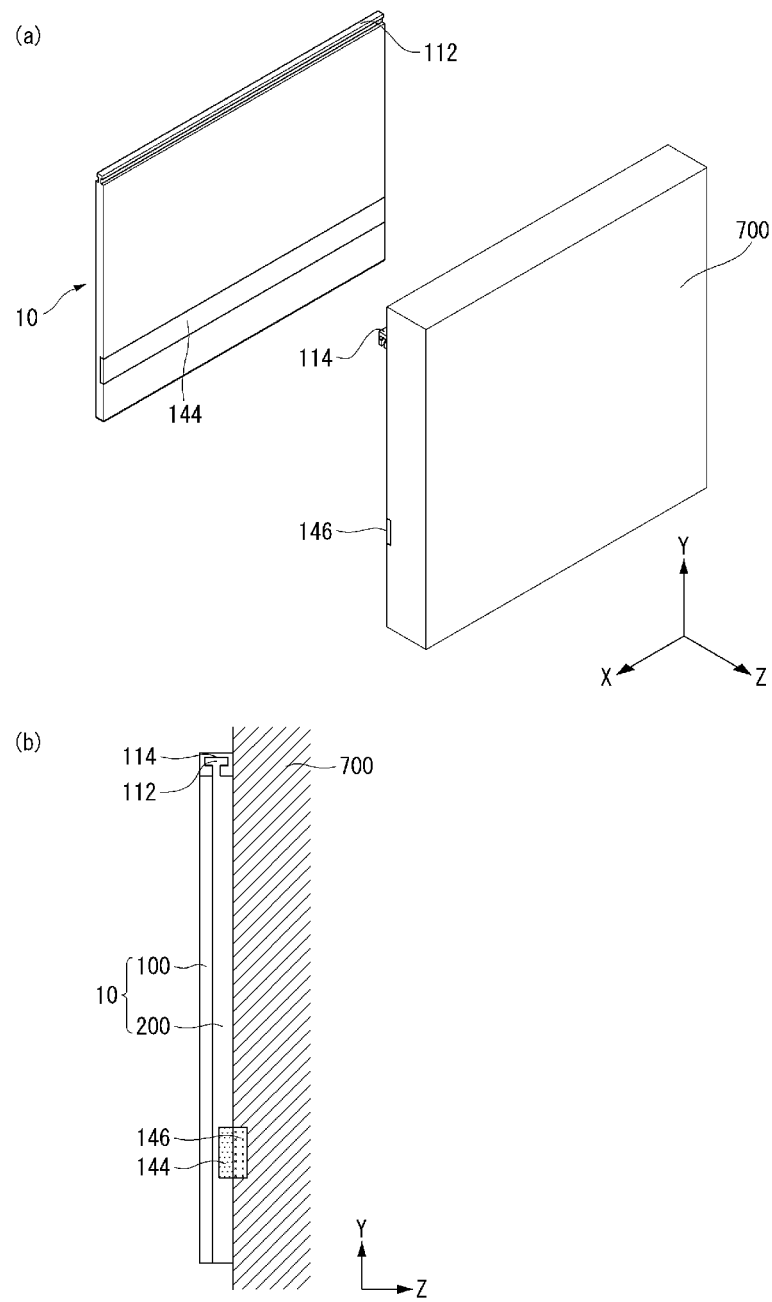

Referring to FIG. 32, in the display device according to an embodiment of the present disclosure, the first coupling part 112 may protrude upwardly from the body 10. In this case, the second coupling part 114 may protrude forwardly from the target attachment surface 700. The protruded portion of the second coupling part 114 may be upwardly depressed so as to be coupled to the first coupling part 112. Thus, a protruding direction of the first coupling part 112 may be perpendicular to a protruding direction of the second coupling part 114. A protruded cross-sectional structure of the first coupling part 112 may be the same as the depressed cross-sectional structure of the second coupling part 114.

The third and fourth coupling parts 144 and 146 may be configured such that a magnetic material is inserted into a portion depressed to an interior of the body 10 or the target attachment surface 700. Widths of the third and fourth coupling parts 144 and 146 depressed to the interior of the body 10 or the target attachment surface 700 may be equal to or greater than a width of the inserted magnetic material. Thus, the third and fourth coupling parts 144 and 146 may not protrude backwardly from the module cover 200.

In the display device according to an embodiment of the present disclosure, the second coupling part 114 may be positioned on an upper side of the body 10 in the first state. Accordingly, the user may feel that a step of the body 10 and the target attachment surface 700 is smaller. Also, since the body 10 is slidably coupled without forming a depression on the target attachment surface 700, cost may be saved.

Figure 33:
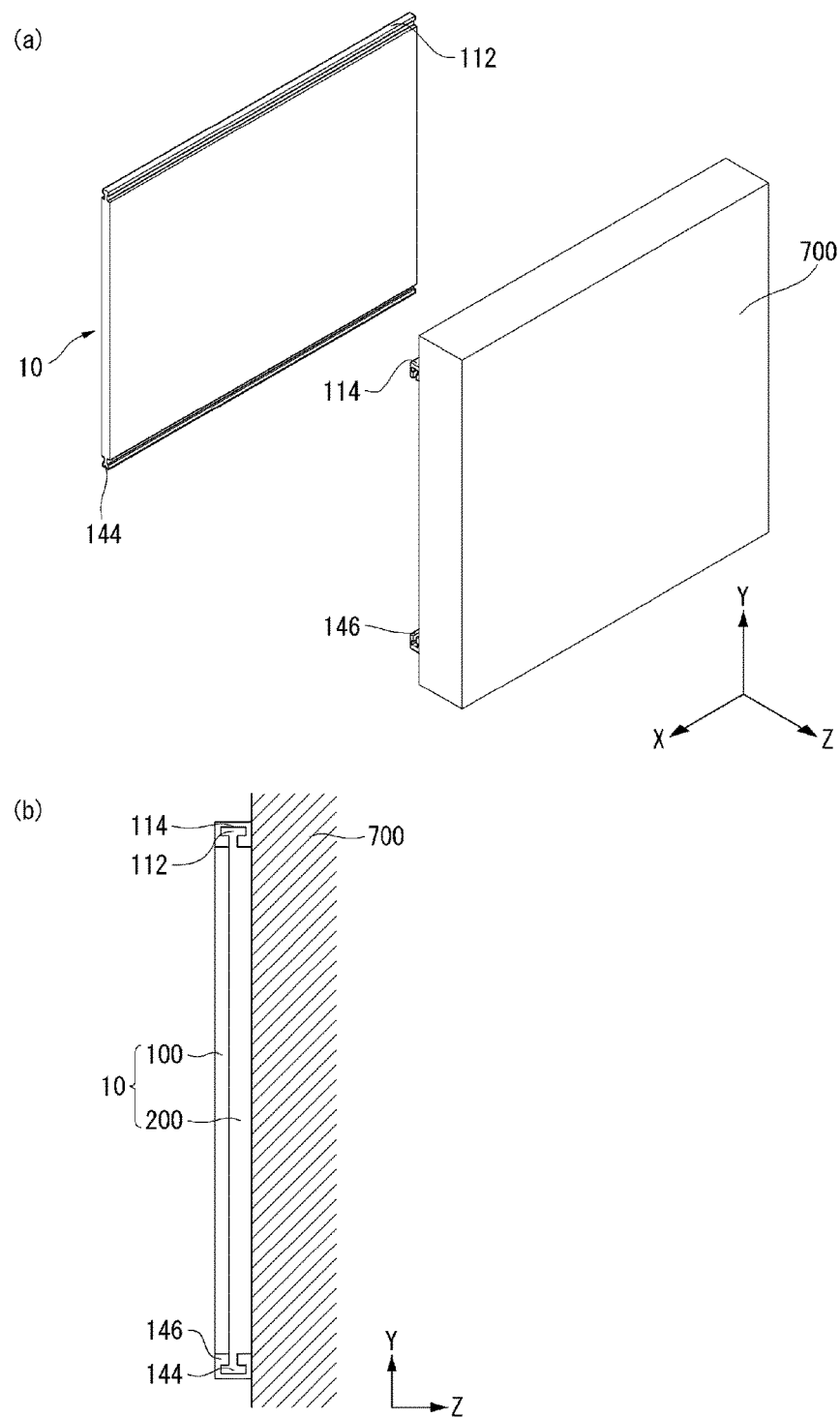

Referring to FIG. 33, in the display device according to an embodiment of the present disclosure, the first coupling part 112 protrudes upwardly from the body 10 and the third coupling part 144 may protrude downwardly from the body 10. In this case, the second and fourth coupling parts 114 and 146 may protrude forwardly from the target attachment surface 700. Accordingly, a protruding direction of the first and third coupling parts 112 and 144 may be perpendicular to a protruding direction of the second and fourth coupling parts 114 and 146. A protruded portion of the second coupling party 114 may be depressed upwardly so as to be coupled to the first coupling part 112. Also, a protruded portion of the fourth coupling part 146 may be depressed downwardly so as to be coupled to the third coupling part 144. A protruded cross-sectional structure of the first and third coupling parts 112 and 144 and a depressed cross-sectional structure of the second and fourth coupling parts 114 and 146 may be the same.

In the display device according to an embodiment of the present disclosure, when the second and fourth coupling parts 114 and 146 are installed on the target attachment surface 700, the body 10 may be freely separated from or coupled to the target attachment surface 700. Thus, the user may freely tightly attach and couple the body 10 in a required area. Also, in the first state, the second and fourth coupling parts 114 and 146 may be positioned in upper and lower sides of the body 10. Thus, the user may feel that a step of the body 10 and the target attachment surface 700 is smaller.

Figure 34:
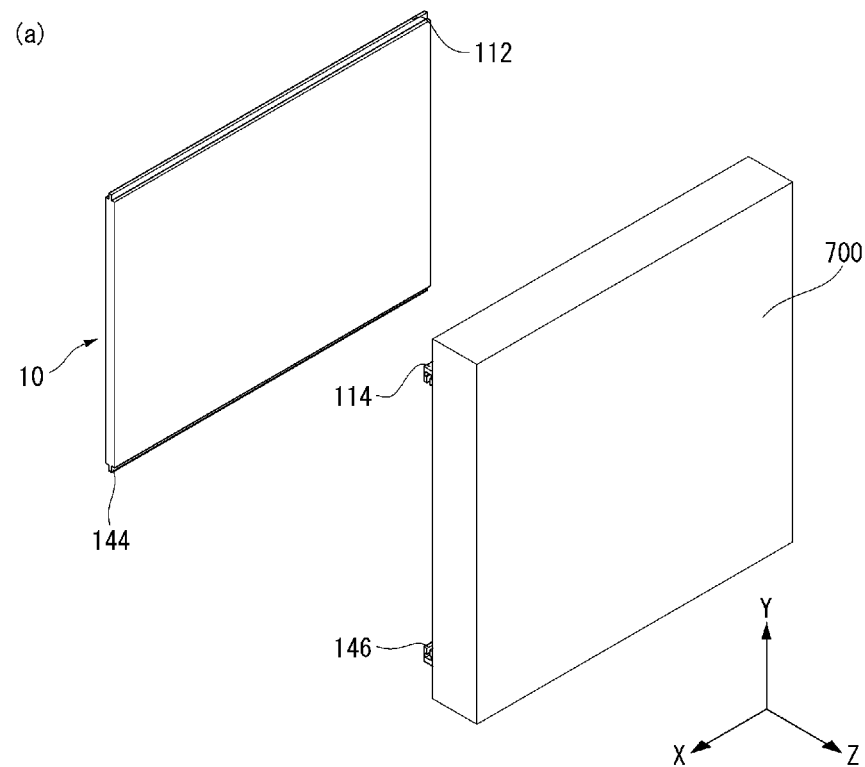
Figure 34:
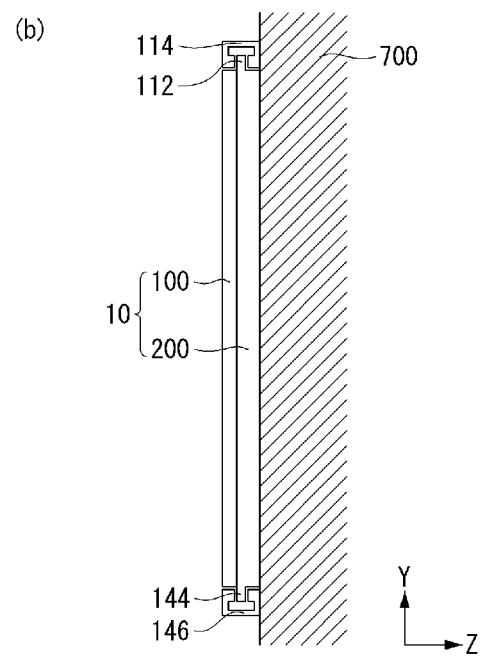
Figure 35:
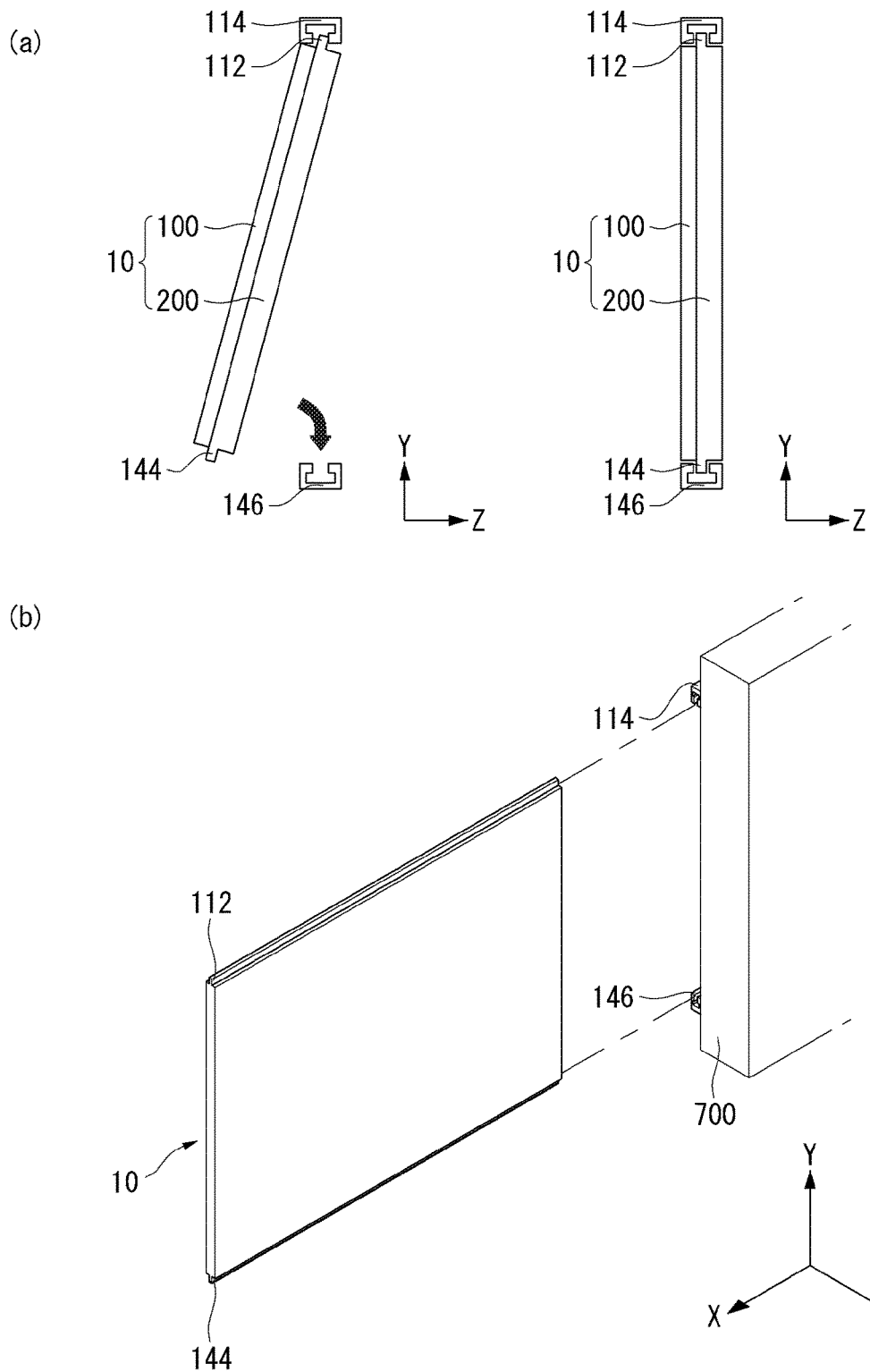

Referring to FIGS. 34 and 35, the first coupling part 112 may protrude upwardly from the body 10, and the third coupling part 144 may protrude downwardly from the body 10. In this case, the second and fourth coupling parts 114 and 146 may protrude forwardly from the target attachment surface 700. A protruded portion of the second coupling part 114 may be depressed upwardly so as to be coupled to the first coupling part 112. Also, a protruded portion of the fourth coupling part 146 may be depressed downwardly so as to be coupled to the third coupling part 144.

A protruded cross-sectional structure of the first and third coupling parts 112 and 144 and a depressed cross-sectional structure of the second and fourth coupling parts 114 and 146 may be different. That is, the first and third coupling parts 112 and 144 may not be engaged with the second and fourth coupling parts 114 and 146 in the first state. Thus, even in the first state, the first and third coupling parts 112 and 144 may allow a space to remain within the second and fourth coupling parts 114 and 146.

As illustrated in (a) of FIG. 35, at least one of the first and third coupling parts 112 and 144 is first inserted and coupled and the other may subsequently be inserted and coupled. Since there is a space in which the first and third coupling parts 112 and 144 move within the second and fourth coupling parts 114 and 146, the first and third coupling parts 112 and 144 may be sequentially coupled to the second and fourth coupling parts 114 and 146. Accordingly, a user may easily couple the body 10 to the target attachment surface 700.

Alternatively, as illustrated in (b) of FIG. 35, the first and third coupling parts 112 and 144 may be slidably coupled to the second and fourth coupling parts 114 and 146. The body 10 may be moved to the side of the target attachment surface 700 and the first and third coupling parts 112 and 144 may be inserted into the second and fourth coupling parts 114 and 146. That is, the body 10 may be slidably coupled to the target attachment surface 700.

In the display device according to an embodiment of the present disclosure, the first and third coupling parts 112 and 144 may be coupled to the second and fourth coupling parts 114 and 146 according to one of a sequential coupling method and a slidable coupling method. Thus, the user may select a desired method and freely separate or couple them.

FIGS. 36 to 46 are views illustrating various examples of a display device according to another embodiment of the present disclosure.

Figure 36:
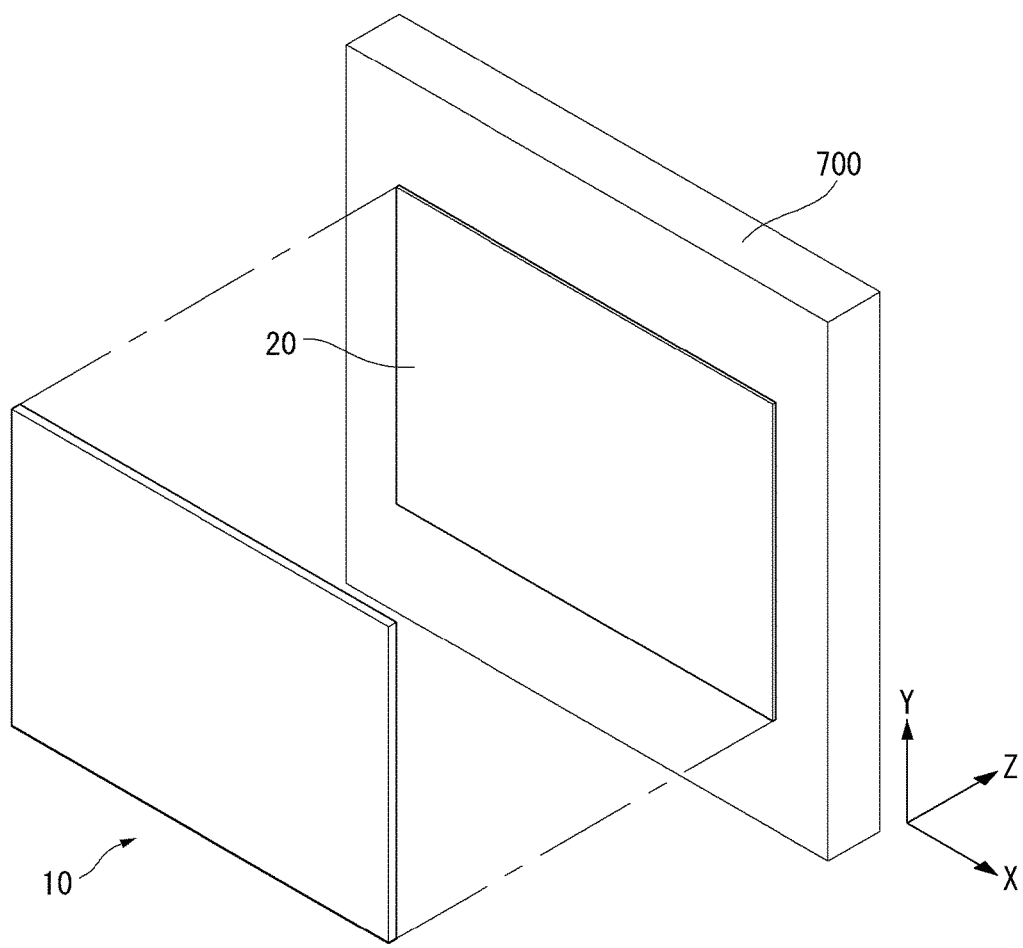
FIGS. 36 to 46 are views illustrating various examples of a display device according to another embodiment of the present disclosure.

Referring to FIG. 36, in the display device according to an embodiment of the present disclosure, the body 10 may be coupled to a bracket 20 of the target attachment surface 700.

The bracket 20 may be positioned on a front surface of the target attachment surface 700, and may be directly coupled to the body 10 in the first state. In detail, the bracket 20 may be in contact with at least a partial region of the module cover in the first state. The bracket 20 may be coupled to the target attachment surface 700 through at least one screw. When the body 10 is coupled through the bracket 20, there is no need to form a depression or install a protrusion on the target attachment surface 700, and thus, the body 10 may be conveniently separated or coupled and cost may be reduced. Also, since the bracket 20 is thin, the user may recognize that the body 10 is tightly coupled to the target attachment surface 700.

Figure 37:
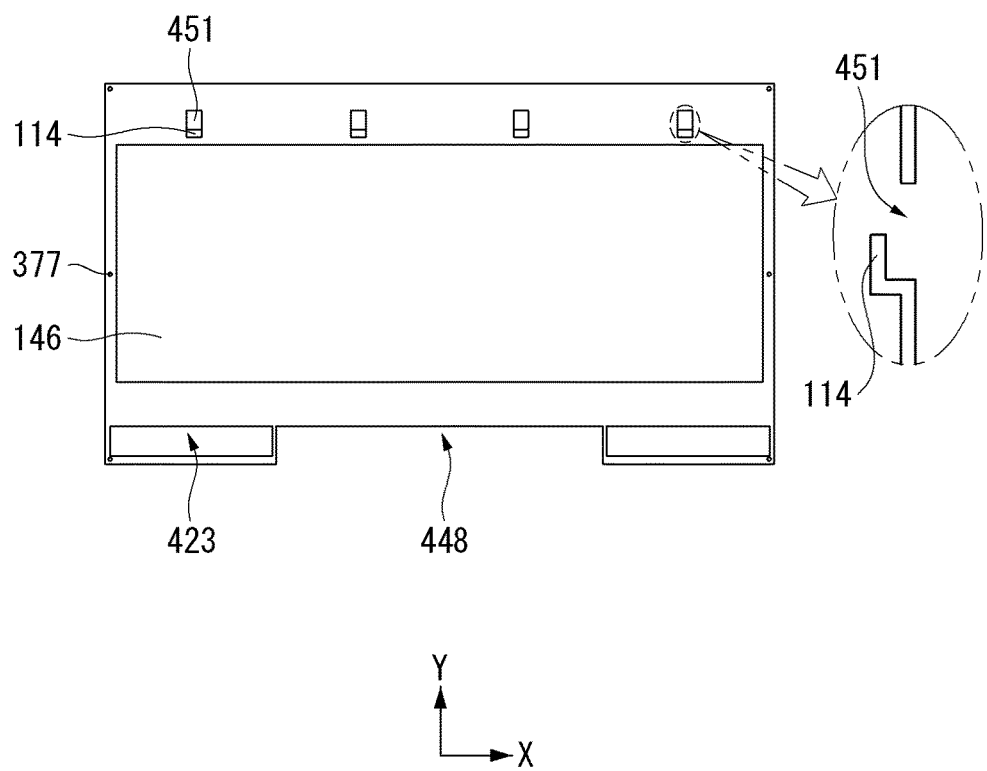

Referring to FIG. 37, in the display device according to an embodiment of the present disclosure, the bracket 20 may include second and fourth coupling parts 114 and 146, a coupling hole 451, a PCB hole 423, a PCB groove 448, and a screw recess 377. The second and fourth coupling parts 114 and 146 may be the same as or similar to the second and fourth coupling parts 114 and 146 of the aforementioned embodiments.

The coupling hole 451 may be positioned in an upper portion of the second coupling part 114. The coupling hole 451 may penetrate through the bracket 20 and a first coupling part may be inserted through the coupling hole 451.

Thus, the coupling hole 451 may be positioned in a region corresponding to the first coupling part in the first state.

The PCB hole 423 may be positioned on both sides of a lower portion of the fourth coupling part 146. The PCB hole 423 may penetrate though the bracket 20 and accommodate a source PCB. Thus, the PCB hole 423 may be positioned in a portion corresponding to the source PCB in the first state. The PCB hole 423 may accommodate the source PCB positioned on both sides of a lower portion of the body. The PCB hole 423 may prevent the source PCB from being in contact with the target attachment surface.

The PCB groove 448 may be positioned in a central portion below the fourth coupling part 146. The PCB groove 448 may have a structure in which a lower portion thereof has a hole, unlike the PCB hole 423. That is, the PCB groove 448 may not be surrounded by the bracket 20. The PCB groove 448 may accommodate the source PCB. Thus, the PCB groove 448 may be positioned in a portion corresponding to the source PCB in the first state. The PCB groove 448 may accommodate the source PCB positioned in a central portion of the lower portion of the body. The PCB groove 448 may prevent the source PCB from being in contact with the target attachment surface.

The screw recess 377 may be positioned in a central portion of both edges and a vertex of the bracket 20. The screw recess 377 may couple the bracket 20 and the target attachment surface 700 through the bracket 20. The bracket 20 may be coupled to the target attachment surface 700 using at least one screw through the screw recess 377. However, the present disclosure is not limited thereto and the bracket 20 may be coupled to the target attachment surface 700 using a double-sided tape. In this case, the screw recess 377 may not be positioned.

Figure 38:
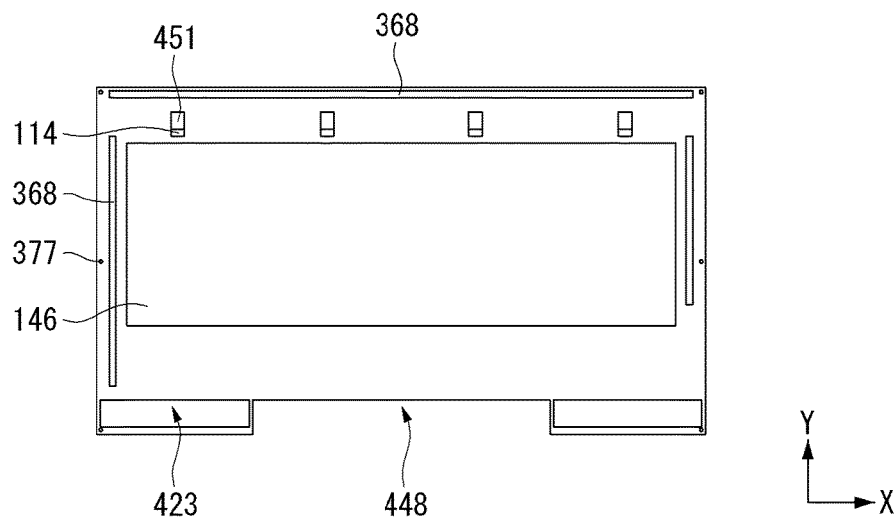
Figure 38:
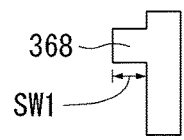
Figure 38:
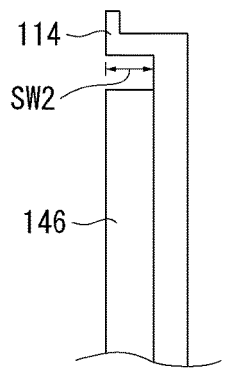

Referring to FIG. 38, a convex portion 368 may be positioned on three edges excluding a lower edge of the bracket 20. The convex portion 368 may protrude toward the body 10 in the first state.

A width SW1 of the convex portion 368 in a direction toward the body may be equal to or smaller than a width SW2 of the second coupling part 114 in a direction toward the body. Thus, when the second coupling part 114 and the first coupling part are coupled, the body may not be in contact with the convex portion 368. If the body is in contact with the convex portion 368, it may be difficult for the first coupling part and the second coupling part 114 to be coupled.

The convex portion 368 may be formed to have a different thickness in the bracket 20 which is thin. Thus, rigidity of the bracket 20 may be enhanced. Also, the convex portion 368 may support a rear surface of the body 10 in the first state. Thus, the convex portion 368 may prevent the body 10 from being easily cracked.

Figure 39:
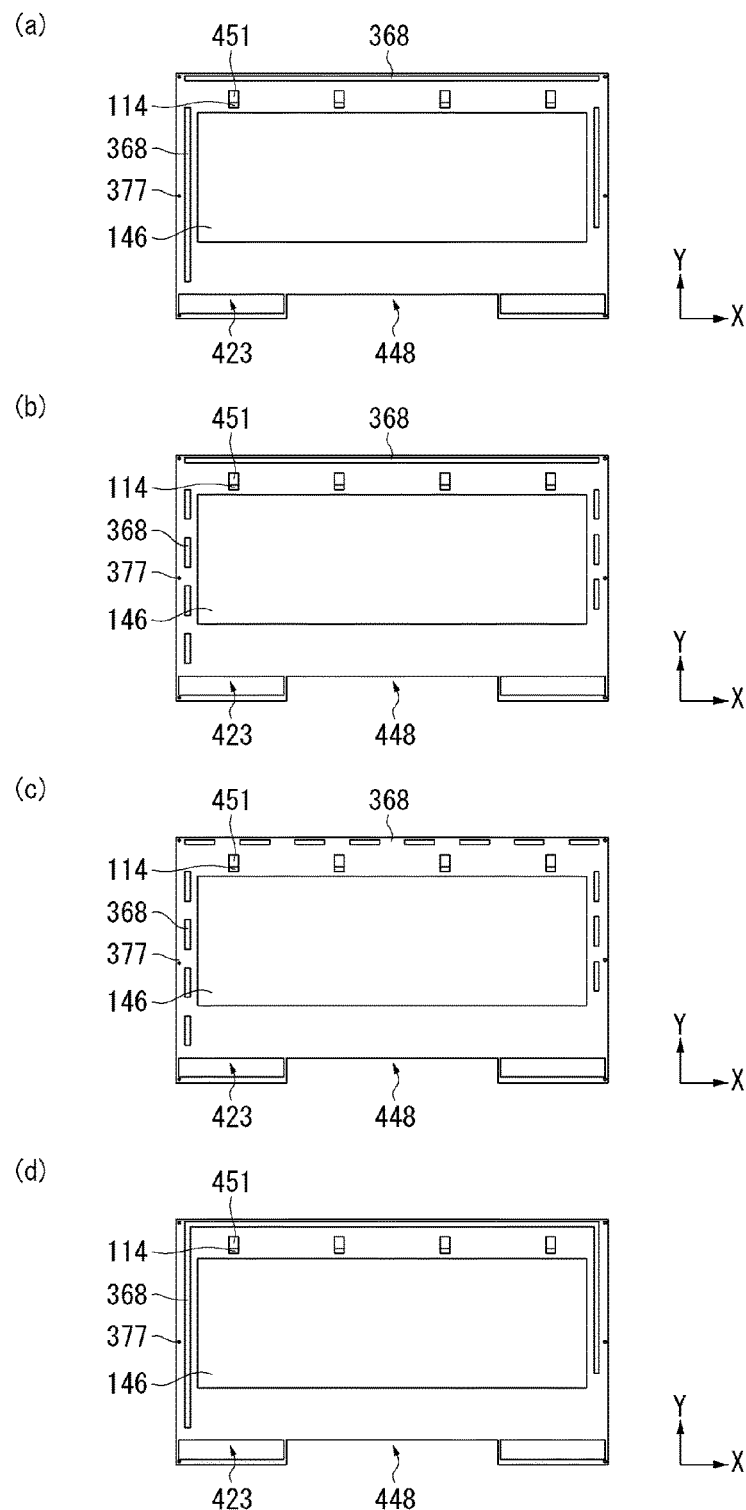

Referring to FIG. 39, in the display device according to an embodiment of the present disclosure, the convex portion 368 of the bracket 20 may be positioned on the bracket 20 in various structures.

For example, as illustrated in (a) of FIG. 39, the convex portion 368 positioned above the bracket 20 may be divided into a plurality of portions. In another example, as illustrated in (b) of FIG. 39, the convex portions 368 positioned on both sides of the bracket 20 may be divided into a plurality of portions. In another example, as illustrated in (c) of FIG. 39, the convex portions 368 positioned above and both sides of the bracket 20 may be divided into a plurality of portions. In this case, the bracket 20 may be further bent, compared with a case in which the convex portions 368 are integrally connected. Thus, rigidity of the bracket 20 may be further enhanced. The convex portions 368 in a portion of the bracket 20 where high rigidity is required may be divided into a plurality of portions to enhance rigidity of the desired portion.

In another example, as illustrated in (d) of FIG. 39, the convex portions 368 positioned on all the sides may be connected to each other. Thus, a manufacturing process of the bracket 20 may be simplified and cost may be saved.

Figure 40:
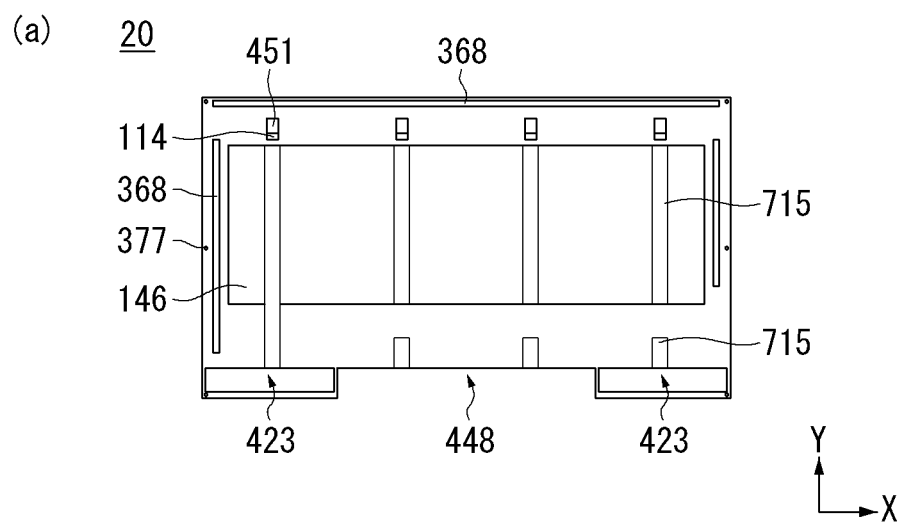
Figure 40:
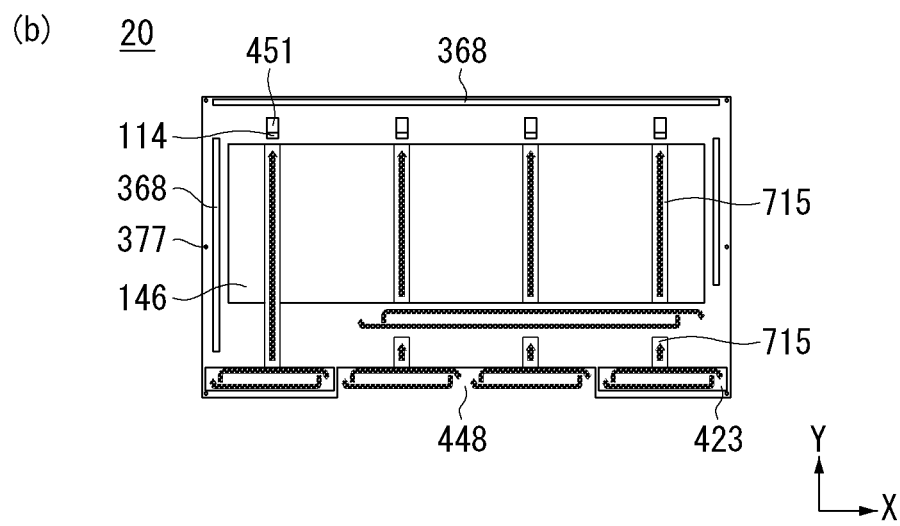

Referring to FIG. 40, in the display device according to an embodiment of the present disclosure, the bracket 20 may further include a heat sheet 715. The heat sheet 715 may extend in a shorter axis direction of the bracket 20 on the basis of the coupling hole 451 as an axis. At least some of the heat sheets 715 may be positioned on the fourth coupling part 146. One end of the heat sheet 715 may be positioned in an upper portion of the fourth coupling part 146 and the other end thereof may be positioned in an upper portion of the PCB hole 423 or the PCB groove 448.

The heat sheet 715 may include a material having heat conductivity higher than that of the bracket 20. Thus, the heat sheet 715 may be a path in which heat from the source PCB emitted from the PCB hole 423 or the PCB groove 448 is transmitted. As illustrated in (b) of FIG. 40, heat from the source PCB emitted from the PCB hole 423 or the PCB groove 448 may be released to the coupling hole 451 through the heat sheet 715.

The heat sheet 715 may not be positioned in a portion where an electric line (to be described hereinafter) is to be positioned between an upper portion of the PCB hole 423 or the PCB groove 448 and the fourth coupling part 146. In this case, heat from the source PCB or the electric line may be released to the coupling hole 451 through the heat sheet 715.

In the display device according to an embodiment of the present disclosure, the heat sheet 715 may be positioned in at least a portion of the bracket 20. Thus, heat introduced to an interior of the bracket 20 may be controlled to be released to the coupling hole 451 through the heat sheet 715.

Figure 41:
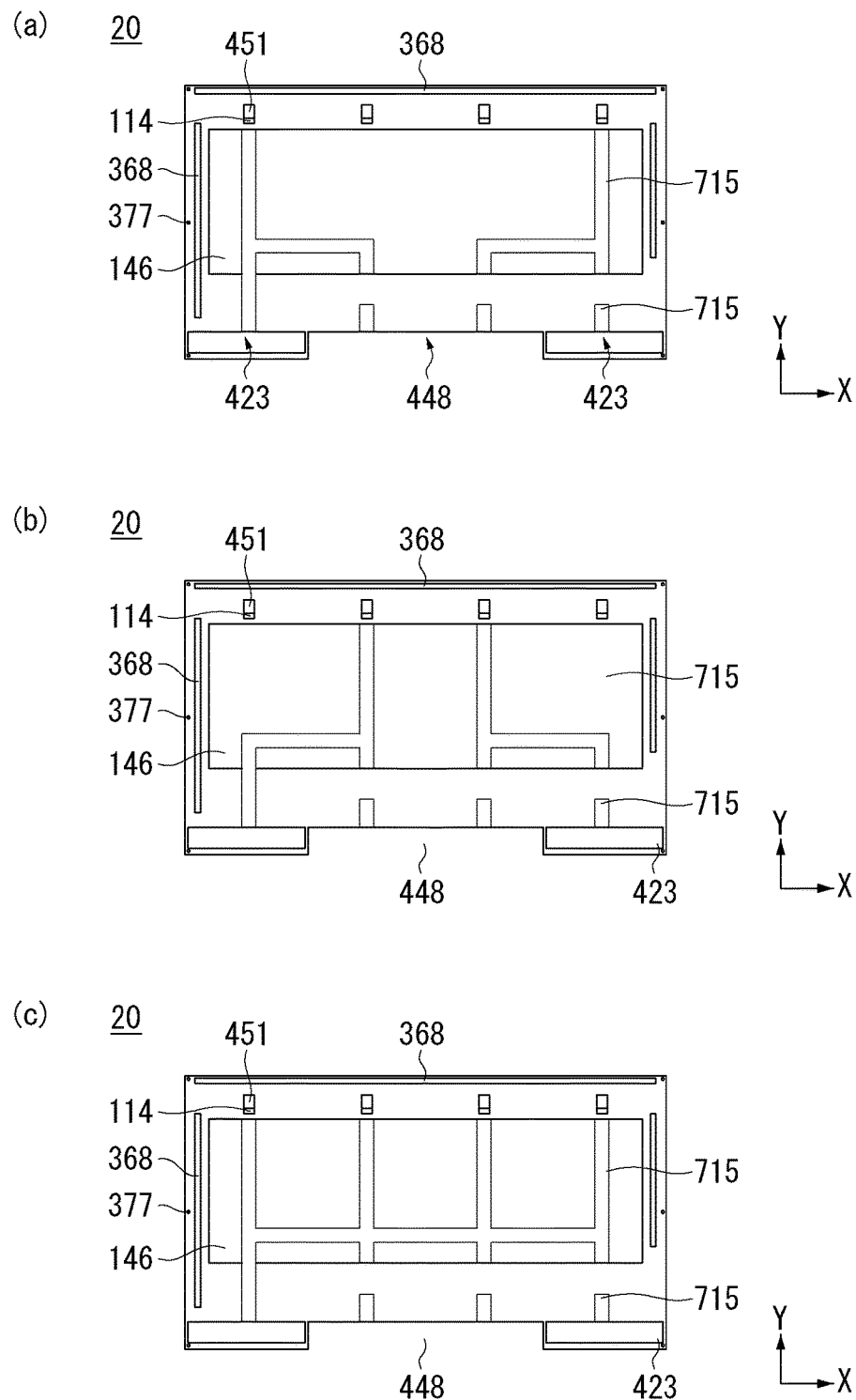

Referring to FIG. 41, in the display device according to an embodiment of the present disclosure, the heat sheet 715 of the bracket 20 may be positioned in various manners.

For example, as illustrated in (a) of FIG. 41, a heat sheet 715 positioned in a central portion of the bracket 20, among a plurality of heat sheets 715, may be connected to a heat sheet 715 positioned in the edge of the bracket 20. That is, the heat sheet 715 extending to an upper side of the PCB groove 448 may be connected to the heat sheet 715 extending to an upper side of the PCB hole 423. In another example, as illustrated in (b) of FIG. 41, a heat sheet 715 positioned on the edge of the bracket 20, among the plurality of heat sheets 715, may be connected to a heat sheet 715 positioned in a central portion of the bracket 20. That is, the heat sheet 715 extending to an upper side of the PCB hole 423 may be connected to the heat sheet 715 extending to an upper side of the PCB groove 448.

In the aforementioned embodiment, since the heat sheets 715 of every portion do not extend upwardly and are connected to other portions, the fourth coupling part 146 may be coupled to the body by magnetism without being interfered. For example, in an embodiment illustrated in (a) of FIG. 41, the central portion of the fourth coupling part 146 may be more strongly coupled to the body, and in an embodiment illustrated in (b) of FIG. 41, both sides of the fourth coupling part 146 may be more strongly coupled to the body.

In another example, as illustrated in (c) of FIG. 41, the heat sheets 715 may be connected to each other. In detail, the heat sheet 715 may be connected to other heat sheets 715 positioned on both sides thereof. In this case, an area of the heat sheets 715 for transmitting heat may be increased. Also, in a case in which heat is concentrated on a heat sheet 715, heat may be transmitted to a heat sheet 715 of another portion. Thus, heat introduced to the interior of the bracket 20 may be easily dissipated through the coupling hole 451.

In the display device according to an embodiment of the present disclosure, disposition of the heat sheets 715 may be freely adjusted. Thus, the heat sheets 715 may be disposed in appropriate positions by measuring a distribution of heat introduced to the interior of the bracket 20.

Figure 42:
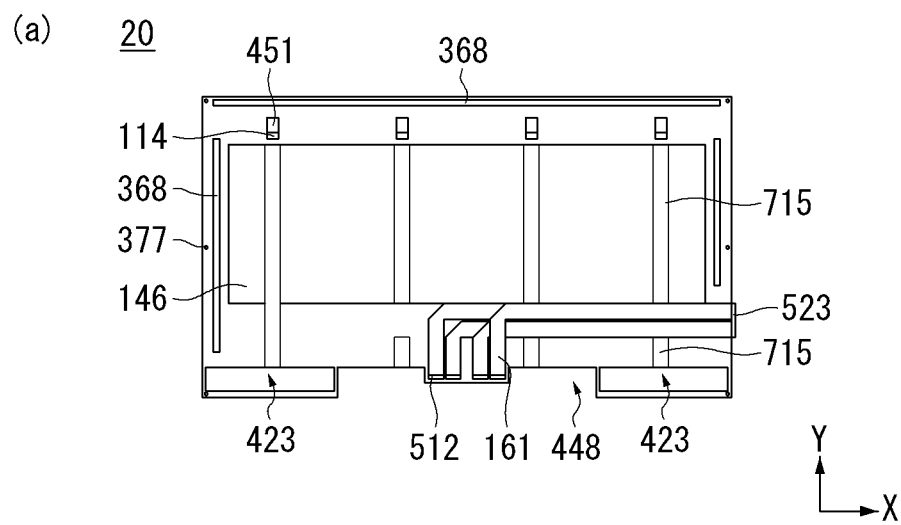
Figure 42:
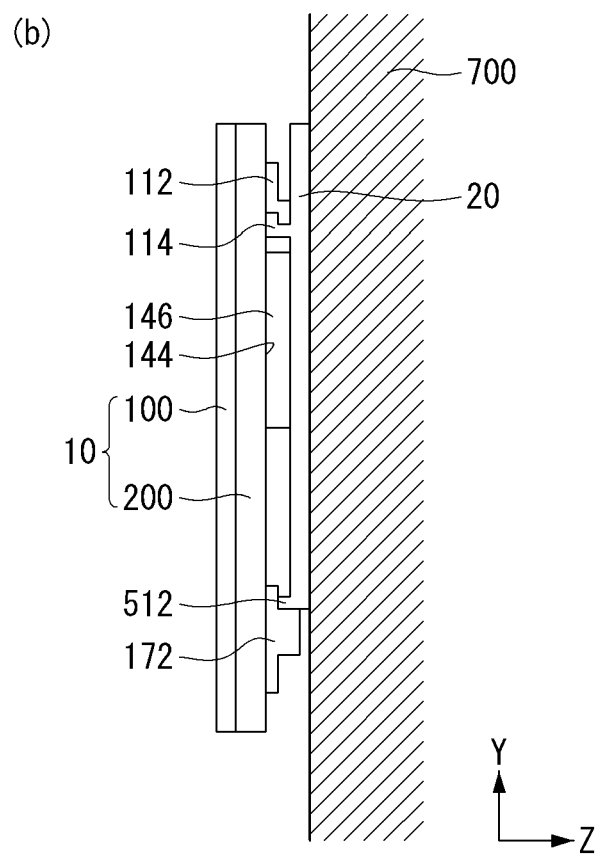
Figure 43:
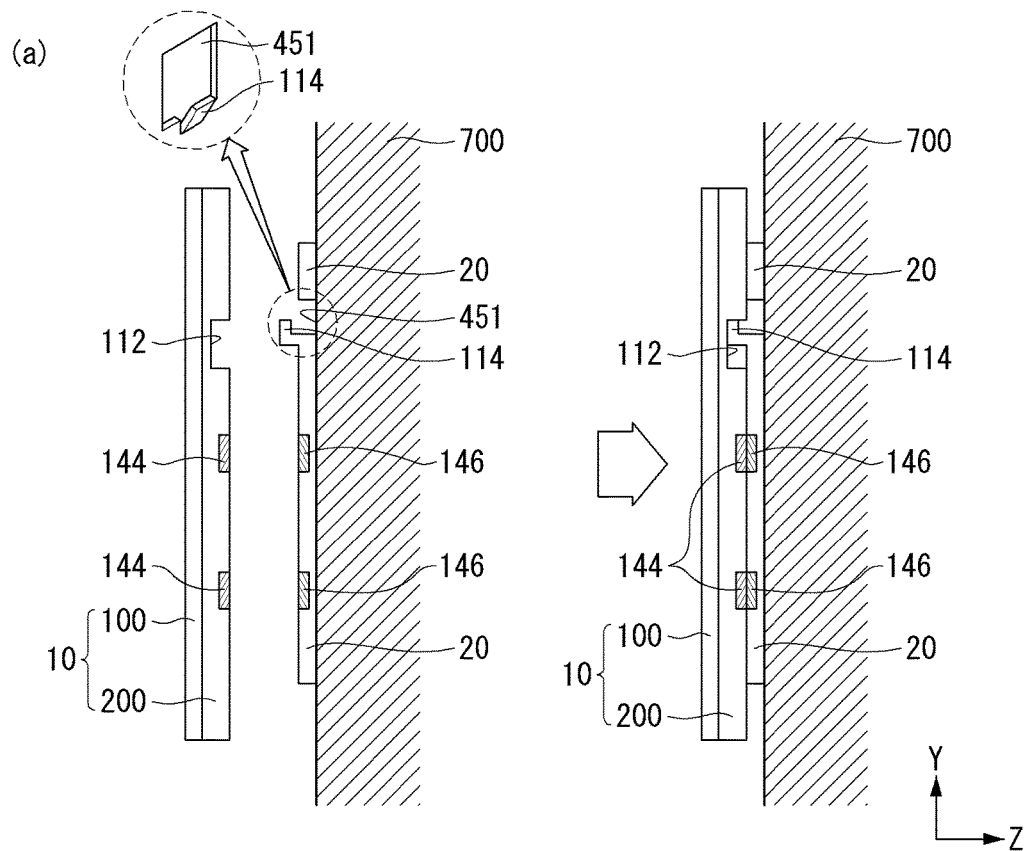
Figure 43:
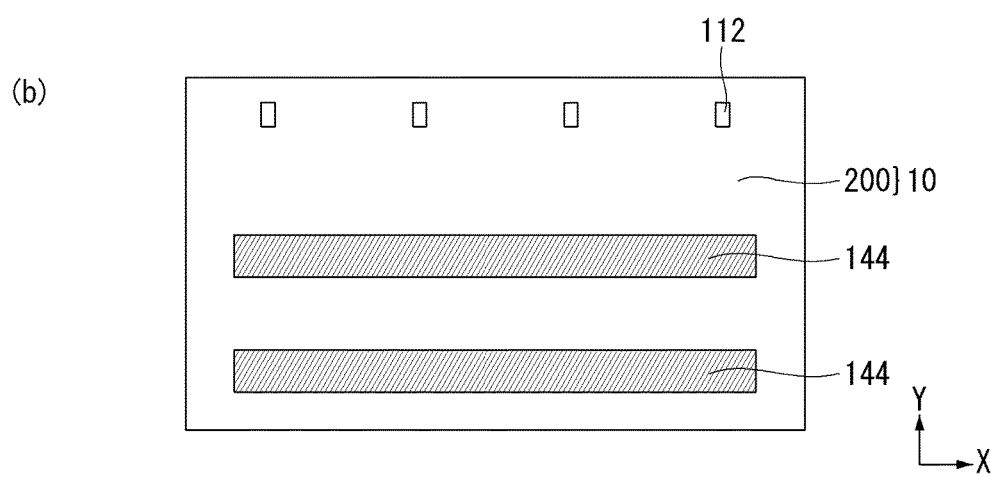

Referring to FIG. 42, in the display device according to an embodiment of the present disclosure, the bracket 20 may further include an FFC 161. The FFC 161 may be positioned between the fourth coupling part 146 and the PCB groove 448 or the PCB hole 423. A PCB connector 512 may be positioned at one end of the FFC 161, and a housing connector 523 may be positioned at the other end of the FFC 161. The FFC 161 may transfer an electrical signal transmitted to or received from the source PCB 172.

The PCB connector 512 may be connected to the source PCB 172 positioned in a central portion in the first state. That is, the PCB connector 512 may be positioned on an upper side of a central portion of the PCB groove 448. An electrical line may be attached to the bracket 20 by a double-sided tape so as to be connected to a side edge.

The housing connector 523 may be positioned on a side edge of the bracket 20. The housing connector 523 may transfer a signal transferred from the source PCB 172 to the outside. The housing connector 523 may connect a plurality of FFCs 161.

In the display device according to an embodiment of the present disclosure, the FFC 161 may be attached to the bracket 20 and connected to the side edge. Thus, the FFC 161 may not be easily noticed, and thus, the user may be more focused on a display screen. Also, since the housing connector 523 connects the FFCs 161, when it is connected to a housing, an appearance may become neater.

Referring to FIG. 4 3, in order to be coupled to the second coupling part 114 above the bracket 20, the first coupling part 112 may include a hole depressed to an inner side of the body 10. The first coupling part 112 may penetrate through the module cover 200 in a region corresponding to the second coupling part 114 in the first state.

The third coupling part 144 and the fourth coupling part 146 may be in a form in which a magnetic material is inserted into depressions within the body 10 and the bracket 20. Thus, the third and fourth coupling parts 144 and 146 may be flat, without protruding from the body 10 and the bracket 20. Also, the third and fourth coupling parts 144 and 146 may be divided into a plurality of parts in a shorter axis direction of the body 10. In detail, one of the third and fourth coupling parts 144 and 146 may be positioned in a lower portion of a rear surface of the body 10 and the bracket 20 and the other may be positioned in a central portion of the rear surface of the body 10 and the bracket 20. Thus, the body 10 and the bracket 20 may not be easily separated, compared with a case in which the body 10 and the bracket 20 are coupled by single third and fourth coupling parts 144 and 146.

A hole of the first coupling part 112 may be caught by a hook of the second coupling part 114. That is, as illustrated in (a) of FIG. 42, an upper surface of a recess of the first coupling part 112 may be caught by the hook of the second coupling part in the first state. Since the first coupling part 112 should be positioned in a portion corresponding to the second coupling part 114, the first coupling part 112 may be divided into a plurality of parts.

Since the second coupling part 144 is inserted into an interior of the first coupling part 112 in the first state, the body 10 may be more tightly attached and coupled to the bracket 20. Also, since the first coupling part 112 is simply placed on the second coupling part 144, the body 10 and the bracket 20 may be more easily separated.

Figure 44:
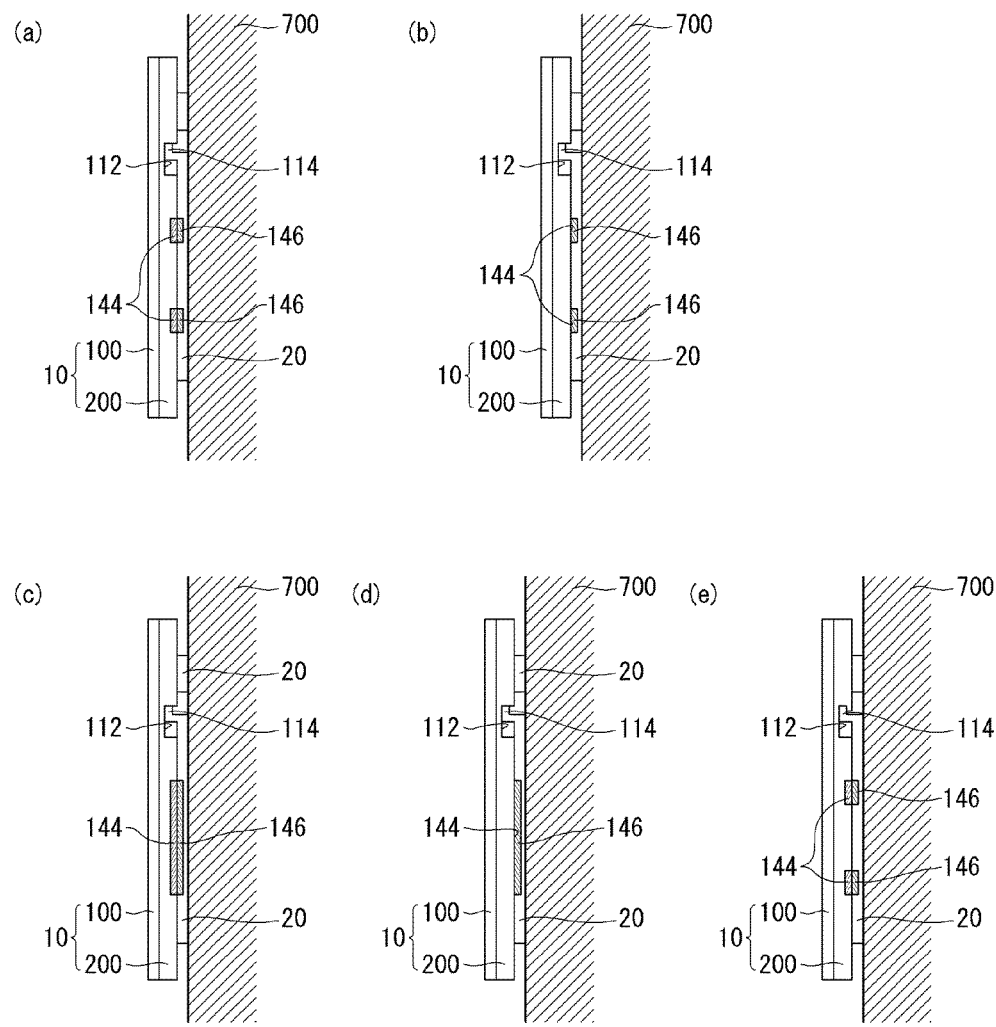

Referring to FIG. 44, as illustrated in (a) of FIG. 44, the first coupling part 112 may be a recess in which a portion of a thickness is depressed inwardly, rather than being a hole penetrating through the module cover 200. Thus, in a portion where the first coupling part 112 is positioned, the display panel 100 may be protected by the module cover 200.

Also, an impact applied to the display panel 100 when the second coupling part 114 is coupled to the first coupling part may also be reduced.

As illustrated in (b) of FIG. 44, the third coupling part 144 of the body 10 does not protrude from the body 10 and may include the same material as that of the module cover 200. Thus, an appearance of a rear surface of the module cover 200 may be neater in the second state.

As illustrated in (c) of FIG. 44, the third and fourth coupling parts 144 and 146 may be positioned in a most region excluding the first and second coupling parts 112 and 114. In detail, the third and fourth coupling parts 144 and 146 may couple the entire body 10 from a portion directly below the region where the first and second coupling parts 112 and 114 are positioned. The third coupling part 144 and the fourth coupling part 146 may include materials having mutually opposite magnetisms. In contrast, in (d) of FIG. 44, the third coupling part 144 may have the same metal as that of the module cover 200. In this case, since a size of the fourth coupling part 146 is large, the third coupling part 144 may be strongly coupled even though it is not a magnetic material.

Referring to (e) of FIG. 44, an inner side and an outer side of a width of a hole of the first coupling part 112 may be different. In detail, a width of the inner side of the first coupling part 112 may be smaller than a width of the outer side of the first coupling part 112. Thus, the second coupling part 114 may be engaged with a portion having a varied width of the first coupling part 112 by a hook.

Thus, the first coupling part 112 and the second coupling part 114 may not be easily separated. Also, since a portion in which the first coupling part 112 and the second coupling part 114 are engaged is present, a coupling position may be more easily guided.

In the display device according to an embodiment of the present disclosure, the first coupling part 112 may be configured as a recess or a hole, rather than a hook. Thus, the body 10 may be more tightly attached and coupled to the bracket 20. Also, since the second coupling part needs only to be inserted into the first coupling part 112, the body 10 and the bracket 20 may be more easily coupled, compared with a case in which the hook is configured.

Figure 45:
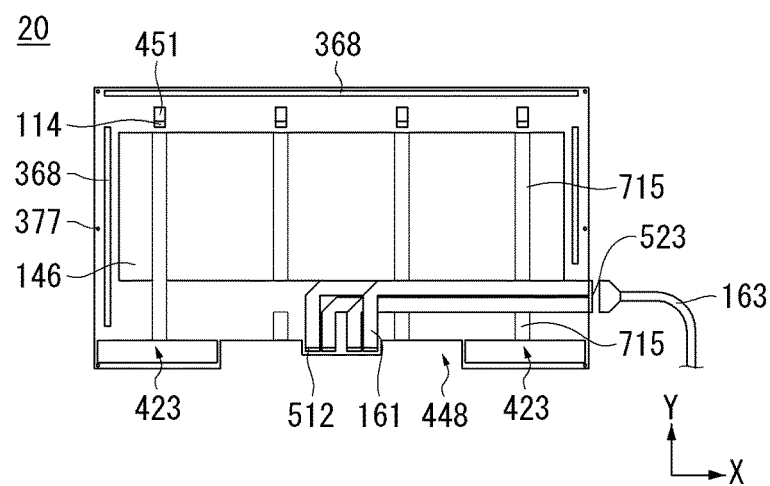
Figure 45:
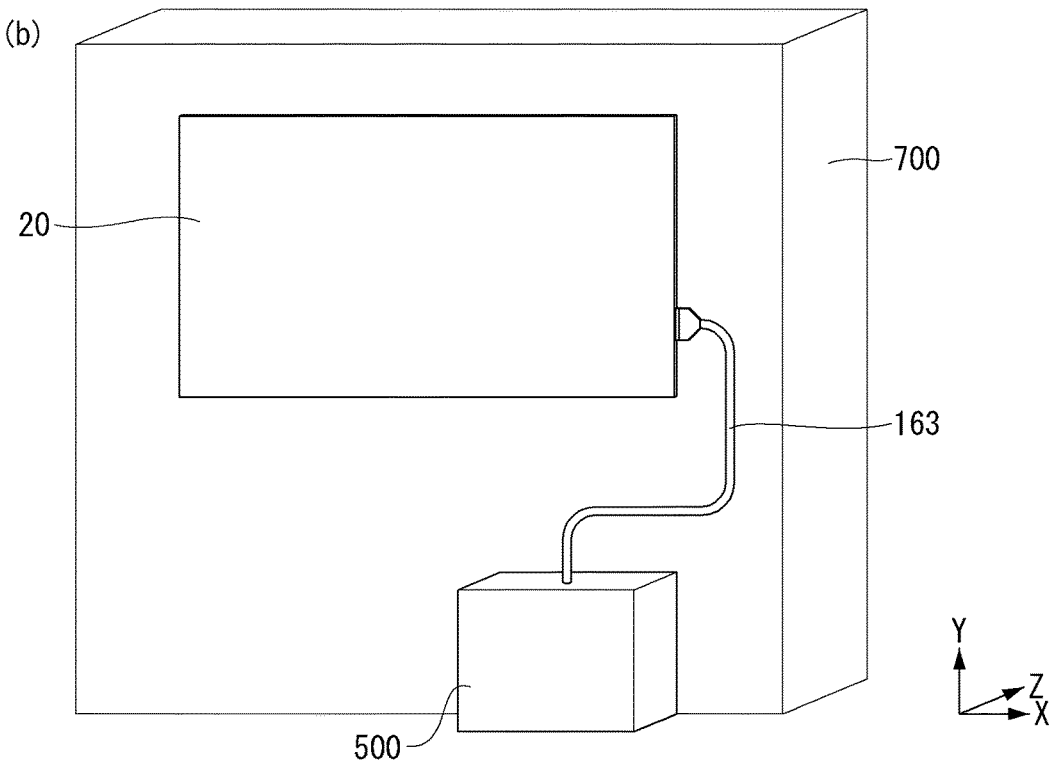

Referring to FIG. 45, in the display device according to an embodiment of the present disclosure, a circular cable 163 may be connected to a side of the housing connector 523. One end of the circular cable 163 may be connected to the housing connector 523 and the other end thereof may be connected to the housing 500. Thus, the circular cable 163 may allow an electrical signal to be exchanged between the source PCB and a timing controller within the housing 500.

In the display device according to an embodiment of the present disclosure, since the circular cable 163 is connected to the side of the bracket 20, it may not be easily noticed.

Also, since the circular cable 163 is connected to the housing 500 and the bracket 20, as a single cable, an appearance may be neater.

Figure 46:
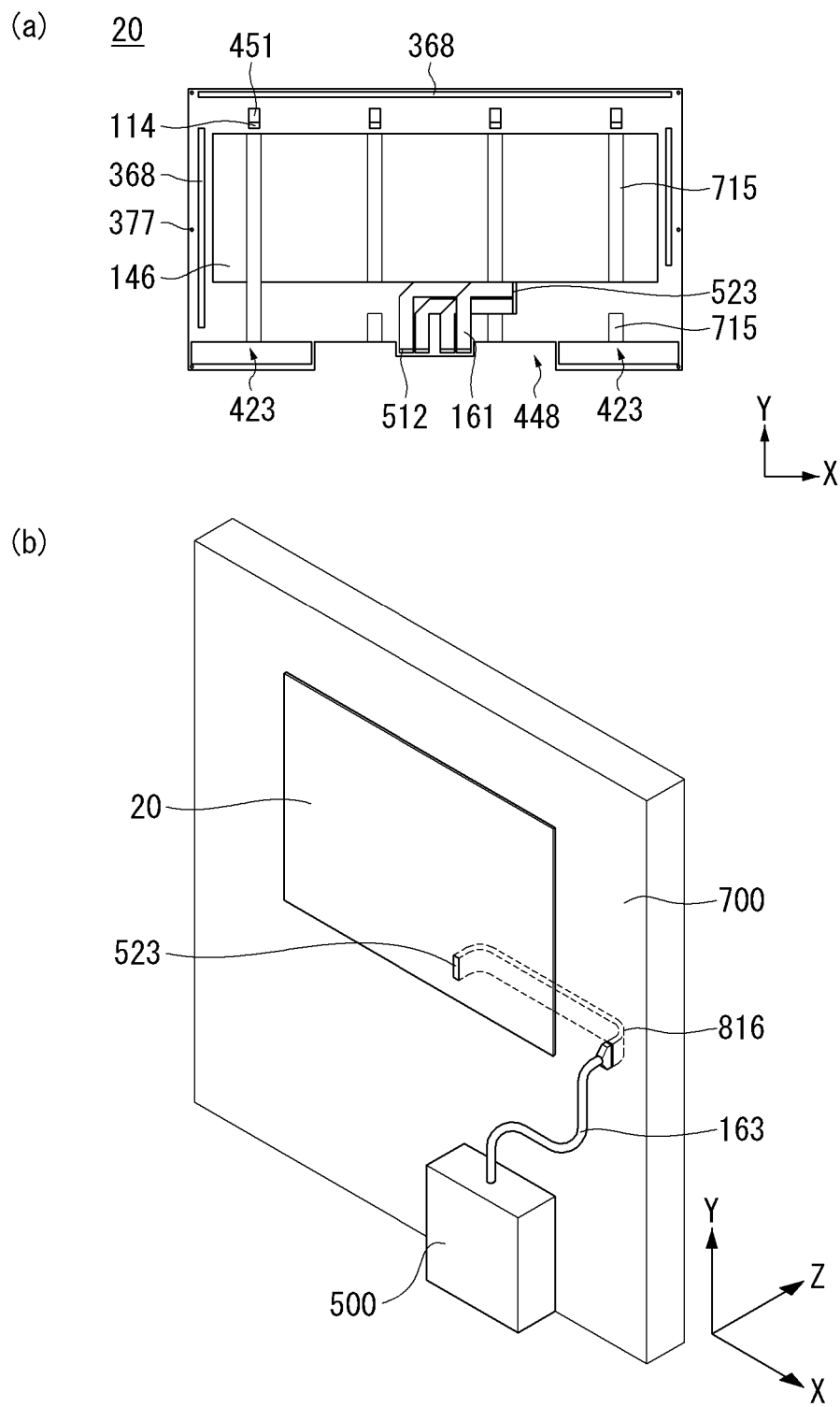

Referring to FIG. 46, the display device according to an embodiment of the present disclosure may further include an electric line 816 penetrating through an interior of the target attachment surface 700. In this case, the FFC 161 may be connected to a portion coupled to the electric line 816, rather than being connected to an edge of the bracket 20. A portion where the housing connector 523 is positioned may penetrate through the bracket 20 so as to be connected to the electric line 816.

The electric line 816 may be inserted into the penetrated portion of the target attachment surface 700. One side of the electric line 816 may be connected to the housing connector 523 and the other side thereof may be connected to the circular cable 163. Since the electric line 816 is positioned within the target attachment surface 700, it may not be noticed by the user.

In the display device according to an embodiment of the present disclosure, it may be seen as if the housing 500 and the bracket 20 are not directly connected using the electric line 816 inserted within the target attachment surface 700. Thus, the user may feel that an appearance is neater and may be more focused on a display screen.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
    a body including a display panel, a module cover positioned on a rear side of the display panel, and first and second coupling parts formed in a first position of the module cover and a second position spaced apart from the first position; and
    a target attachment surface placed in a first state in which the target attachment surface is coupled to the body and a second state in which the target attachment surface is separated from the body, and including third and fourth coupling parts positioned to face the first and second coupling parts in the first state,
    wherein the first coupling part and the third coupling part are coupled and the second coupling part and the fourth coupling part are coupled in the first state, and the body and the target attachment surface are parallel to each other.

2. The display device of claim 1, wherein,
    in the first state, a width in which the first and third coupling parts are coupled is equal to a width in which the second and fourth coupling parts are coupled.

3. The display device of claim 1, wherein at least one of the first to fourth coupling parts is divided into a plurality of parts in a longer axis direction.

4. The display device of claim 1, wherein
    the first coupling part includes a first hook protruding backwardly from the body,
    the third coupling part protrudes forwardly from the target attachment surface and includes a second hook engaged with the first hook in the first state, and
    the fourth coupling part protrudes forwardly from the target attachment surface and include a magnetic material.

5. The display device of claim 4, wherein the first hook is integrally formed with the module cover.

6. The display device of claim 4, wherein the first and second hooks include a magnetic material.

7. The display device of claim 4, wherein
    the first hook includes a first protrusion protruding backwardly from the body and a second protrusion connected to the first protrusion and protruding in a direction perpendicular to the first protrusion,
    the second hook includes a third protrusion protruding forwardly from the target attachment surface and a fourth protrusion connected to the third protrusion and protruding in a direction perpendicular to the third protrusion, and
    protruding directions of the second protrusion and the fourth protrusion are the opposite directions.

8. The display device of claim 1, wherein
    the first and second coupling parts include a first hook protruding backwardly from the body, and
    the third and fourth coupling parts include a second hook protruding forwardly from the target attachment surface and engaged with the first hook in the first state.

9. The display device of claim 1, wherein
    the first and second coupling parts include a first depression depressed to an inner side of the module cover,
    the third and fourth coupling parts protrude backwardly from the target attachment surface and include a magnetic material, and
    the third and fourth coupling parts are inserted into the first depression in the first state.

10. The display device of claim 1, wherein
    in the first and second coupling parts, a magnetic material is inserted into the first depression depressed to the inner side of the module cover, and
    in the third and fourth coupling parts, a magnetic material is inserted into a second depression depressed to an inner side of the target attachment surface.

11. The display device of claim 1, wherein
    in the first and second coupling parts, a magnetic material is inserted into the first depression depressed to the inner side of the module cover, and
    the third and fourth coupling parts protrude backwardly from the target attachment surface and include a magnetic material.

12. The display device of claim 1, wherein
    the first and second coupling parts include a first hook protruding from the body toward the target attachment surface,
    the third and fourth coupling parts include a second depression depressed to an interior of the target attachment surface, and
    the first hook is inserted into the second depression in the first state.

13. The display device of claim 12, wherein
    the first hook includes a first protrusion protruding backwardly from the body and a second protrusion connected to the first protrusion and protruding in a direction perpendicular to the first protrusion, and
    a height of an entrance of the second depression is greater than a height of the second protrusion.

14. The display device of claim 1, wherein the display head part includes a button on one side thereof, and when a first operation is applied to the button, the first state is switched to the second state.

15. The display device of claim 14, wherein at least one of the first and second coupling parts includes an electromagnet, and when the first operation is applied to the button, a current flowing to at least one of the first and second coupling parts is cut off.

16. A display device comprising:

a body including a display panel, a module cover positioned on a rear side of the display panel, and a front coupling part formed on a rear side of the module cover; and a target attachment surface placed in any one of a first state in which the target attachment surface is coupled to the body and a second state in which the target attachment surface is separated from the body, and including a rear coupling part being in contact with the rear side of the module cover in at least a portion thereof and positioned to face the front coupling part, wherein the body and the target attachment surface are parallel to each other in the first state.

17. The display device of claim 16, wherein the front coupling part includes first and second coupling parts formed in a first position of the module cover and a second position spaced apart from the first position, and the rear coupling part includes third and fourth coupling parts positioned to face the first and second coupling parts in the first state.

18. The display device of claim 16, wherein, in the first state, a width in which the first and third coupling parts are coupled is equal to a width in which the second and fourth coupling parts are coupled.

19. The display device of claim 16, wherein the first coupling part includes a first hook protruding backwardly from the body, the third coupling part protrudes forwardly from the target attachment surface and includes a second hook engaged with the first hook in the first state, and the fourth coupling part protrudes forwardly from the target attachment surface and includes a magnetic material.

20. The display device of claim 16, wherein at least one of the front coupling part and the rear coupling part is divided into a plurality of parts in a longer axis direction.

* * * * *